United States Patent [19]

Homma et al.

[11] Patent Number: 5,163,022

[45] Date of Patent: Nov. 10, 1992

[54] SEMICONDUCTOR CELL MEMORY WITH CURRENT SENSING

[75] Inventors: Noriyuki Homma, Kodaira; Hiroaki Nambu, Hachioji; Kunihiko Yamaguchi, Sayama; Tohru Nakamura, Tanashi; Youji Idei, Asaka; Kazuo Kanetani, Kokubunji; Kenichi Ohhata, Kokubunji; Yoshiaki Sakurai, Kokubunji; Hisayuki Higuchi, Kokubunji, all of Japan

[73] Assignees: Hitachi, Ltd., Tokyo; Hitachi Device Engineering Co., Ltd., Mobara, both of Japan

[21] Appl. No.: 827,873

[22] Filed: Jan. 30, 1992

Related U.S. Application Data

[63] Continuation of Ser. No. 468,290, Jan. 22, 1990, abandoned.

[30] Foreign Application Priority Data

| Jan. 23, 1989 | [JP] | Japan | 1-11994 |
| Apr. 5, 1989 | [JP] | Japan | 1-84864 |
| Apr. 7, 1989 | [JP] | Japan | 1-86840 |
| Jul. 12, 1989 | [JP] | Japan | 1-178152 |

[51] Int. Cl.⁵ ............... G11C 7/00; G11C 11/416

[52] U.S. Cl. ................. 365/190; 365/225.6; 365/206; 365/242

[58] Field of Search ........... 365/190, 174, 177, 242, 365/205, 206, 207, 154, 155, 156, 225.6, 208

[56] References Cited

U.S. PATENT DOCUMENTS

| 4,570,238 | 2/1986 | Birrittella | 365/225.6 |
| 4,825,413 | 4/1989 | Tran | 365/177 |
| 4,858,183 | 8/1989 | Scharrer | 365/177 X |
| 4,864,540 | 9/1989 | Hashemi et al. | 365/225.6 |
| 4,933,899 | 6/1990 | Gibbs | 365/177 |
| 4,961,168 | 10/1990 | Tran | 365/177 X |

*Primary Examiner*—Alyssa H. Bowler
*Attorney, Agent, or Firm*—Fay, Sharpe, Beall, Fagan, Minnich & McKee

[57] ABSTRACT

The disclosure includes feeding a current $I_R$ to only BIT lines selected, or feeding current $I_R$ transiently to only the BIT lines switched from unselected to selected states; and a sense amplifier for detecting the difference between the currents flowing in selected BIT lines to read out stored information, wherein current $I_R$ and cell current $I_{cell}$ have a relation of $I_R > I_{cell}$. The BiC MOS memory has high speed, low power and high integration density. Diodes are provided between the memory cell and the BIT lines.

45 Claims, 56 Drawing Sheets

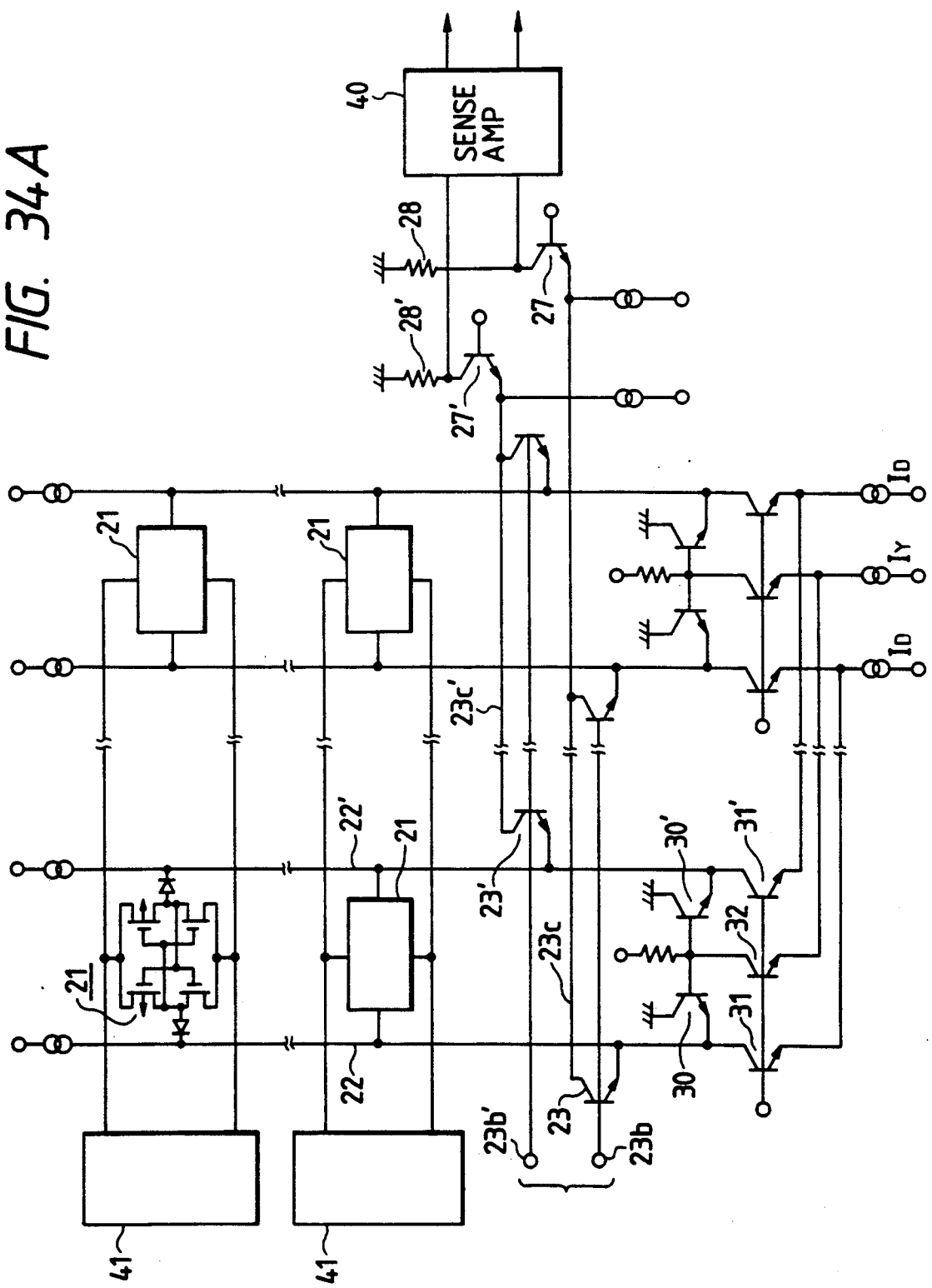

DIGIT LINE CURRENT $I_D$/CELL CURRENT $I_{CELL}$

SEMICONDUCTOR CELL MEMORY WITH CURRENT SENSING

This application is a continuation of application Ser. No. 07/468,290 filed Jan. 22, 1990 now abandoned.

BACKGROUND OF THE INVENTION

The present invention relates to a semiconductor memory and, more particularly, to a circuit technology suited for driving the BIT lines of the memory at a high speed and reducing the power consumption of the memory, particularly with high integration.

It is essential in order to achieve a high-speed operation of a bipolar memory to discharge at high speed. BIT lines having heavy load. The prior art has coped with this by increasing the readout current that functions as the BIT line discharge current. One example of the prior art is shown in FIG. 2. In the figure, the reference symbol C denotes a memory cell, W, LW word lines, B0, B1 BIT lines, Q0, Q1 reference transistors, BS a BIT line select signal, BD a BIT line drive circuit having npn transistors Q2–Q6 and resistor R3, IB0, IB1 BIT line discharge current sources, I y BIT line drive circuit current source, OB an output buffer, and D0 a data output signal. In the memory cell C, a readout current of several mA is allowed to flow by connecting a resistor R to cross coupled transistors Q0 and Q1 in series to a Schottky barrier diode SBD, as described in Japanese Patent Publication No. 62-7639. Thus, the load capacitance of the BIT lines can be discharged at high speed.

In recent years, a number of circuits using both insulated gate type transistors and bipolar transistors have been proposed for making the high integration and speed of the memory compatible. In the circuit disclosed in Japanese Patent Publication No. 63-31879, published May 21, 1981 as Laid·Open Patent No. 56-58193 the memory cell is composed of the insulated gate type transistors suitable for the high integration, and the selection circuit, the read/write control circuit, the sense amplifier and so on are composed of the bipolar transistors suitable for the high speed. Thus, the disclosed circuit can realize both the high integration and speed remarkably efficiently. In this example, moreover, the voltage amplitude of the BIT lines for reading out the information by switching the word lines is reduced to a remarkably small value (e.g., about 70 mV) so that a high-speed reading can be achieved. With the remaining large values in the BIT line amplitude (e.g., about 0.2 V) when the information is to be read out by switching the BIT lines and in the BIT line amplitude (e.g., 3.2 V) when the information is to be written in, however, the speed-up is limited when the information is to be read out or written in by switching the BIT lines. Since, moreover the cell current flows to all the cells connected with the selected word lines, there is also a limit to the reduction in the power consumption.

The aforementioned example of the prior art is shown in FIG. 17, a circuit diagram showing the memory cell and peripheral circuit of a semiconductor memory. In FIG. 17: reference characters MC11 to MC22 designate memory cells; characters W1 and W2 designate word lines; characters BL1, BR1, BL2 and BR2 designate BIT lines; characters VYIN1 and VYIN2 designate BIT line selection signals fed to the BIT line driver BD1; and characters VRL and VRR designate read/write control signals. The parenthesized values indicate one example of the voltage values of the signals, for example the BIT line selection signal VYIN (0 V, 4.2 V) has a selected level of O V and a unselected level of 4.2 V, and the read/write control signals VRL and VRR (4 V, 0 V) have a read level of 4 V and a write level of 0 V.

In FIG. 17, when the memory cell MC11 is selected to read out the information, the word line W1 is driven to a high potential to turn on transistors QTL and QTR. The BIT line selection signal VYIN1 is driven to the selection level of 0 V to turn off transistors QYL and QYR, and the read control signals VRL and VRR are driven to the level of 4 V to turn on transistors QRL and QRR. If a transistor QNL in the cell MC 11 is now ON and QNR OFF, the cell current $I_{cell}$ flows from a sense amplifier SA to VEE through transistors QRL, QTL and QNL. In the unselected BIT line BL2, on the other hand, the BIT line selection signal VYIN2 is at the unselected level of 4.2 V and higher by 0.2 V than VRL and VRR (at 4 V), so that the cell current $I_{cell}$ flowing through the cell MC12 does not flow from the sense amplifier SA to VEE, but through the QYL or QYR in a BIT line driver BD2, through the QTL or QTR, and through QNL or QNR in the cell MC12. As a result, what flows through the sense amplifier SA is the cell current $I_{cell}$ of the cell MC11, which can be detected to read out the information of the cell MC11. It should be noted here that the potential of the selected BIT lines BL1 and BR1 is clamped at about 3.2 ($=4-0.8$) V if the base-emitter voltage of the transistors QRL and QRR is set at 0.8 V. As a result, when the selected word lines are switched to read out the information of the cell MC12, the potentials at the BIT lines BL1 and BR1 are hardly changed. In other words, the time period required for charging and discharging a large parasitic capacity of the BIT lines is reduced substantially to zero so that the reading can be accomplished at a remarkably high speed.

A semiconductor memory is disclosed in ISSCC Digest of Technical Papers, pp. 212,213, Feb. 1986, "A 13ns/500 MW 64 Kb ECL RAM" or Japanese Patent Laid-Open No. 62-58487.

Most of the memory LSIs of the prior art contain address buffers, address decoders, memory cell arrays, sense circuits and output buffers, and they have similar circuit structures. For example, most of BiCMOS static memories have a structure shown in FIG. 36A, and most of the bipolar memories have a structure shown in FIG. 36C.

As shown in FIG. 36A, address signals AX0 and AX1 are fed to an address buffer XB so that $AX_0$ and $AX_0'$ (and $AX_1$, and $AX_1'$) signals are outputted. Incidentally, this example has two inputs, but it is quite natural that the number of inputs is generally far larger. The aforementioned address buffer XB is frequently composed of bipolar transistors as its main components in case the address signals $AX_0$ and $AX_1$ are at the ECL (i.e., Emitter Coupled Logic) Level.

The output of the address buffer XB is decoded by a pre-decoder XD (which is composed of NAND gates, in this case). The output of the pre-decoder XD is fed to a decoder driver XDD so that one of the word lines is selected. In the structure of FIG. 36A, memory cells MC connected with a selected word line WL are all selected.

On the other hand, the selection in the column direction is accomplished by feeding a column selection signal YSS to a column selection circuit YS.

Thus, the information at the memory cell, which is located at the intersection of the selected row (i.e., word line) and the selected column (i.e., BIT line) is read out to the base of the current switch of a sense circuit SENS. This signal is amplified by the sense circuit SENS and fed to an output buffer (although not shown). For the writing operation, a common sense line CSL is set at a high or low level in accordance with the data to be written. After this, the column selection circuit YS is selected, or BIT lines DL and DL' are directly set to the high or low level. Here is omitted the circuit for this operation.

The memory cell MC is constructed of a flip-flop composed of two cross-coupled n-MOS transistors and two load resistors.

SUMMARY

As the integration density increases and the number of cells connected to each BIT line increases, the length of the BIT lines increases, which results in an increase in the wiring resistances RO and R1 of the BIT lines. In consequence, the readout margin of the memory cell decreases due to a voltage drop caused by the wiring resistance of the BIT lines. The voltage drop Vdrop by the wiring resistance of the BIT lines is expressed as follows:

$$Vdrop = RB \times IR$$

where
RB: wiring resistance RO, R1
IR: readout current

Therefore, the readout current IR must be reduced in order to reduce Vdrop. In the prior art, however, (readout current) = (BIT line discharge current) and there is therefore the problem that, if the readout current is reduced, discharging of the BIT lines becomes slow, resulting in an increase in the access time.

It is an object of the present invention to provide a semiconductor memory which is capable of satisfactorily ensuring the readout margin and discharging the BIT lines at high speed even when the integration density is increased. To attain the above-described object, there is provided a semiconductor memory cell including a flip-flop having first and second drive transistors having their respective emitters mutually connected and their collectors and bases cross connected to each other, respectively, and third and fourth load transistors opposite in polarity to the first and second transistors and having their bases and collectors respectively connected to the collectors and bases of the first and second drive transistors, the respective emitters of the third and fourth load transistors being mutually connected, wherein the improvement comprises: first and second diodes having their anodes connected to the collectors of the first and second drive transistors, respectively, and their cathodes connected to respective BIT lines, and a current source connected to the respective emitters of the third and fourth load transistors. By arranging the memory cell as described above, the readout current IR carrying readout information can be set to be smaller than the BIT line discharge current IB. More specifically, in the prior art the relationship between the readout current and the BIT line discharge current is IR=IB, whereas, according to the present invention the relationship of IR equals about 1/0 (IB) or even smaller is obtained. Accordingly, even when the BIT line discharge current employed in the prior art is supplied, the readout current can be as small as about 1/10 or even smaller than that in the prior art and it is therefore possible to reduce the voltage drop caused by the wiring resistance of the BIT lines. Thus, it is possible to provide a semiconductor memory capable of satisfactorily ensuring the readout margin and discharging the BIT lines at high speed even when the integration density is increased.

The circuit of FIG. 17 has at least three problems. A first problem occurs when the selected BIT line is switched to read out the information of the cell MC12. If the base-emitter voltages of the transistors QYL and QYR are set at 0.8 V, the potential of the unselected BIT lines BL2 and BR2 are set at about 3.4 (=4.2−0.8) V. In order to read out the information of the cell MC12, therefore, the potential of the BIT lines BL2 and BR2 have to be discharged so that they may be dropped from 3.4 V to 3.2 V. The currents relating to these discharges are the cell current $I_{cell}$ of the cell MC12 and the IBL and IBR of the current supply connected with the BIT lines. Since these currents flow through the numerous BIT lines (e.g., 128), it is impossible to limit the power consumption and at the same time to increase the currents thereby to shorten the aforementioned discharge time. The second problem occurs in the information writing operation of FIG. 17. When the memory cell MC11 is selected and written with information, the word line W1 is driven to the high potential like the reading operation, and the BIT line selection signal VYIN1 is driven to the selection level 0 V. In accordance with the write information, the read/write control signal VRL or VRR is driven from 4 V to 0 V. If the VRR is driven to 0 V, then the transistor QNL in the memory cell MC11 is ON, the BIT line BR1 is changed from 3.2 V to 0 V so that the transistor QNL has its gate voltage dropped to 0 V and QNL is switched from ON to OFF to invert the cell information. When in the information writing, more specifically, a discharge is required to drop the BIT line BL1 or BR1 from 3.2 V to 0 V. The currents relating to the discharge are 1BL and 1BR of the current supplies connected to the BIT lines. These currents cannot be increased to shorten the discharge time period, as has been described.

In the description thus far made, like the disclosure of Japanese Patent Publication NO. 63-31879, either of the read/write control signal VRL or VRR is driven from 4 V to 0 V in accordance with the write information when the information is to be written. If, however, the base-emitter voltage of the transistors QRL and QRR is set at 0.8 V, the BIT line VL1 or VR1 is at 0 V even if the read/write control signal VRL or VRR is driven from 4 V to 0.8 V, so that the information can be written. At this time, moreover, the BIT line selection signal VYIN1 need not be dropped from 4.2 V to 0 V so as to turn off the transistors QYL and QYR connected with the selected BIT lines. However, it is sufficient like before to drop the BIT line selection signal VYIN1 to 0.6 V which is lower by about 0.2 V than the lower voltage (0.8 V) of the read/write control signal VRL and VRR. Thus, the operations can still be speeded up by reducing the voltage amplitudes of the read/write control signals VRL and VRR from 4 (=4−0) V to 3.2 (=4−0.8) V and the voltage amplitude of the BIT line selection signal VYIN from 4.2 (=4.2−0) V to 3.6 (−4.2−0.6) V. Since, however, the voltage amplitudes of the BIT lines are not reduced, the BIT line discharge time cannot be shortened.

The discharge time problem description has been made with reference to FIG. 17. The charge time of the BIT lines raises another problem in case the voltage relations are wholly inverted by replacing the N-channel insulated gate type transistor (which will be referred to as "NMOS transistors") of FIG. 17 by P-channel insulating gate type transistors (which will be referred to as "PMOS transistors") and by replacing the NPN bipolar transistors (which will be referred to as "NPN transistors") by PNP bipolar transistors (which will be referred to as "PNP transistors").

Finally, the third problem of the FIG. 17 circuit is directed to the power consumption. As has been described, while the memory cell MC11 is being read out, the cell current $I_{cell}$ flows from the sense amplifier SA to the VEE through the transistors QRL, QTL and QNL if the transistor QNL in the memory cell MC11 is ON. On the other hand, the cell current $I_{cell}$ of the unselected memory cell MC12 flows not from the sense amplifier to the VEE but through the transistor QYL or QYR in the BIT line driver BD2 or the transistor QTL or QTR or the transistor QNL or QNR in the memory cell MC12. As a result, only the cell current $I_{cell}$ of the memory cell MC11 flows through the sense amplifier SA so that it can be detected by reading out the information of the memory cell MC11. It is noted here that the cell current $I_{cell}$ also flows though the unselected memory cell MC12 connected with the selected word line and the unselected BIT line. For simplicity of illustration, FIG. 17 shows that only two cells are connected with each word line. Usually, each word line is connected with a number of (e.g., 128) word lines. As a result, the cell current $I_{cell}$ flows from all the numerous cells connected with the selected word line to raise power consumption.

An object of the present invention is to shorten the charge and discharge time periods of the BIT lines when the information is to be read out by switching the BIT lines. Another object of the present invention is to shorten the charge and discharge time periods of the BIT lines when in the information writing operation. Another object is to prevent the cell current from flowing into the unselected cells. Another object of the present invention is to provide a semiconductor memory which has high integration and speed but a low power consumption by achieving the aforementioned objects.

The invention includes feeding cell current $I_{cell}$ to one BIT line only when both the x-selection signal and the Y-selection signal to be inputted to the memory cell take the selection level.

The disclosure includes feeding a current $I_R$ to only BIT lines selected, or feeding current $I_R$ transiently to only the BIT lines switched from unselected to selected states; and a sense amplifier for detecting the difference between the currents flowing in selected BIT lines to read out stored information, wherein current $I_R$ and cell current $I_{cell}$ have a relation of $I_R > I_{cell}$. As a result, the charge and discharge time periods of the BIT lines can be shortened without any substantial increase in the power consumption when the selected BIT lines are switched to read out or write the cell information. The high integration and speed of the memory can be realized remarkably efficiently by constructing the memory cell of the insulated gate type transistors suited for the high integration and by driving the BIT lines with the bipolar transistors suited for the high speed. To avoid the amplitude of the signal voltage, which is converted from the difference (e.g., $(I_R+I_{cell})-I_R=I_{cell}$) of the currents flowing through the selected paired BIT lines, from becoming small and weak against noises in case $I_R >> I_{cell}$, means is connected between the paired BIT lines and the sense amplifier for feeding or bypassing the electric current substantially equal to the current IR so that the sense amplifier may detect whether or not the current $I_{cell}$ flows. The sense amplifier includes at least two differential amplifiers.

The cell current $I_{cell}$ is reduced to a lower level than that of the prior art to reduce the voltage difference $V_{cell}$, which is to be applied to the memory cell, to a lower level than that of the prior art. As a result, the voltage amplitude of the BIT lines necessary for the information writing is reduced to shorten the charge and discharge time periods of the BIT lines. In the prior art, since the charge and discharge time periods of the BIT lines are highly dependent upon the cell current $I_{cell}$ and since the signal-voltage amplitude is reduced and weakened for the noises if the cell current Icell is reduced, this cell current $I_{cell}$ is designed to be as large as possible. On the contrary, the invention has a smaller cell current $I_{cell}$ than the prior art (about 0.3 mA), noting that the charge and discharge time periods are independent of the cell current $I_{cell}$ if $I_R >> I_{cell}$ and that the strength against the noises is not deteriorated even if $I_R >> I_{cell}$. If the cell current $I_{cell}$ is thus reduced, the voltage difference $V_{cell}$ to be applied to the memory cell can be made accordingly smaller than that (about 5 V) of the prior art. As a result, the voltage amplitude of the BIT lines necessary for the information writing can be reduced to shorten the charge and discharge time periods of the BIT lines. In the following, there will be described the reason for reducing the voltage difference $V_{cell}$ if the cell current $I_{cell}$ is reduced, and then the reason for reducing the voltage amplitude of the BIT lines necessary for the information writing and accordingly for shortening the charge and discharge time period of the BIT lines if the cell current $I_{cell}$ is reduced.

Generally speaking, the insulated gate type transistors composing the flip-flop are used in the unsaturated region so that their voltage-current characteristics can be expressed by the following relation:

$$I_D </= \beta[(V_{GS}-V_T)V_{DS} - \tfrac{1}{2}V_{DS}^2]$$

(e.g., pp. 99, Engineering (2) of Integrated Circuit written by Yanai and Nagata and published by Corona Corp.). This relation can be rewritten into the following form by substituting $I_D </= I_{cell}$, $V_{GS} </= V_{cell}$ and $V_{DS} </= kV_{cell}$:

$$I_{cell} </= \beta[k(1-k/2)V_{cell}^2 - kV_T V_{cell}].$$

Here:
$\beta$: the value of the insulated gate type transistors composing the flip-flop, $\beta=142$ μ S/V (e.g., for $T_{OX}=250$ A' and W/L=2, pp. 100–101, Engineering (2) of Integrated Circuit written by Yanai and Nagata and published by Corona Corp.);

$V_T$: the threshold voltage of the insulated gate type transistors composing the flip-flop, threshold voltage $V_T=0.5$ V or 1 V (e.g., Japanese Patent Publication No. 63-31879); and k: the ratio of the voltage $V_{DS}$, which is to be applied between the sources and drains of the insulated gate type transistors composing the flip-flop, to the voltage difference $V_{cell}$ when the information reading operation, $k = \frac{1}{8}$.

Usually, the BIT line potential in the information reading operation is designed to be at an intermediate value between the two potentials to be applied to the cell, and the ratio between the ON resistance of the insulated gate type transistors composing the flip-flop and the ON resistance of the insulated gate type transistors to be coupled to the BIT lines is designed to be generally at 1:3.

Hence, $V_{DS} </= (\frac{1}{4}) \times (\frac{1}{4}) \times V_{cell} = (\frac{1}{8}) \times V_{cell}$, and $k </= (\frac{1}{8})$.

In this case, the relation between the voltage difference $V_{cell}$ and the cell current $I_{cell}$ is enumerated by Table 1 and FIG. 33:

TABLE 1

| $V_{cell}$ | $I_{cell}$ (mA) ($V_T = 0.5$ V) | $I_{cell}$ (mA) ($V_T = 1.0$ V) |
|---|---|---|
| 5 | 0.372 | 0.327 |
| 4 | 0.231 | 0.195 |
| 3 | 0.123 | 0.097 |
| 2 | 0.049 | 0.031 |
| 1 | 0.008 | 0 |
| 0 | 0 | 0 |

It is seen from FIG. 33 that the voltage difference $V_{cell}$ can become smaller for the lower cell current $I_{cell}$. Specifically, if the cell current $I_{cell}$ is set smaller than the prior art (about 0.3 mA), e.g., within a range of 0.2 mA $> I_{cell} > 0$ mA, then the voltage difference $V_{cell}$ can be set within a range of $V_{cell} </= 4$ V $- 1$ VT1. For $I_{cell} = 0.05$ mA and $V_T - 0.5$ V, for example, $V_{cell} = 2$ V, which is reduced to 40% of the voltage difference $V_{cell}$ = the power supply voltage $</= 5$ V.

Next, if the voltage difference $V_{cell}$ is made as small as that value, the voltage amplitude of the BIT lines necessary for the information writing can be reduced to shorten the charge and discharge time periods of the BIT lines, as will be explained in the following. In order to write the information in the memory cell, as has been described, at least one of the potentials of the paired BIT lines has to be equalized to the source potentials of the insulated gate type transistors composing the flip-flop thereby to turn off the transistors. In the prior art, because of voltage difference $V_{cell}$—the power supply voltage $</= 5$ V, the aforementioned source potentials are at the ground voltage or the power supply voltage.

In the information writing operation, therefore, the BIT lines have to be charged or discharged so as to equalize the potential of the BIT lines to the ground or power supply voltage. If the voltage difference $V_{cell}$ is dropped, however, the aforementioned source potentials need not always be equal to the ground or power-supply potential. In other words, in the information writing operation, the potentials of the BIT lines need not be equal to the ground or power-supply voltage. This makes it possible to reduçe the voltage amplitude of the BIT lines necessary for the information writing operation thereby to shorten the charge and discharge time periods of the BIT lines accordingly.

The feeding of the cell current $I_{cell}$ to one of the BIT lines only when both the X-Section signal and the Y-selection signal to the memory cell are at the selection level, so that the unselected cells are not fed with the cell current $I_{cell}$, drops the power consumption.

The paired bipolar transistors QRL, QRR having their emitters connected with the BIT lines, their bases fed with the read/write control signals and their collectors for outputting the memory cell information are NPN bipolar transistors, as shown in FIG. 17. Thus, the first and second insulated gate type transistors QNL and QNR are changed from FIG. 17 N-channel to P-channel insulated gate type transistors having their sources fed with the voltage VCC, and resistors RL and RR are fed with the voltage VEE. As a result, the BIT line selection signal VYIN is driven to the high potential at the unselected level to drive the unselected BIT lines to the high potential. Then, the P-channel insulated gate type transistors in the unselected cell have their drain voltages raised to have their drainsource voltage VDS dropped to reduce the cell current $I_{cell}$. If the unselected BIT lines are raised to a sufficiently high potential, the cell current $I_{cell}$ of the aforementioned unselected cells can be reduced substantially to zero so that the power consumption can be reduced.

In case the first and second insulated gate type transistors QNL and QNR are changed to P-channel insulated gate type transistors, according to the invention, the insulated gate type transistors QTL and QTR to be coupled to the paired BIT lines are N-channel insulated gate type transistors. Thus, when the unselected BIT lines are driven to the high potential, the drain voltage of the P-channel insulated gate type transistors at the OFF side are also raised. As a result, if the BIT lines are raised to an excessively high potential, the information voltage of the cells can be dropped to prevent the cell margin from decreasing. If the transistors QTL and QTR are the N-channel insulated gate type transistors, the drain voltages of the P-channel insulated gate type transistors at the OFF side are clamped at the potential which is lower than the potential of the word lines by the threshold voltage of the transistors QTL and QTR so that they do not rise any more. As a result, the cell information voltage is dropped so that the cell margin is not reduced in the least.

The waveforms of the operations of the major portions of FIG. 36A are illustrated in the timing diagram of FIG. 36B. The word line WL takes the waveforms having the high level substantially at $V_{EE}(-5.2$ V$)$ and the low level substantially at $V_{cc}$ (0 V). When a memory cell is selected, a voltage signal is read out to then BIT line DL. This signal has an amplitude of about 50 mV. This signal is amplified by the bipolar transistors to generate a sense output SOUT of 250 mV.

The BiCMOS memory shown in FIG. 36A has a greater density and a higher speed than those of the bipolar memory but has a longer access time than that of the bipolar memory. The major reason for the longer access time is as follows. Even if the input signal is at the ECL level having small amplitudes, as shown in FIG. 36B, the word line drive signal and other internal signals are the MOS signals having an amplitude of about 5 V so that they take time for their conversions. Moreover, the amplitude of the word lines having the higher loads for the larger capacities is at 5 V so that the amplitude is so large as to elongate the access time. Moreover, the BIT lines under a heavy load have an amplitude as small as 50 mV and the memory cells of MOS type have such a low drivability as to pass an electric current of 0.1 mA, so that the access time is elongated.

On the other hand, FIG. 36C is a circuit diagram showing the cell array of the bipolar memory having the highest speed at present, and FIG. 36D is a waveform chart of the operations. In the bipolar memory, as shown, the amplitude of the word lines is as small as about 1 V so that the operations can be speeded up. When the memory cell is selected, the BIT line DL, which is connected with the ON transistor of the memory cell, has a read current $I_R$ flowing out from the ON transistor, and the BIT line, which is connected with the OFF transistor of the memory cell, has a read current flowing out from the sense transistor. The memory cell and sense transistor constitute together a current switch, and the read current flows from the transistor having the higher base voltage. The voltage of the BIT line is determined like the case of the emitter-follower to the value which is smaller by 1 $V_{BE}$ than the base voltage of the transistor for the flow of the read current, and its amplitude is about 200 mV, as shown at (b) in FIG. 36D. Thus, the amplitude is relatively large, but the drivability in the case of the bipolar memory is so high as to feed a current of several mA, so that the BIT lines can be charged or discharged at a high speed to raise the speed of the operations to a remarkably high level.

If, on the other hand, most of the peripheral circuits are made of the bipolar circuits to reduce the amplitudes of the word line drive signals and the remaining internal signals, as shown in FIG. 36A, they can have high-speed operations. Since, however, the MOS transistors constituting the memory cell are drive with a small amplitude, the gm of the transistors is dropped to retard the reading and writing operations as a whole.

Thus, it is difficult to increase the speed of the operations if the MOS memory cells or CMOS memory cells (i.e., the memory cells in which the load resistors of the memory cells MC of FIG. 36A are replaced by p-MOSes) are used. Therefore, some bipolar memory of the prior art is devised such that only the memory cells are replaced by the MOS or CMOS memories so that the memory may operate like the bipolar memories.

However, the aforementioned mere replacement of the bipolar transistors by the MOS transistors would not provide satisfactory results.

For the reading operations by the memory shown in FIG. 38A, more specifically, negative pulses are applied to the word line, WL1 ... WLn, to be selected as in the case of the bipolar memory. If a transistor T18 of the memory cell is ON and connected with the selected word line, the current flows through a diode D6 to drop the level of BIT line BL1 to the low level so that the information is read out. These operations are similar to those of the bipolar memory. Since the current drivability of the MOS transistor is small (usually about 0.1 mA), the reading current is smaller by about one order than that (usually several mA) of the super-high speed case of the bipolar memory. Thus, the heavily loaded BIT lines cannot be charged or discharged at a high speed so that the reading speed becomes far lower than that of the bipolar memory.

In the writing case the circumstances are different between the MOS memory and the bipolar memory. For example, let the case be considered, in which inversion information is to be written in the selected memory cell of FIG. 38A with the transistor T18 being ON but the other transistor T17 being OFF. In this case, as has been disclosed in the aforementioned Laid-Open, transistors T16, Q6 and Q4 are turned ON to drop the potential of the data line BL1.

If the memory cell uses the bipolar transistors, as shown in FIG. 38, the transistor Q18 of the selected memory cell has its collector and base currents flowing, if it is ON, through a diode SB. When the potential of the data line DL is dropped, the diode SB is rendered nonconductive so that the base current flows out through a resistor $R_1$ having a high resistance. Then, the transistor Q18 has its base potential dropped so that it be turned OFF. As a result, the collector potential of the transistor Q18 is raised to turn ON the transistor Q17. In contrast, no gate current flows through the transistor T18 in the case of the MOS memory cell of FIG. 38A, and the gate voltage of the transistor 18 is not dropped even if the data line BL1 takes the low level. So long as there is no leakage in the transistors, the transistor T18 is ON whereas the transistor T17 is OFF so that the writing operation is not accomplished. Even if the writing operations are accomplished by leakage or the like of the MOS transistors, their write time is increased to a very long period.

In the bipolar memory of the prior art shown in FIG. 36C, only the memory cell is replaced by the MOS cell to effect the operations similar to those of the bipolar memory, as shown in FIG. 38B. Specifically, the read of the MOS memory cell, like the bipolar memory is accomplished by feeding only the current of one of the sense transistors from the memory cell transistors. Since the memory, cells are constructed of MOS transistors, the current to be fed to the cells is about 100 μA at the highest. For these operations, the current $I_{D1}$ has to be far smaller (e.g., 1/100) than the cell current (e.g., 100 μA), as is disclosed herein. This makes the charge or discharge of the BIT lines quite long and it is impossible to speed up the operations. Since, in this prior art example, the MOS cells are operated at a level near the TTL level, the drive of the memory cells takes a long time so that the access time and the write time are five times as long as those of the bipolar memory, in dependence upon the degree of integration.

As has been described hereinbefore, it is generally difficult to achieve the satisfactory high-speed operation if only the memory cells of the bipolar memory are replaced for the operations of the prior art by the MOS or CMOS memory cells.

One object of the present invention is to provide a BiCMOS memory which can achieve a short access time, e.g., an access time no longer than that of the bipolar memory, for example.

Another object of the present invention is to provide a BiCMOS memory of low power consumption.

Still another object of the present invention is to provide a BiCMOS memory of high integration.

In order to achieve some of the aforementioned objects, according to the present invention, there is provided a semiconductor memory of large capacity and low power consumption, which comprises: a memory cell array composed of memory cells having a constant current drivability; and a sense circuit including at least two current sources or current switches and two bipolar transistors such that the emitters of the two bipolar transistors are connected with the BIT lines of said cell array. In this case, the memory cells may be of any type if they feed a constant current. For these memory cells, the cells made of MOS transistors are excellent in their density. Moreover, the sense circuit is fed with a current larger than that flowing through the memory cells so that the information is read out by adding or subtracting the current from the memory cells to or from the large current. The current to the sense circuit is larger than the read current from the memory cells so that the BIT lines and the sense circuits can be charged or discharged at a high speed for the high-speed operations.

BRIEF DESCRIPTION OF THE DRAWINGS

Further objects, features and advantages of the present invention will become more clear from the following detailed description of a preferred embodiment, shown in the drawing, wherein:

FIG. 34A is a circuit diagram showing one embodiment of the semiconductor memory of the present invention;

DETAILED DESCRIPTION OF THE PREFERRED EMBODIMENT

One embodiment of the present invention will be described below with reference to FIG. 1.

Figure 15:
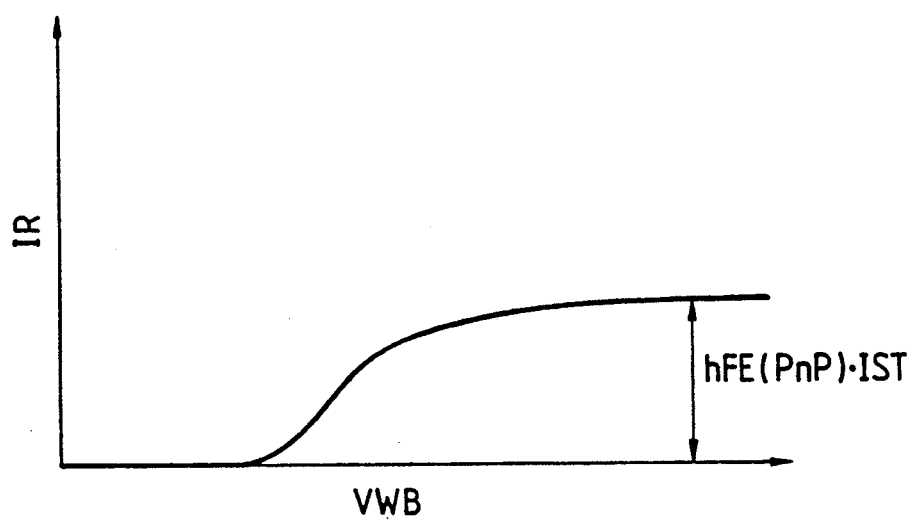
FIG. 15 is a view showing the relationship between the readout current and the voltage between the word and BIT lines.

The reference symbol C denotes a memory cell, W, LW word lines, BO, B1 BIT lines, QO, Q1 reference transistors, WS a word line select signal, BS a BIT line select signal, BD a BIT line drive circuit, IBO, IB1 BIT line discharge current sources, OB an output buffer, and DO a data output signal. The memory cell C is arranged such that a flipflop is formed by connecting together two thyristors comprising pnp load transistors QPO, QP1 and npn transistors QNO, QN1, a transistor QCS operates in response to control VCS to connect a current source IH and is connected to the emitters of the drive transistors QNO and QN1, and the thyristors are coupled to the BIT lines through diodes DO and D1, respectively. This memory cell is controlled so as to be selectively brought into a select state (readout state) and a non-select state (hold state) by the voltage VWB between the word and BIT lines W and BO/BI, as shown in FIG. 15. In the following, it is assumed that the transistors QPO and QNO are conducting, and the collector of the transistor QNO is at a relatively low potential, while the collector of the transistor QN1 is at a relatively high potential.

In a non-select state 7 both the transistors QPO and QNO are operating in the saturation region and the potential difference VMC between the respective collectors of the transistors QNO and QN1 is as follows:

$$VMC = VBE - VCE(\text{saturation}) \sim 700 \text{ mV}$$

where
VBE: base-emitter voltage (not higher than 700 mV) of transistor QPO
VCE (saturation): collector-emitter voltage (not higher than 0 mV) of transistor QPO when saturated At this time, the following voltage VWB is applied so that the diode D1 connected to the collector that is at a higher potential will not turn conductive:

$$VWB = VCE(\text{saturation}) + VF(\text{off}) \sim 0 \text{ V}$$

where VF (off): anode-cathode voltage (not higher than 0 V) of diode D1 when not conducting Accordingly, in a non-select state, no readout current flows from the memory cell to the BIT lines, as shown in the left portion of FIG. 15.

In a select state for readout as shown in the right portion of FIG. 15, VWB is increased to such a level that the diode D1 turns conductive and the transistor QPO operates in the active region. In other words, the following voltage VWB is applied:

$$VWB = VCE(\text{active}) + VF(\text{on}) \sim 1.0\ V$$

where
VCE (active): voltage (not higher than 300 mV) required for transistor QPO to operate in the active region
VF (on): anode-cathode voltage (not higher than 700 mV) of diode D1 when conducting Thus, the transistor QPO operates as a constant-current source, and, as shown in FIG. 15, the readout current IR that flows to the BIT line through the diode D1 is as follows:

$$R = hFE(pnp) \times IST$$

where
hFE (pnp): current-amplification factor of transistor QPO
IST: holding current It should be noted that the transistor QCS operates as a current source for stably supplying holding current when the memory cell is in a select state.

At this time, the emitter currents of the reference transistors Q1 and Q0 are IB−IR and IB, respectively, (IB: the BIT line discharge current supplied from the current sources IB0 and IB1). This current difference is amplified in the output buffer OB and output as being the data output signal DO.

The following is a description of writing into this memory cell. It is assumed that writing into the memory cell C previously has been effected and both the transistors QPO and QNO are conducting. Next, in accordance with write information, the base potential of either the reference transistor Q0 or Q1 is determined, for instance, the base potential of the transistor Q1, is made lower than the potential at the time of reading. In consequence, the potential at the BIT line B1 lowers and therefore the base potential of the transistor QNO lowers and QNO becomes non-conductive. As a result, the transistor QP1 turns conductive to invert the information stored in the memory cell, thus completing the writing operation.

Assuming that the holding current IST is 2,uA and the current amplification factor hFE (pnp) of the pnp transistor is 100, the readout current IR is 200 uA. In other words, the steady-state current flowing through the BIT lines can be reduced to about 200,uA, which is about 1/10 of that in the prior art, i.e., several mA. Thus, even if the wiring resistances RO and R1 increase as a result of an increase in the integration density, the voltage drop caused by the wiring resistances is small and there is no reduction in the readout margin of the memory cell. In addition, the BIT line discharge current IB can be set independently of IR and can be supplied at several mA as in the prior art. Therefore, the BIT lines are discharged at high speed and there is no increase in the access time due to an increase in the integration density.

Figure 3:
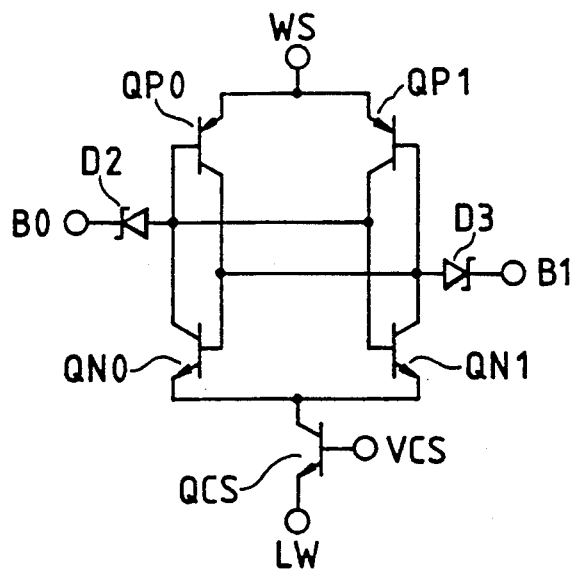
FIGS. 3 to 5 and 13 are views respectively showing other embodiments of the present invention.

FIG. 3 shows another embodiment of the present invention, in which the thyristors are connected to the BIT lines through Schottky barrier diodes (hereinafter abbreviated as SBDs) D2 and D3, respectively. Since the forward voltage of an SBD is lower than the forward voltage of a pn junction diode, the BIT line potential can be designed so as to be relatively high and it is therefore possible to enlarge the power supply voltage margin of the BIT line drive circuit.

Figure 4:
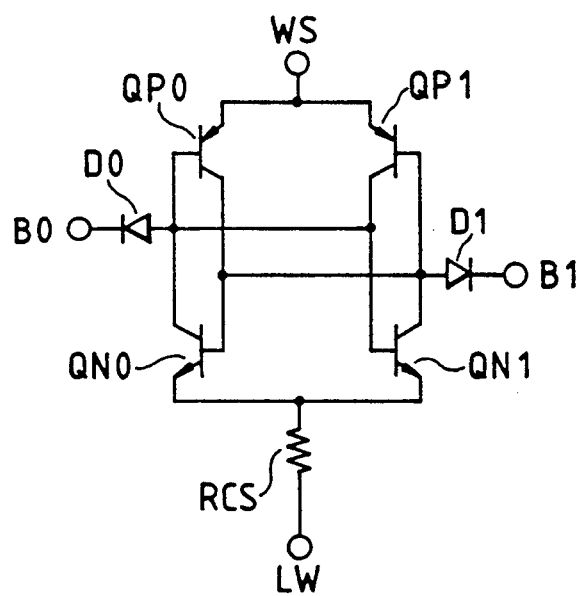

FIG. 4 shows still another embodiment of the present invention, in which the current source is constituted by use of a resistor RCS. In the first embodiment, since the current source is constituted by use of a transistor QCS, a common line is needed to apply a bias voltage VCS to the base. In this embodiment, however, since the current source is constituted by use of a resistor, no common line is needed and it is therefore possible to reduce the memory cell area. If the resistor RCS is formed from polycrystalline silicon, the element isolation region becomes unnecessary and it is therefore possible to further reduce the memory cell area.

Figure 5:
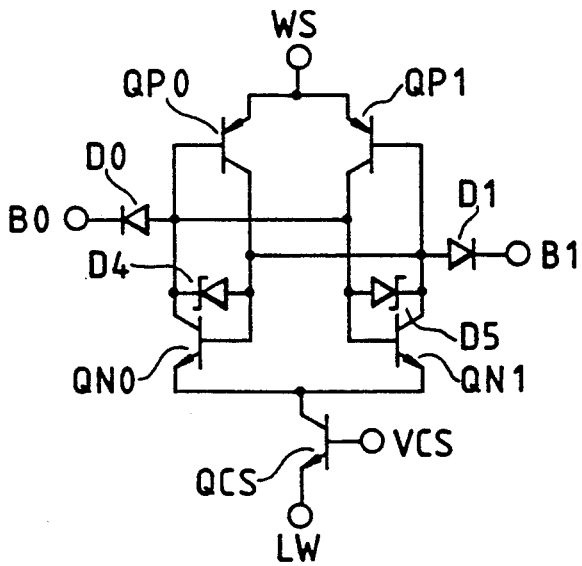

FIG. 5 shows a further embodiment of the present invention, in which SBDs D4 and D5 for preventing saturation are connected between the bases and collectors of the transistors QNO and QN1, respectively. With this arrangement, the transistors QNO, QN1, QPO and QP1 will not operate in the saturation region and it is therefore possible to effect reading and writing at high speed.

Figure 6:
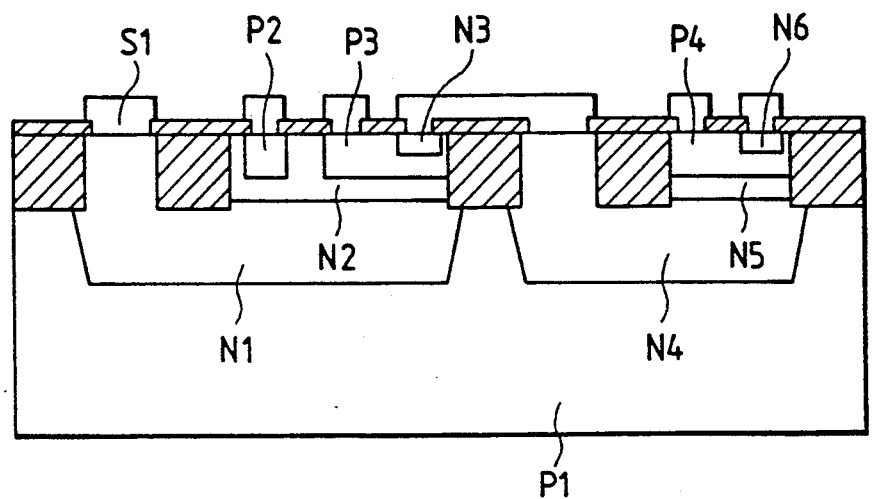
FIGS. 6 to 12 and 14 are views respectively showing cross-sectional structures of the present invention when realized on a semiconductor.

FIG. 6 shows a still further embodiment of the present invention, which shows a cross-sectional structure of the memory cell according to the present invention when realized on a semiconductor. The reference symbol P1 denotes a semiconductor substrate, P2 an emitter region of a pnp transistor, P3 a collector region of a pnp transistor and a base region of npn transistor, P4 a base region of npn transistor, N1, N4 N-type buried layers, N2, N5 N-type epitaxial layers, N3, N6 emitter regions of npn transistors, and S1 a Schottky junction. P2, N2 and P3 constitute in combination a pnp transistor, while N3, P3 and N2 constitute in combination an npn transistor, these two transistors cooperating with each other to function as a thyristor. The Schottky junction S1 constitutes an SBD which couples together a BIT line and the above-described thyristor. N6, P4 and N5 constitute in combination an npn transistor which operates as a current source.

Figure 7:
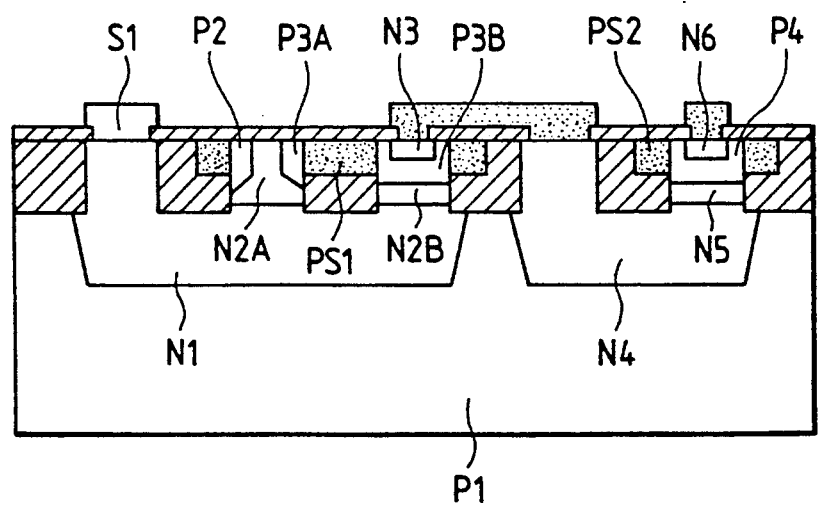

FIG. 7 shows a still further embodiment of the present invention, which shows a cross-sectional structure of the memory cell fabricated by use of a self-aligned bipolar process wherein a base electrode is led out from the side wall of a silicon crystal by using polycrystalline silicon. The reference symbol P1 denotes a semiconductor substrate, P2 an emitter region of pnp transistor, P3A a collector region of pnp transistor, P3B a base region of npn transistor, P4 a base region of npn transistor, N1, N4 N-type buried layers, N2A, N2B, N5 N-type epitaxial layers, N3, N6 emitter regions of npn transistors, PS1, PS2 P-type polycrystalline silicon electrodes, and S1 a Schottky junction.

P2, N2A and P3A constitute in combination a pnp transistor, while N3, P3B and N2B constitute in combination an npn transistor, these transistors cooperating with each other to function as a thyristor. The Schottky junction S1 constitutes an SBD which couples together a BIT line and the above-described thyristor. N6, P4 and N5 constitute in combination an npn transistor which operates as a current source. By using a self-alignment process as in this embodiment, the performance of the transistors improves by a large margin and therefore the present invention can greatly contribute to improvement in the memory performance.

Figure 8:
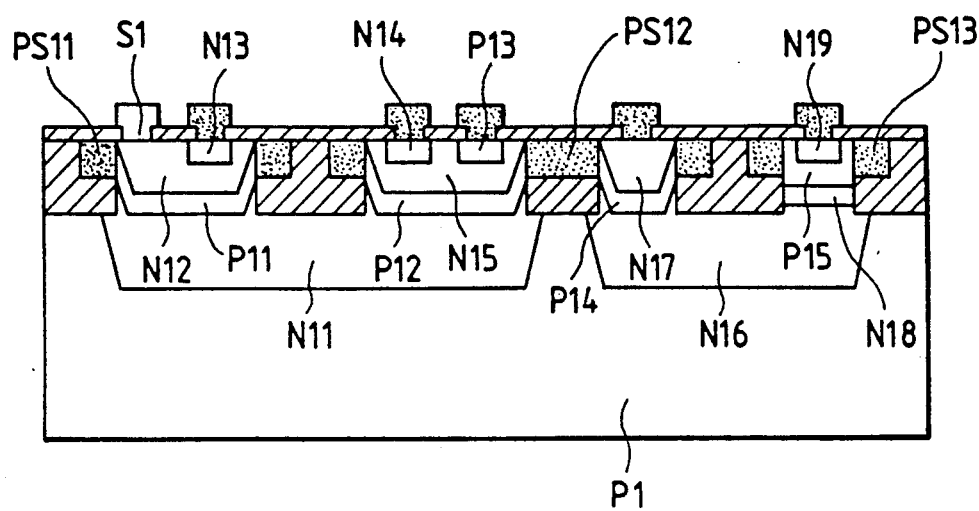

FIG. 8 shows a still further embodiment of the present invention, in which measures are taken to prevent soft errors due to alpha particles. The reference symbol P1 denotes a semiconductor substrate, P11 a P-type shield layer, P12 a collector region of pnp transistor, P13 an emitter region of a pnp transistor, P14, P15 base regions of a npn transistors, N11, N16 N-type buried layers, N12 a cathode region of the SBD, N13 an N-type region for leading out the cathode, N14 an N-type region for leading out the base of a pnp transistor, N15 a base region of a pnp transistor, N17 a collector region of a npn transistor, N18 an epitaxial layer, N19 an emitter region of an npn transistor, PS11, PS12, PS13 polycrystalline silicon electrodes, and S1 a Schottky junction. P13, N15 and P12 constitute in combination a pnp transistor, while N16, P14 and N17 constitute in combination an npn transistor, these transistors cooperating with each other to function as a thyristor. The Schottky junction S1 constitutes an SBD which couples together a BIT line and the above-described thyristor. N19, P15 and N18 constitute in combination an npn transistor which operates as a current source.

In this embodiment, the information storage node of the memory cell is electrically isolated from the substrate which is a generation source of noise charge caused by alpha particles. More specifically, the SBD that comprises the Schottky junction S1 is electrically isolated from the substrate by the P-type shield layer P11, and the pnp transistor comprising P13, N15 and P12 is electrically isolated from the substrate by the N-type buried region N11. In addition, by using the npn transistor comprising N16, P14 and N17 in the backward direction, the collector region N17 that constitutes an information storage node is also isolated from the substrate. Thus, since the information storage node can be completely isolated from the substrate that is a noise charge generation source, it is possible to markedly reduce soft errors due to alpha particles.

Figure 9:
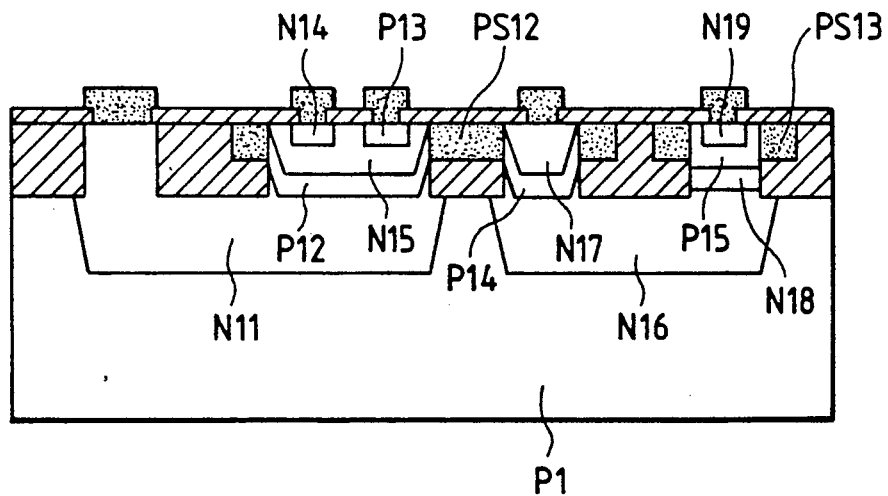

FIG. 9 shows a still further embodiment of the present invention, in which a pn junction diode substitutes for the SBD shown in FIG. 8. This embodiment differs from the embodiment shown in FIG. 8 only in that the SBD is replaced by the pn junction diode. The pn junction diode comprises the collector region P12 of the pnp transistor and the N-type buried region N11. The substitution of the pn junction diode for the SBD enables the memory cell structure to be simplified and permits a reduction in the cell area.

Figure 10:
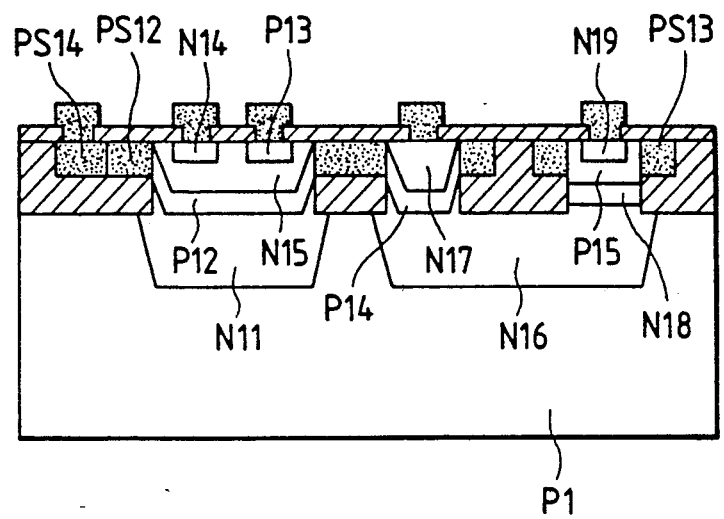

FIG. 10 shows a still further embodiment of the present invention, in which a pn junction diode of polycrystalline silicon is substituted for the pn junction diode shown in FIG. 9. This embodiment differs from the embodiment shown in FIG. 8 only in that the pn junction diode is replaced by the pn junction diode of polycrystalline silicon. The pn junction diode of polycrystalline silicon comprises the collector electrode PS12 (p-type polycrystalline silicon) of the pnp transistor and the n-type polycrystalline silicon region PS14. The substitution of the polycrystalline silicon pn junction diode for the pn junction diode enables the cell area to be reduced more than in the case of the embodiment shown in FIG. 9.

Figure 11:
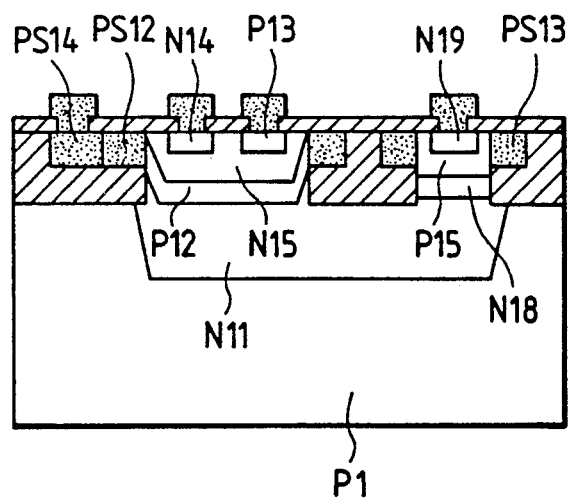

FIG. 11 shows a still further embodiment of the present invention, in which the pn and npn transistors constituting in combination a thyristor in FIG. 10 are combined together into a composite form. P13, N15 and P12 function as the emitter, base and collector, respectively, of a pnp transistor, while N14, P12 and N11 function as the collector, base and emitter, respectively, of an npn transistor. Combining together the npn and pnp transistors into a composite form, the number of N-type buried regions required can be reduced to one and it is therefore possible to reduce the cell area by a large margin.

Figure 12:
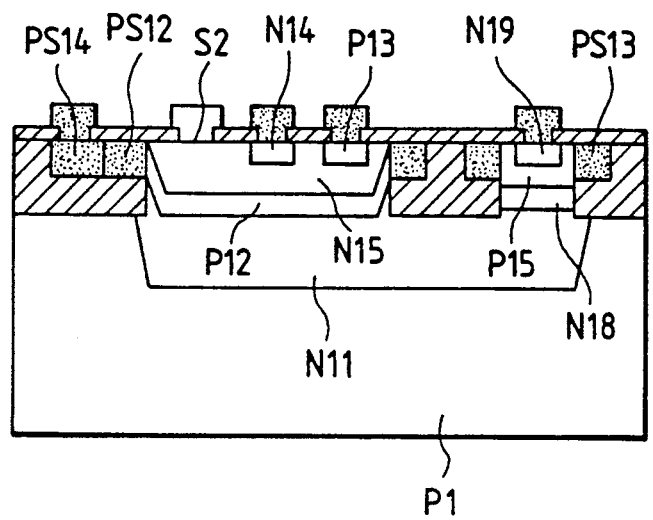

FIG. 12 shows a still further embodiment of the present invention, in which an SBD for preventing saturation of transistors is added to the arrangement of the embodiment shown in FIG. 11, FIG. 12 illustrating a cross-sectional structure corresponding to that of the embodiment shown in FIG. 5. This embodiment differs from the embodiment shown in FIG. 11 only in that a Schottky junction S2 is formed in the base region N15 of the pnp transistor. The Schottky junction S2 constitutes an SBD with the base region N15 of the pnp transistor being defined as the cathode thereof. Therefore, by connecting together the anode electrode of the SBD and the collector electrode of the pnp transistor (the connection not being shown), it is possible to prevent saturation of the pnp and npn transistors and perform reading and writing at high speed.

Figure 1:
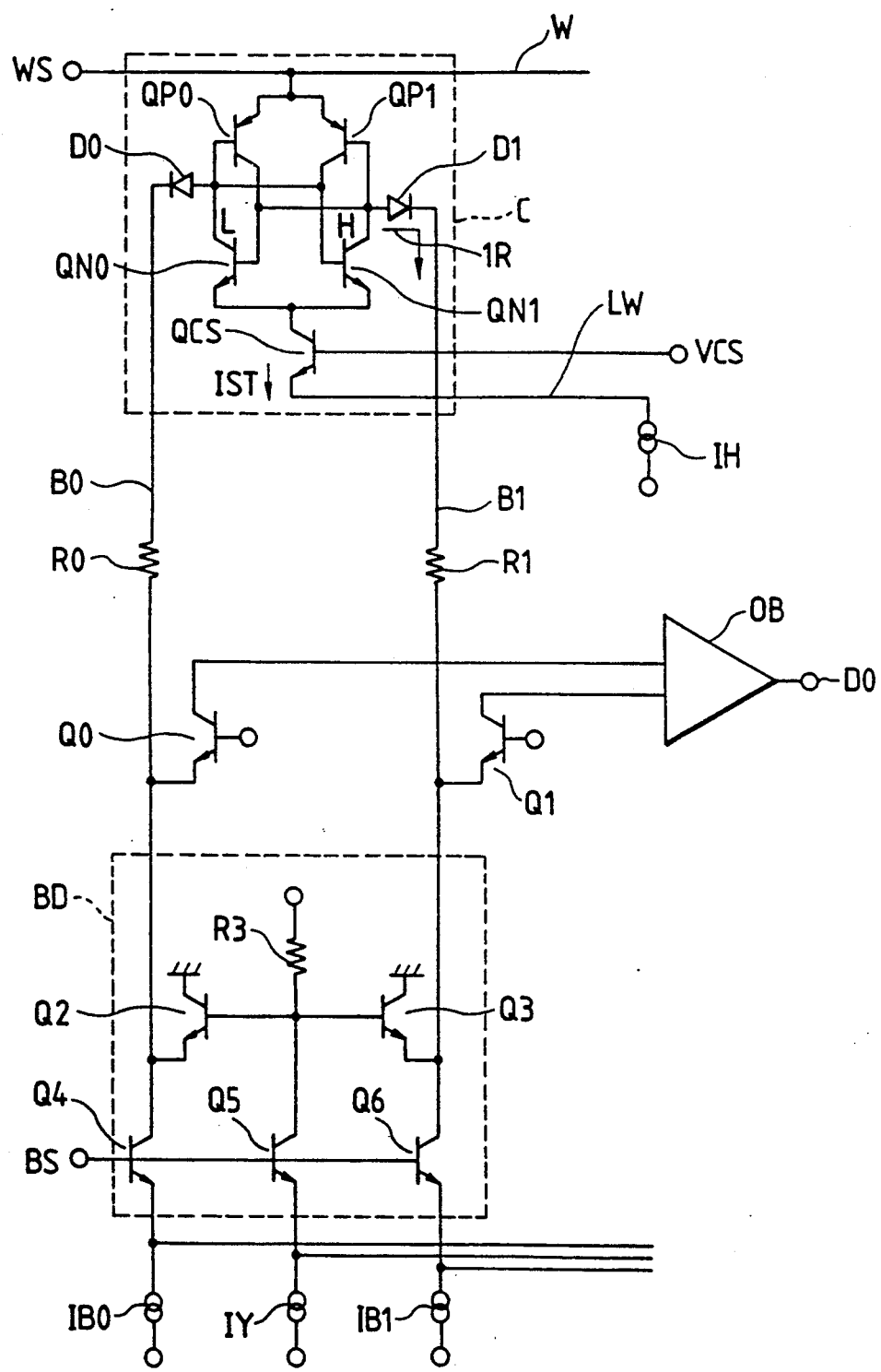
FIG. 1 is a view showing a basic embodiment of the present invention.
Figure 2:
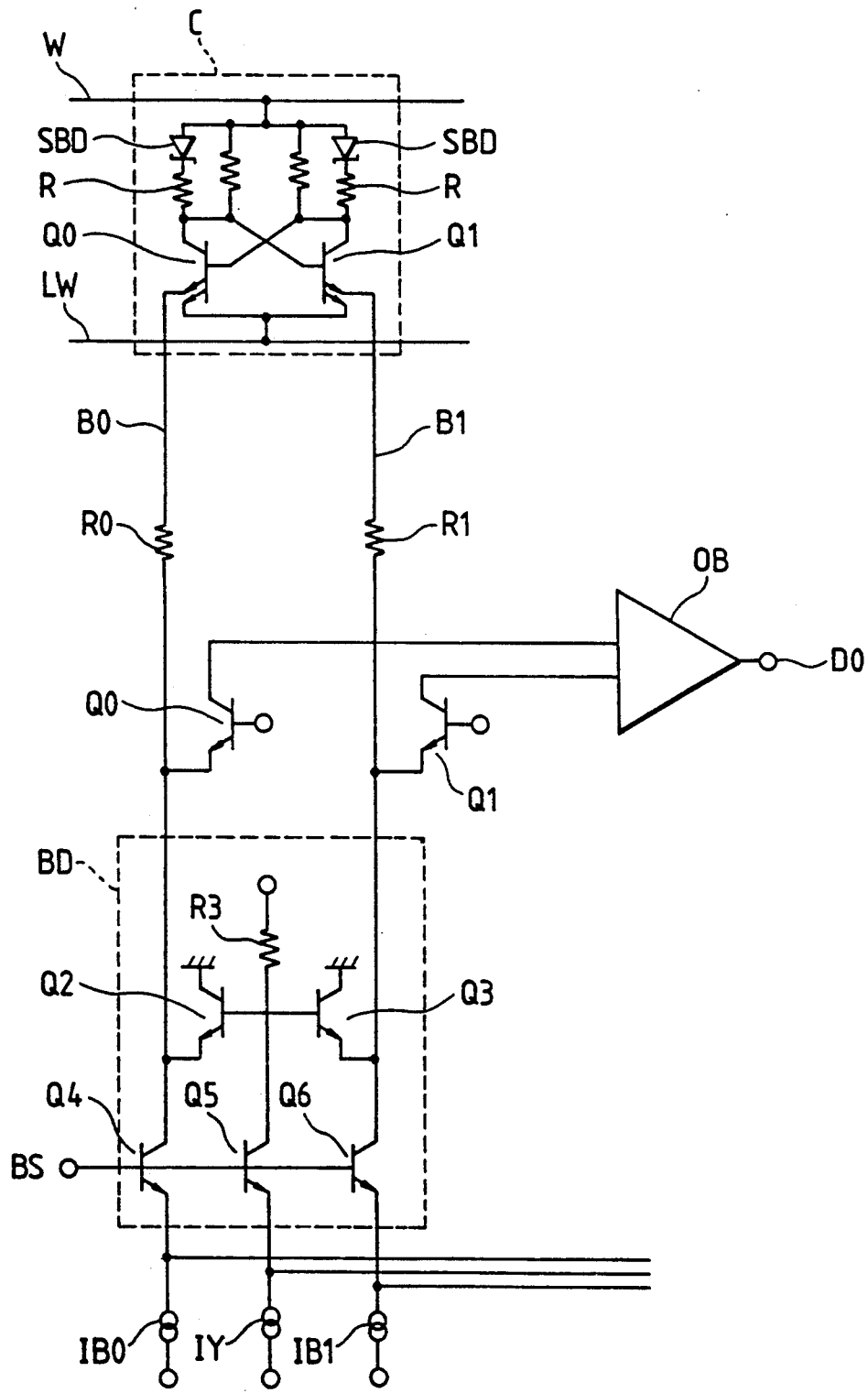
FIG. 2 is a view showing a prior art.
Figure 13:
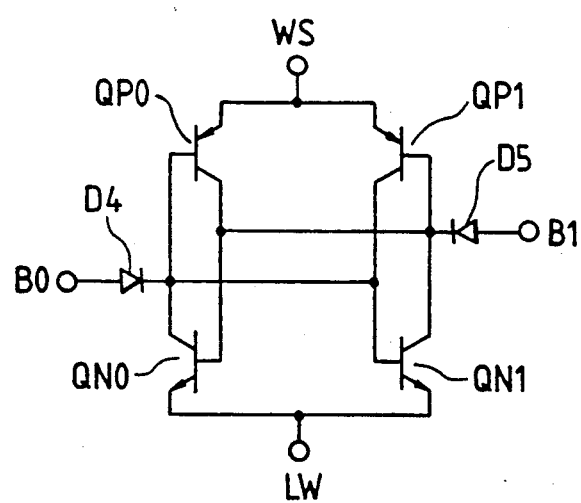
Figure 14:
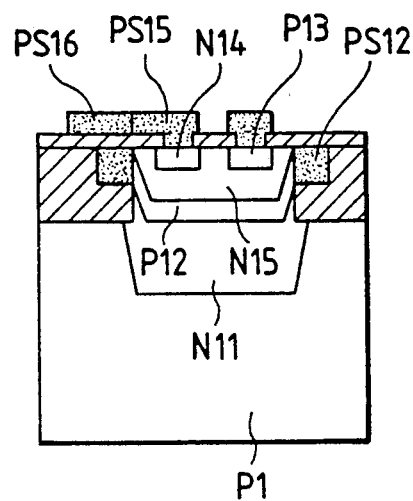

FIG. 13 shows a still further embodiment of the present invention, in which the direction in which the diodes D0 and D1 in the embodiment shown in FIG. 1 are connected is reversed. More specifically, the anodes of diodes D4 and D5 are connected to the BIT lines B0 and B1, respectively, while the cathodes thereof are connected to the collectors of the transistors QN0 and QN1, respectively. By so doing, it is possible to omit the constant current source transistor QCS in the embodiment shown in FIG. 1 and it is possible to make the memory cell area extremely small, as shown in FIG. 14. In the figure, the reference symbols PS15 and PS16 denote N-type polycrystalline silicon and P-type polycrystalline silicon, respectively, which constitute in combination a pn junction diode which couples together a BIT line and the thyristor.

It is possible in this embodiment also to prevent saturation of the transistors by forming a Schottky junction in the base region N15 of the pnp transistor as in the case of the embodiment shown in FIG. 12 and, by so doing, it is possible to perform reading and writing operations at high speed.

According to the present invention of FIGS. 1 and 2-15, the readout current IR carrying readout information can be set to be about 1/10 of the BIT line discharge current IB. Accordingly, even if the BIT line discharge current as in the prior art is supplied, the readout current is as small as about 1/10 of that in the prior art and it is therefore possible to reduce the voltage drop caused by the wiring resistance of the BIT lines. Thus, it is possible to provide a semiconductor memory cell which is capable of satisfactorily ensuring the readout margin and discharging the BIT lines at high speed even when the integration density is increased.

Figure 18A:
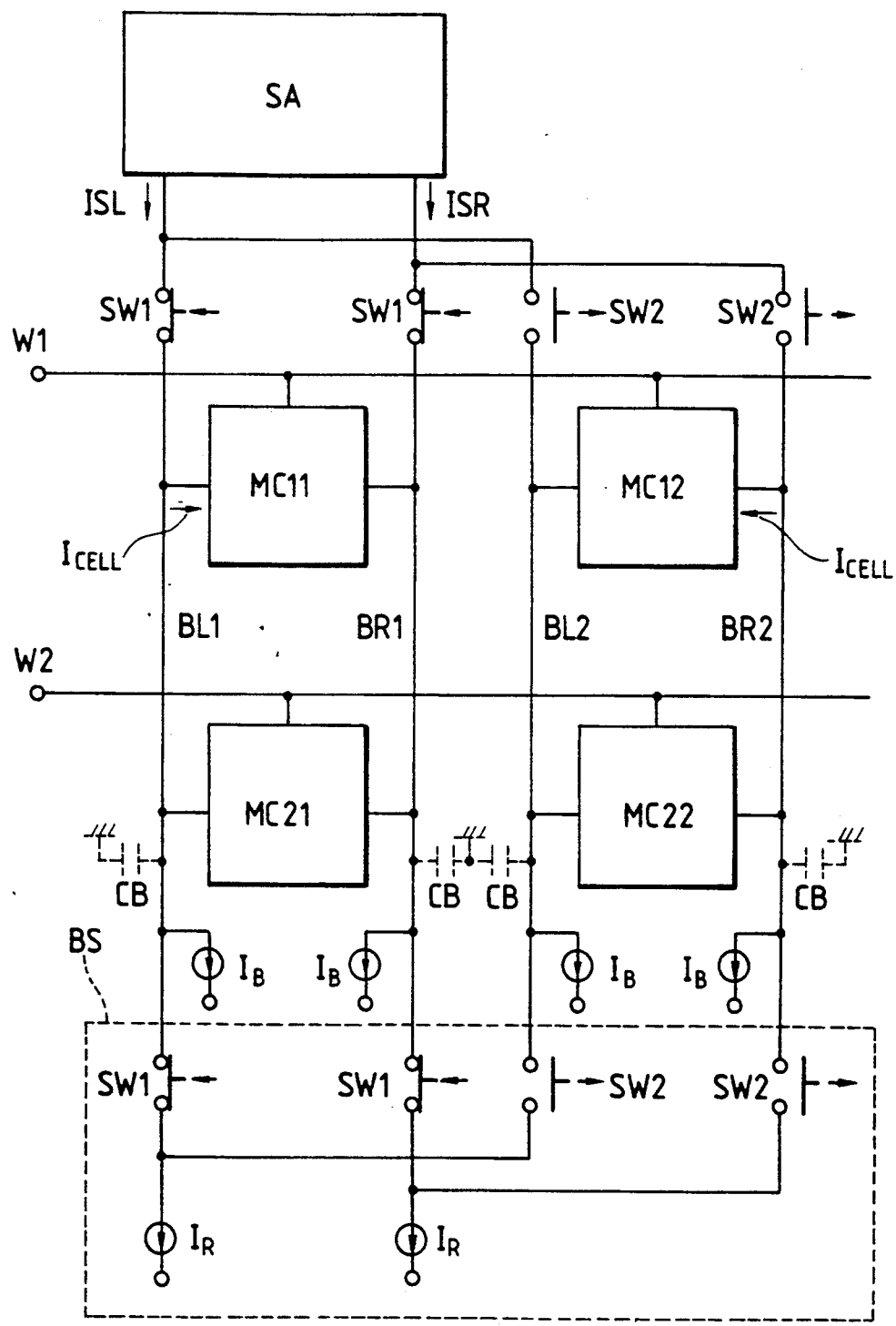
FIGS. 18 through 21 are diagrams showing embodiments of the present invention.
Figure 18B:
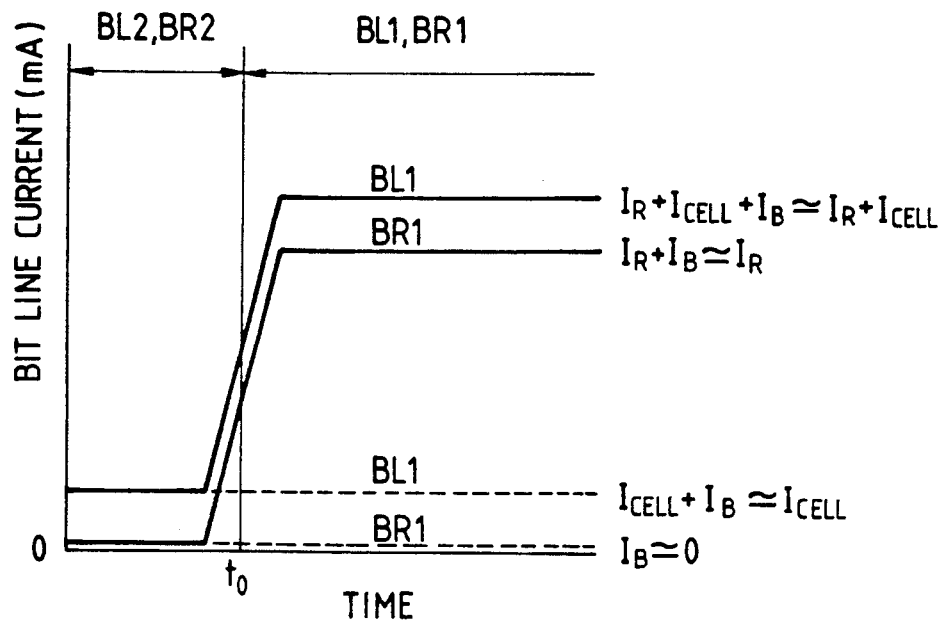
Figure 18C:
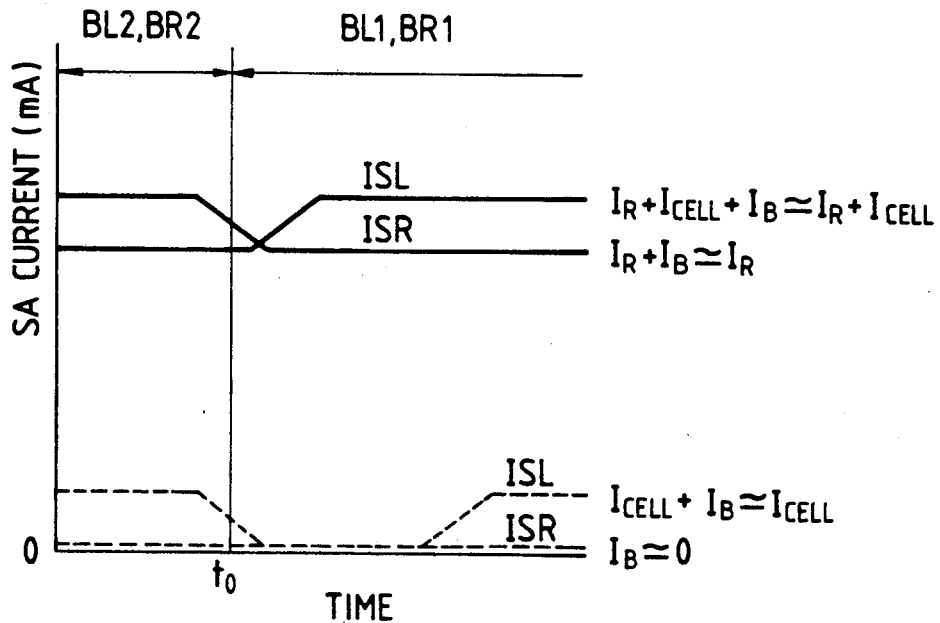

FIG. 18(a) is a block diagram showing the memory cells and peripheral circuits of the semiconductor memory. FIG. 18(b) is a waveform chart showing the electric currents to flow through the BIT lines, and FIG. 18(c) is a waveform chart showing the currents to flow through the sense amplifier. In FIG. 18(a), there are shown: memory cells MC11 and MC21 which are connected with a pair of BIT lines BL1 and BR1 for feeding the cell current $I_{cell}$ to one of the BIT lines in accordance with storage information; memory cells MC12 and MC22 which are connected with a pair of BIT lines BL2 and BR2; means BS for feeding the current $I_R$ to only the paired BIT lines selected; and a sense amplifier SA. In the present invention that there is provided the means BS for feeding the current $I_R$ only to the selected paired BIT lines to establish a relation of $IR > I_{cell}$ between the aforementioned current $I_R$ and cell current $I_{cell}$. Thus, the discharge time period of the BIT lines for the information writing operation can be shortened, as will be described in the following, without any substantial increase in the power consumption when the selected BIT lines are switched to read out the cell information.

First of all, the following case will be considered. When the word line W1 is at the selection level, at a time $t_o$, the switch SW1 is switched from OFF to ON, and the switch SW2 is switched from ON to OFF so that the selected BIT lines may be switched from BL2 and BR2 to BL1 and BL1 to read out the information of the memory cell MC11. In this instance, the currents to flow through the BIT lines BL1 and BR1 are illustrated in FIG. 18(b), and the currents ISL and ISR to flow through the sense amplifier SA are illustrated in FIG. 18(c). In these figures, the curves plotted by broken lines are the waveforms of the prior art which is not equipped with the means BS for feeding the current $I_R$ only to the selected paired BIT lines. First of all, the currents to flow through the BIT lines BL1 and BR1 are $I_{cell}+I_B$ and $I_B$, respectively, at and before the time to in both the prior art and the present invention. Here, the current $I_B$ flows through each of the multiple BIT lines and is limited from the standpoint of the power consumption usually to $I_B<<I_{cell}$, as is disclosed in Japanese Patent Publication No. 63-31879. Therefore, it may be thought that $I_{cell}+I_B</=I_{cell}$, and $I_B</=0$. At and after the time $t_o$, the currents to flow through the BIT lines BL1 and BR1 are not varied in the prior art. In the present invention, on the contrary, there is provided the means BS for feeding the current $I_R$ only to the paired BIT lines selected to establish the relation $I_R > I_{cell}$ between the current $I_R$ and the cell current $I_{cell}$. The currents to flow through the BIT lines BL1 and BR1 are $I_R+I_{cell}$ and $I_R$, respectively, in addition to $I_B$, so that they are larger than those of the prior art by at least $I_R - I_{cell} (>0, \therefore I_R > I_{cell})$. This makes it possible to make the discharge time of the parasitic capacitance CB of the selected BIT lines BL1 and BR1 shorter than the prior art. As a result, as shown in FIG. 18(c), the timing for changing the waveforms of the currents ISL and ISR of the sense amplifier SA can be speeded up as compared to the prior art waveform in dotted lines. Moreover, the power consumption is hardly increased because the current $I_R$ is fed only to the selected paired BIT lines. As shown in FIG. 18(c), the currents ISL and ISR are larger by $I_R$ than the prior art, as expressed by $ISL</=I_R+I_{cell}$ and $ISR</=I_R$. In the case of $I_R>>I_{cell}$, therefore, it is feared that the amplitude of the signal voltage, which is converted from the current difference of $(I_R+I_{cell})-I_R=I_{cell}$, may be small and weak against the noises. That problem can be avoided as described later.

Next, let the case be considered in which the information is written in the memory cell MC11. In this case, too, the currents to flow through the BIT lines BL1 and BR1 are larger than those of the prior art and the discharge time period of the BIT lines can apparently be shortened.

Figure 19A:
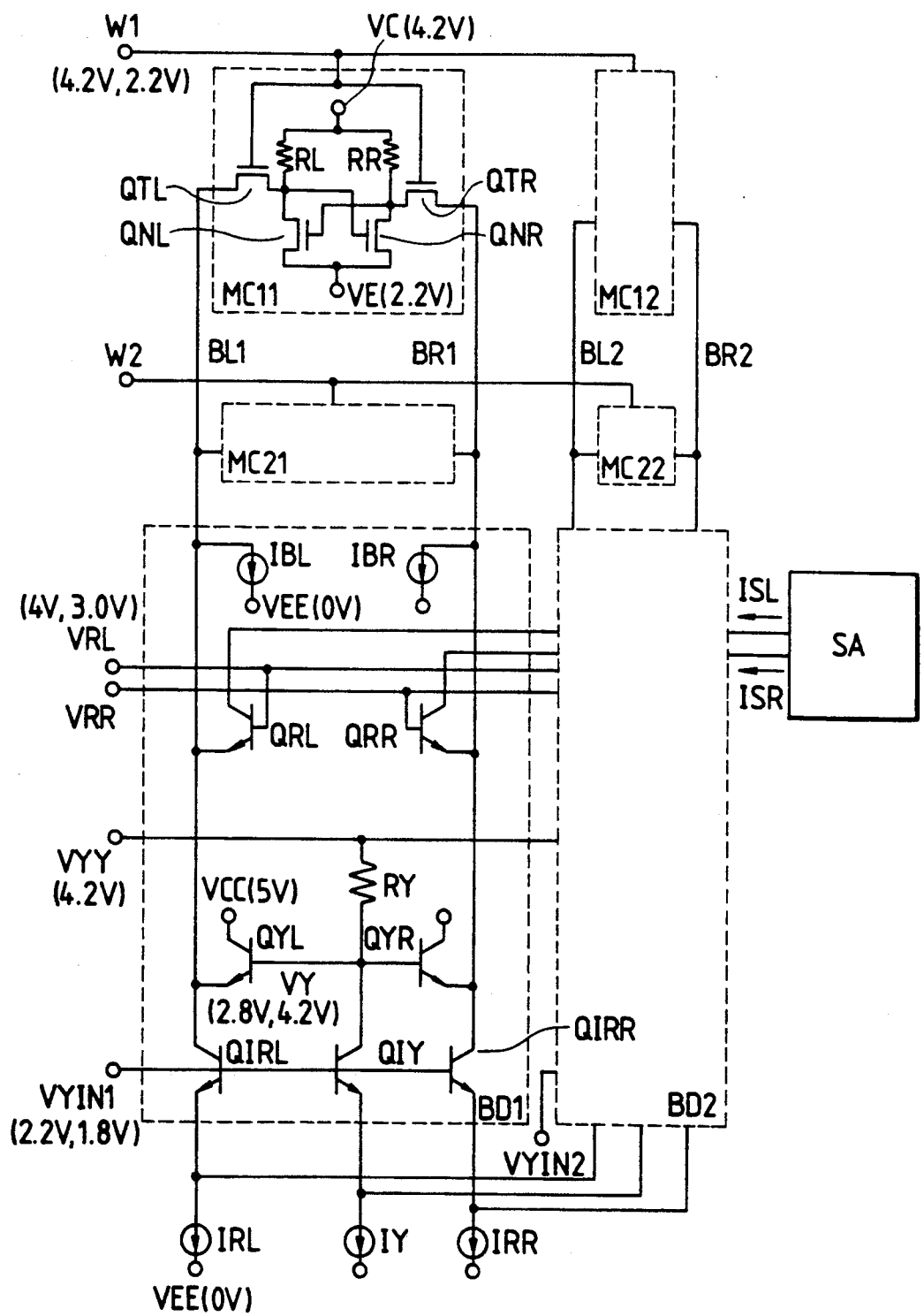
Figure 19B:
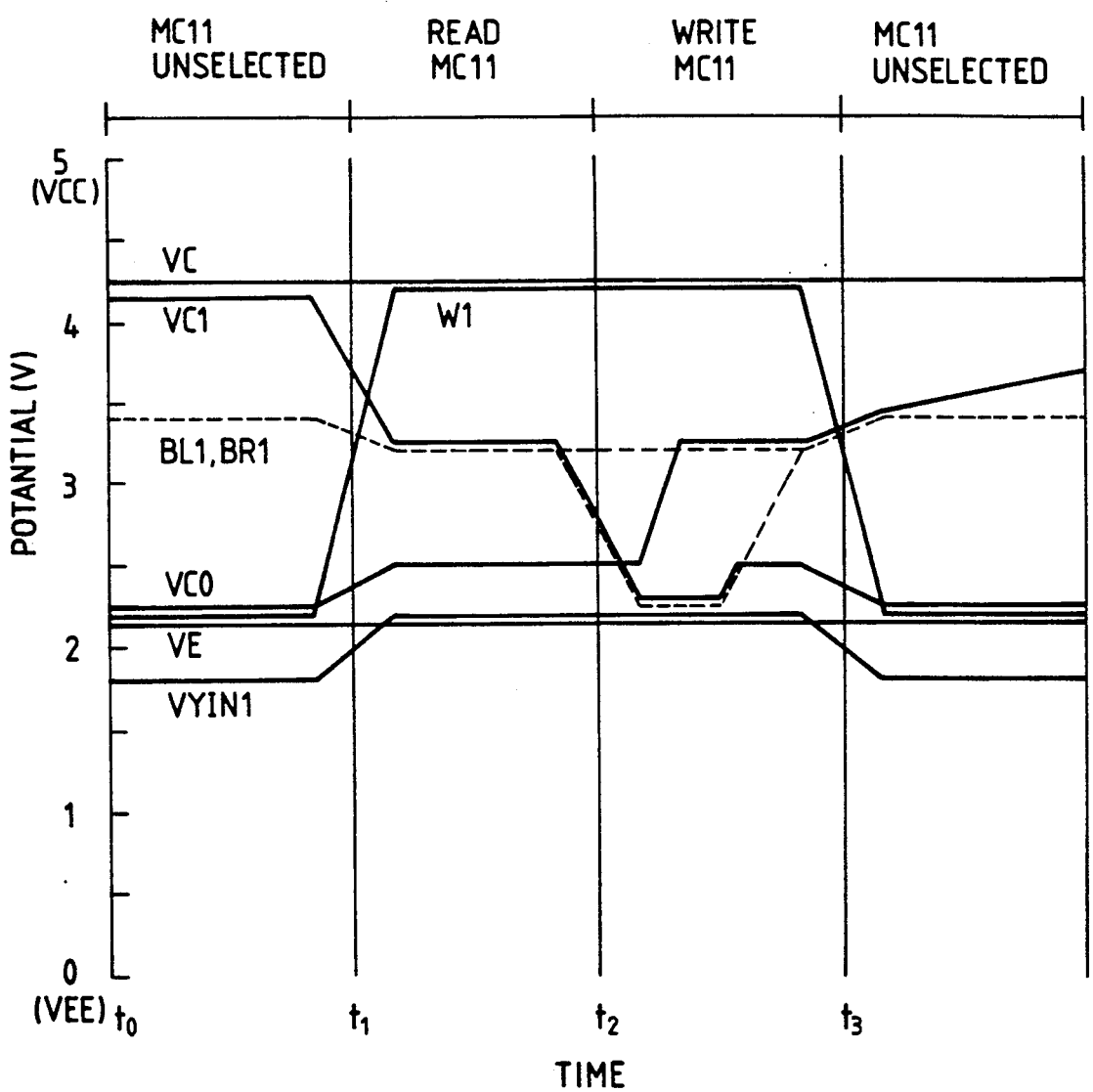
Figure 19C:
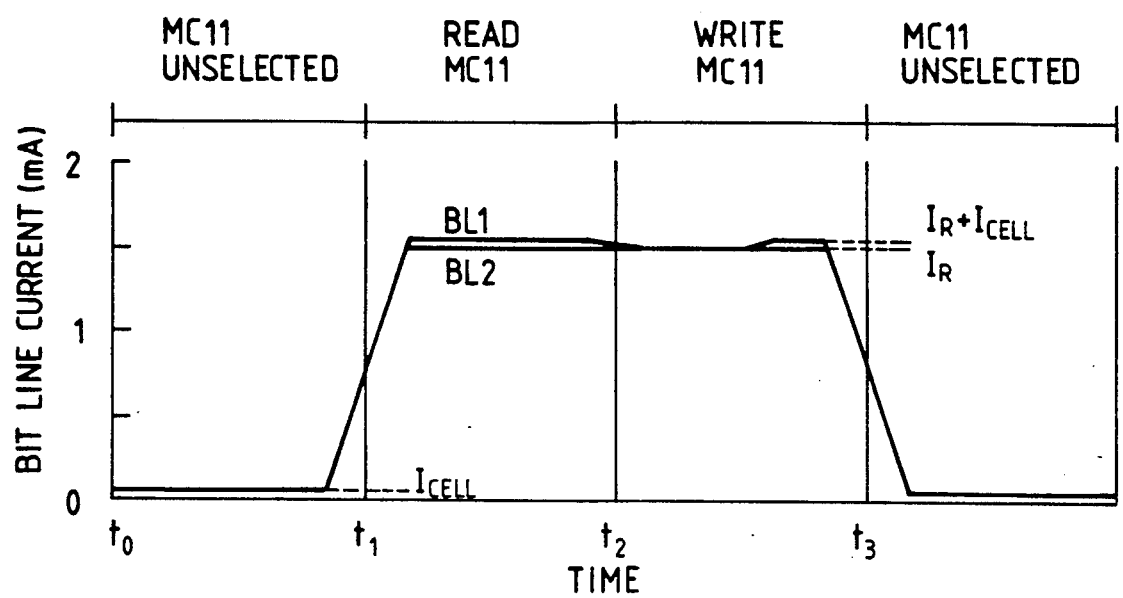
Figure 19D:
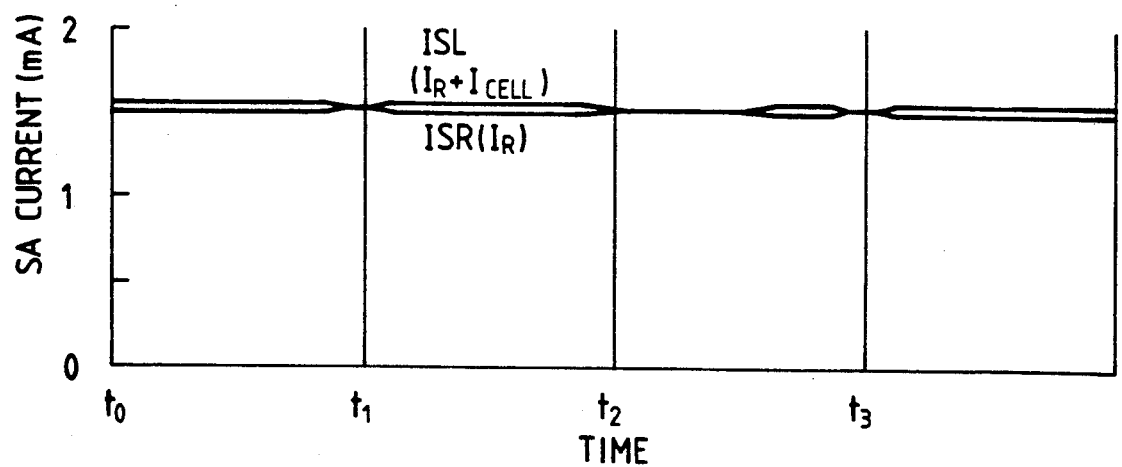
Figure 19E:
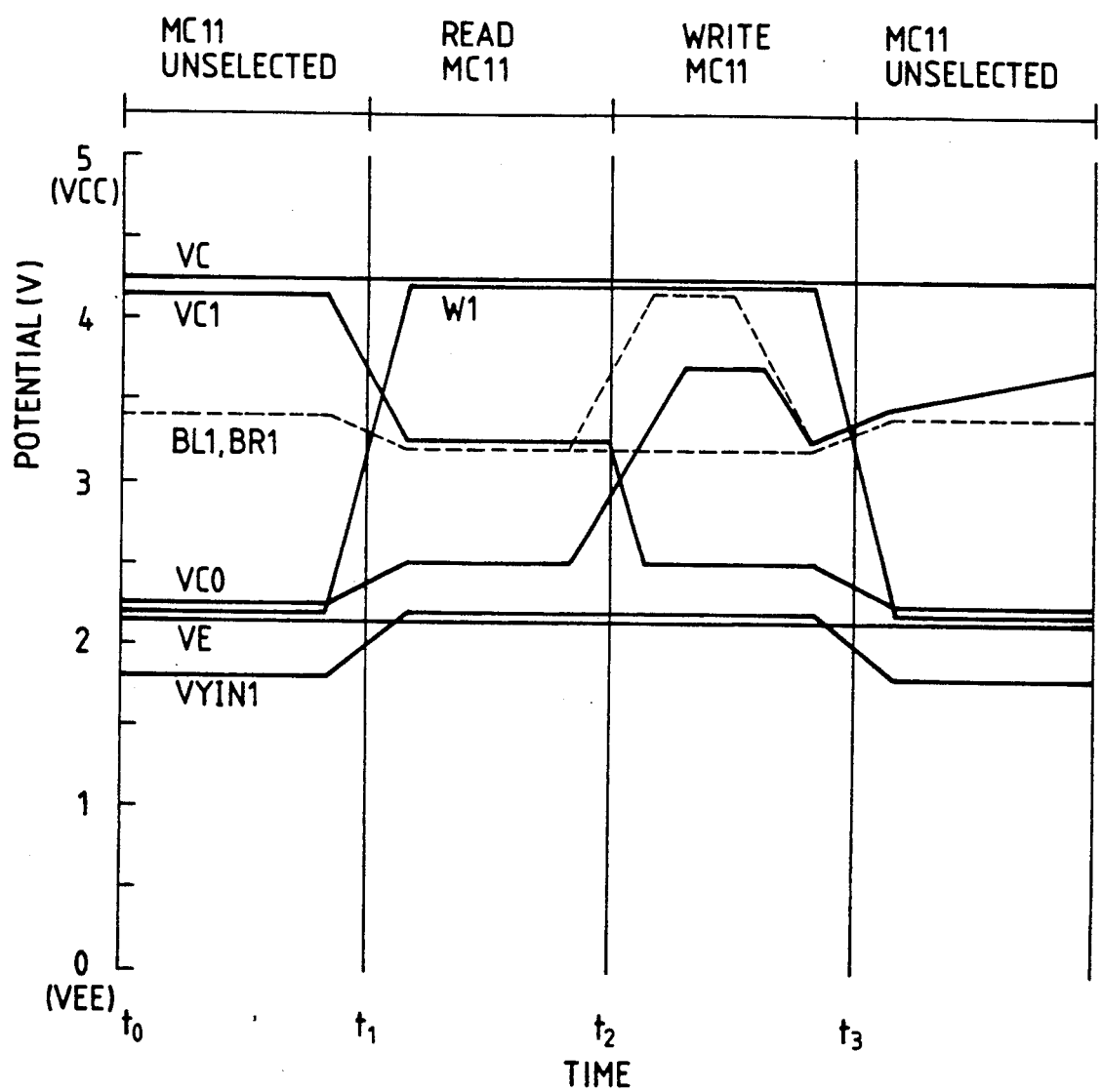
Figure 19F:
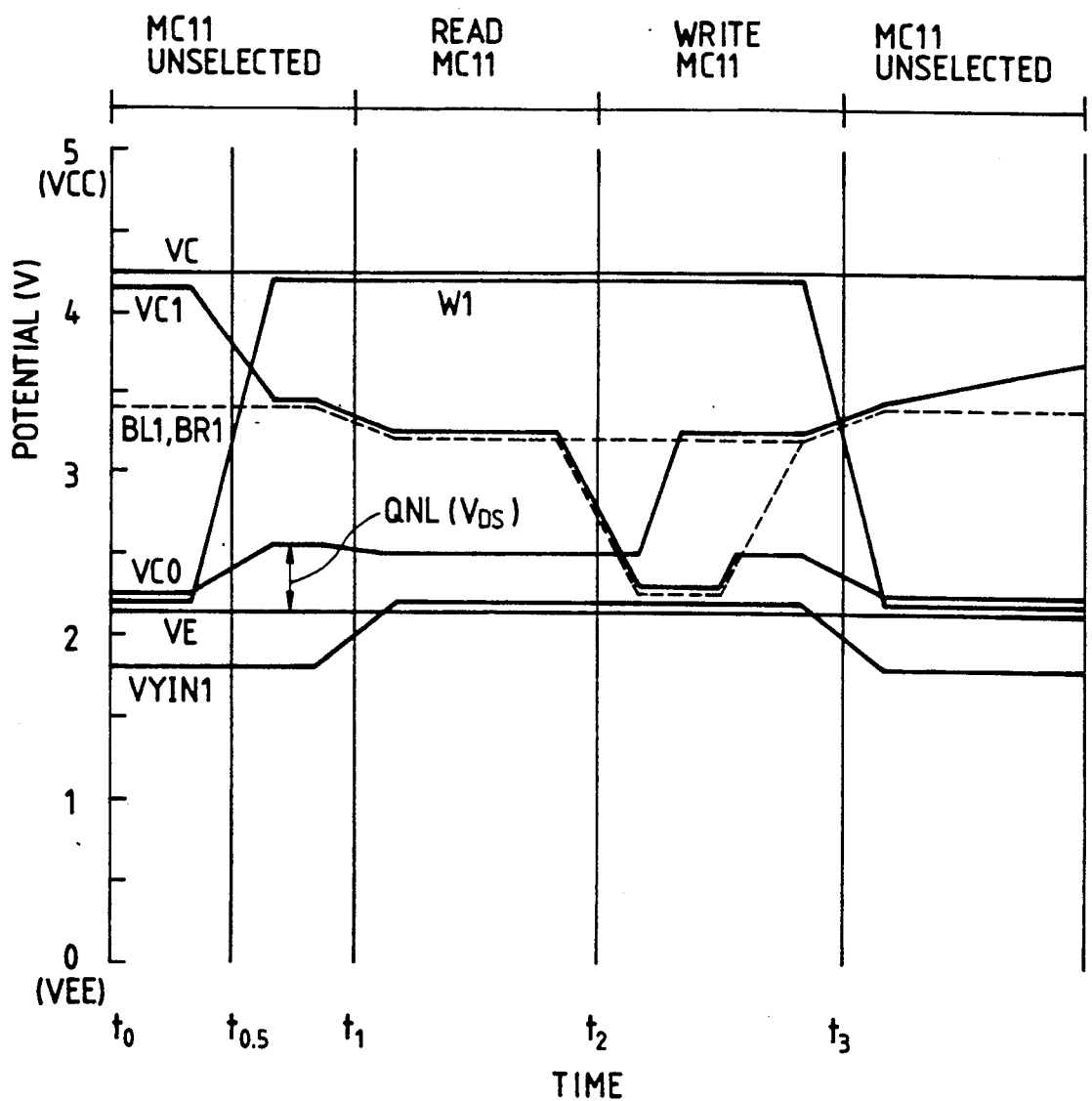

FIG. 19(a) is a circuit diagram showing the memory cells and peripheral circuits of the semiconductor memory; FIG. 19(b) is a waveform chart illustrating the potentials of the individual portions; FIG. 19(c) is a waveform chart illustrating the currents to flow through the BIT lines; FIG. 19(d) is a waveform chart showing the currents to flow through the sense amplifier; FIGS. 19(e) and 19(f) are waveform charts illustrating other examples of the potentials of the individual portions. In this embodiment, like that of FIG. 16 (a), the memory cells (MC11 to MC22) are composed of the insulated gate type transistors suited for the high integration, and BIT line drivers (BD1 and BD2) are composed of bipolar transistors suited for the high speed. The embodiment of FIG. 19(a) is different from that of FIG. 16(a) in the following two points. The first point resides in that the voltage $V_{cell}$ to be applied to the memory cell is set at $V_{cell}=5$ V (= the power-supply voltage) in the embodiment of FIG. 16 (a) whereas $V_{cell}=VC-VE=2$ V (< the power supply voltage) in the embodiment of FIG. 19(a) according to the present invention. Incidentally, the present invention can set the voltage $V_{cell}$ such that $V_{cell}</=4$ V$-I$ $V_T$I, as has been described hereinbefore. Although the following description is exemplified by $V_{cell}=2$ V, similar discussions can hold in case the voltage $V_{cell}$ is different from 2 V. On the other hand, the read/write control signals VRL and VRR of the selected BIT lines for the information reading operation are frequently designed at values substantially between VC and VE, and the operations of the cells are absolutely similar so long as the relations between the voltages VRL and VRR and the potentials VC and VE are unchanged. In the following description, therefore, the voltages VRL and VRR for the information reading are set at 4 V like the embodiment of FIG. 16(a), and VC=4.2 V and VE=2.2 V so that the potential (e.g., 3.2 V for VRL and VRR=4 V) of the selected BIT lines may be intermediate between the values of the voltages VC and VE. Now, if the voltage (VE) of the sources of the transistors QNL and QNR is raised from 0 V of FIG. 16(a) to 2.2 V of FIG. 19(a), the voltage amplitude of the BIT lines for the information writing operation can be reduced to shorten the discharge time of the BIT lines for the writing operation. Before this shortening is explained, the information reading operation of FIG. 19(a) will be described with reference to FIGS. 19(b) and 19(c). When the information is to be read out by selecting the memory cell MC, as shown in FIG. 19(a), the word line W1 is driven to a high potential (e.g., 4.2 V in the present embodiment), as indicated at times $t_1$ to $t_2$ in FIG. 19(b), so as to turn on the transistors QTL and QTR. In order to turn off the transistors QYL and QYR, moreover, the BIT line selection signal VYIN1 is driven to the high potential (e.g., 2.2 V) at the selection level so that a current IY is fed to a resistor RY to drop the base potentials of the transistors QYL and QYR to the low potential (e.g., 2.8 V). Moreover, the read/write control signals VRL and VRR are driven to 4 V to set the BIT lines BL1 and BR1 at the potential of 3.2 V. Now, if the transistor QNL in the cell MC11 is ON, the cell current $I_{cell}$ flows from the sense amplifier SA through the transistors QRL, QTL and QNL to the VE. In the BIT lines BL2 and BR2 unselected, on the other hand, the BIT line selection signal VYIN2 is at the unselected level of 1.8 V so that no current flows to the resistor RY in the BIT line driver BD2 to raise the base potentials of the transistors QYL and QYR to the high level (e.g., 4.2 V). Since this potential is higher by 0.2 than the VRL and VRR (i.e., 4 V), the cell current $I_{cell}$ flowing through the cell MC12 will flow not out of the sense amplifier SA but to VE through the transistor QYL or QYL in the driver BD2, the transistor QTL or QTR in the cell MC12, or QNL or QNR. As a result, what flows through the sense amplifier SA is the cell current $I_{cell}$ of the cell MC11. Specifically, the current component $I_{cell}$ of the ISL, as indicated at times $t_1$ to $t_2$ in FIG. 19(d), is that of the memory cell MC11 and is detected by the sense amplifier SA to read out the information of the memory cell MC11.

Figure 16A:
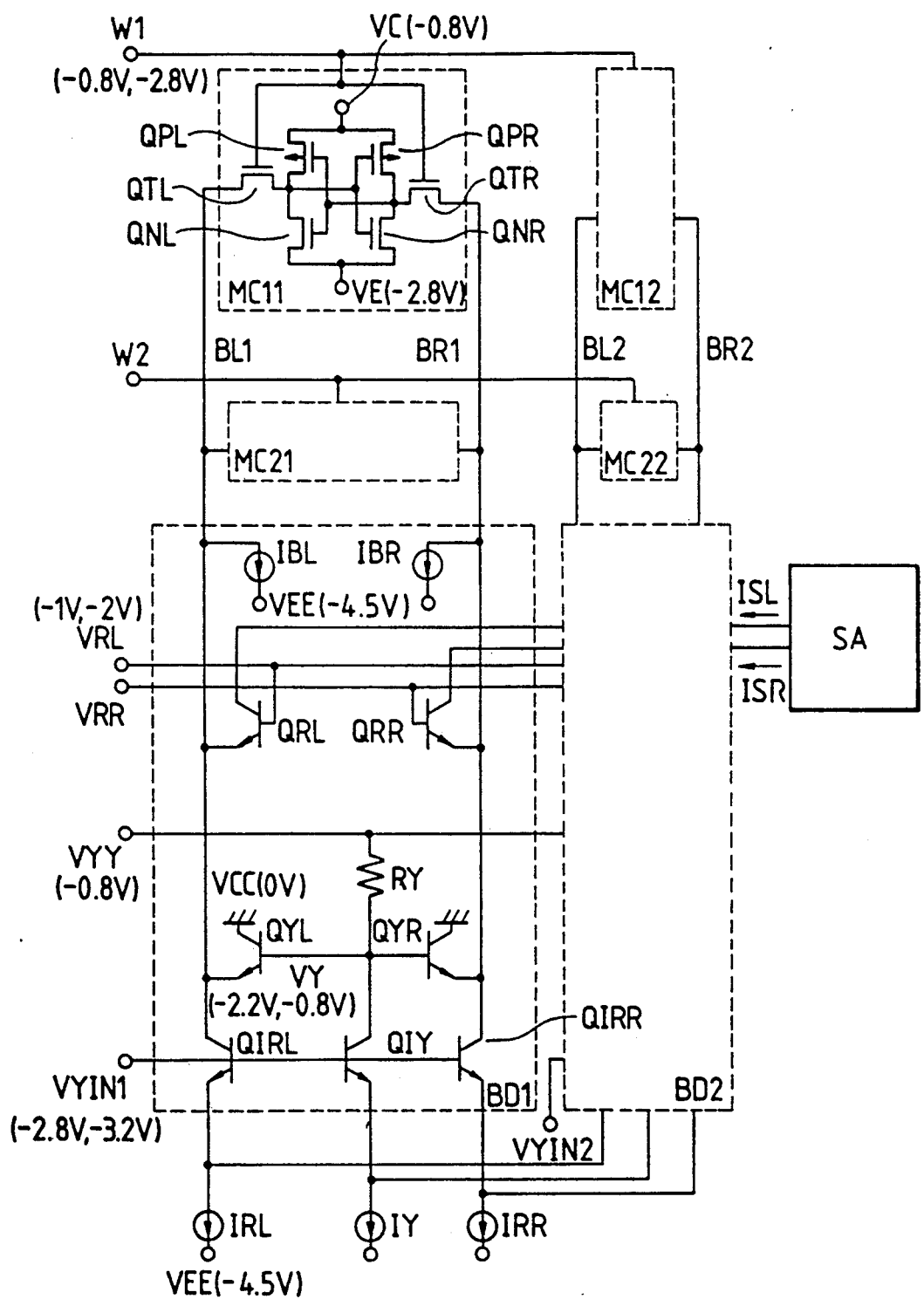
FIGS. 16(a) and (b) are a diagram and a timing chart showing an embodiment of the present invention.

Next, if the source voltages (VE) of the transistors QNL and QNR in the cell are raised to 2.2 V, the voltage amplitude of the BIT lines for the information writing operation can be reduced to shorten the discharge time period of the BIT lines for the information writing operation, as will be explained in the following. With reference to FIG. 19(a), let the case be considered in which the information is to be rewritten when the transistor QNL in the cell MC11 is ON. In the example of FIG. 16(a), as has been described hereinbefore, in order that the transistor QNL may have its gate-source voltage dropped to 0 V and may be switched from ON to OFF thereby to invert the cell information, the read/write control signal VRR has to be driven from 4 V to 0.8 V to drive the BIT lines BR1 from 3.2 V to 0.8 V to drop the gate voltage of the transistor QNL to 0 V. In FIG. 19(a), however, the source voltage (VE) of the transistor QNL is at 2.2 V. In order to set the gate-source voltage of the transistor QNL to 0 V, therefore, the signal VRR is driven from 4 V to 3.0 V, and the BIT line BR1 is driven from 3.2 V to 2.2 V, as indicated at times of $t_2$ to $t_3$ in FIG. 19(b), to set the gate voltage of the transistor QNL to 2.2 V. Since, at this time, the transistor QNL has its gate-source voltage dropped to 0 V and is switched from ON to OFF, the transistors QNL and QNR have their drain voltages VC0 and VC1, i.e., the cell informations inverted. In other words, as shown in FIG. 19(a), the voltage amplitudes of the BIT lines for the information writing operation can be reduced from 3.2 (=3.2−0) V of FIG. 16(a) to 1.0 (=3.2−2.2) V so that the discharge time period of the BIT lines for the writing operation can be shortened by about 31% (=1.0/3.2).

Next, the second difference of FIG. 19(a) from FIG. 16(a) resides in that a larger current than that of the unselected BIT lines is fed to the selected BIT lines in the embodiment of FIG. 19(a) like FIG. 18(a). In FIG. 19(a), more specifically, there are provided current sources IRL and IRR and bipolar transistors QIRL and QIRR. When the BIT line selection signal VYIN1 is at the high potential (i.e., 2.2 V) of the selection level, the aforementioned transistors QIRL and QIRR are turned on to feed the currents IRL and IRR only to the selected BIT lines. Thus, as has been described hereinbefore, the discharge time period of the BIT lines when the cell information is read out by switching the selected BIT lines and when the information is written can be shortened with little increase in electric power consumption. This will be described in the following. First of all, let the case be considered, in which the selected BIT lines are switched from BL2 and BR2 to BL1 and BR1 to read out the information of the cell MC11, as shown in FIG. 19(a). At this time, the waveforms of the current to flow through the BIT lines BL1 and BR1 are illustrated in FIG. 19(c), and the waveforms of the currents ISL and ISR to flow through the sense amplifier SA are illustrated in FIG. 19(d). At first, the currents to flow through the BIT lines BL1 and BR1 are $I_{cell}$ and 0, respectively, when unselected (for the time period $t_0$ to $t_1$) (The present embodiments assumes that the threshold voltage $V_T$ of the transistors QNL and QNR is at 0.5 V and that the cell current $I_{cell}$=0.05 mA from FIG. 18).

Next, when in the information reading operation of the memory cell MC11 (for the time period $t_1$ to $t_2$), the selected paired BIT lines are fed with the current $I_R$ (=IRL=IRR=1.5 mA), and the currents to flow through the BIT lines BL1 and BR1 are increased to $I_R+I_{cell}$ (1.55 mA) and $I_R$ (1.5 mA). This makes it possible to shorten the discharge time period of the parasitic capacity of the selected BIT lines BL1 and BR1. Moreover, the current $I_R$ is fed only to the selected paired BIT lines so that the power consumption is hardly increased. Next, let the case be considered in which the information is written in the memory cell MC11. At this time, the waveforms of the currents to flow through the BIT lines BL1 and BR1 are illustrated at the times $t_2$ to $t_2$ in FIG. 19(c). In this case, too, the currents to flow through the selected BIT lines BL1 and BR1 are substantially equal to $I_R$ (1.5 mA) and larger than those of the prior art so that the discharge time period of the BIT line can apparently be shortened.

Incidentally, in the description thus far made, the BIT line BR1 is driven from 3.2 V to 2.2 V, and the transistor QNL is switched from ON to OFF to invert the cell information in case the information is to be rewritten when the transistor QNL in the cell MC11 is ON. In case, however, the information is to be written when the transistor QNL in the cell MC11 is ON, the signal VRL is driven from 4 V to 5 V, and the BIT line BL1 may be driven from 3.2 V to 4.2 V, as shown in FIG. 19(e), to switch the transistor QNR from OFF to ON thereby to invert the cell information. For the lower $V_{cell}$, in this case, the voltage amplitude of the BIT lines when in the information writing operations could not be reduced. Since, however, the transistor QRL for driving the BIT line BL1 is a bipolar transistor, the BIT line can be charged at a sufficiently high speed. If, on the other hand, a larger current than that of the unselected BIT lines is fed to the selected BIT lines, it is possible to shorten the discharge time period of the BIT lines after the writing operation and accordingly the write recovery time period.

FIG. 19(f) is a waveform chart showing the potentials of the individual portions in case a period ($t_{05}$ to $t_1$) for which only the word lines are selected is in the period ($t_o$ to $t_1$) for which the memory cell MC11 is unselected. FIG. 19(f) will be described hereinafter.

Figure 20A:
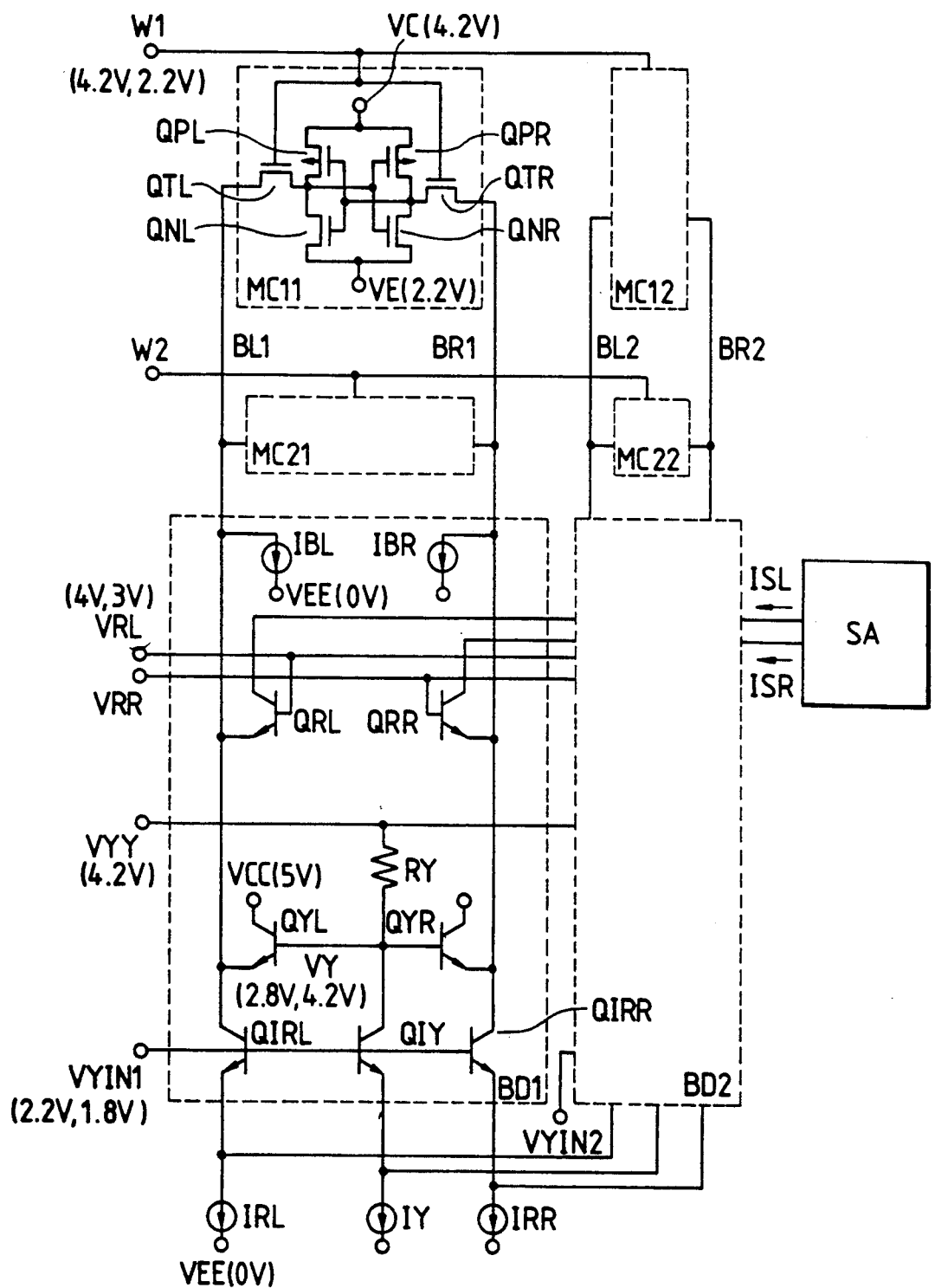
Figure 20B:
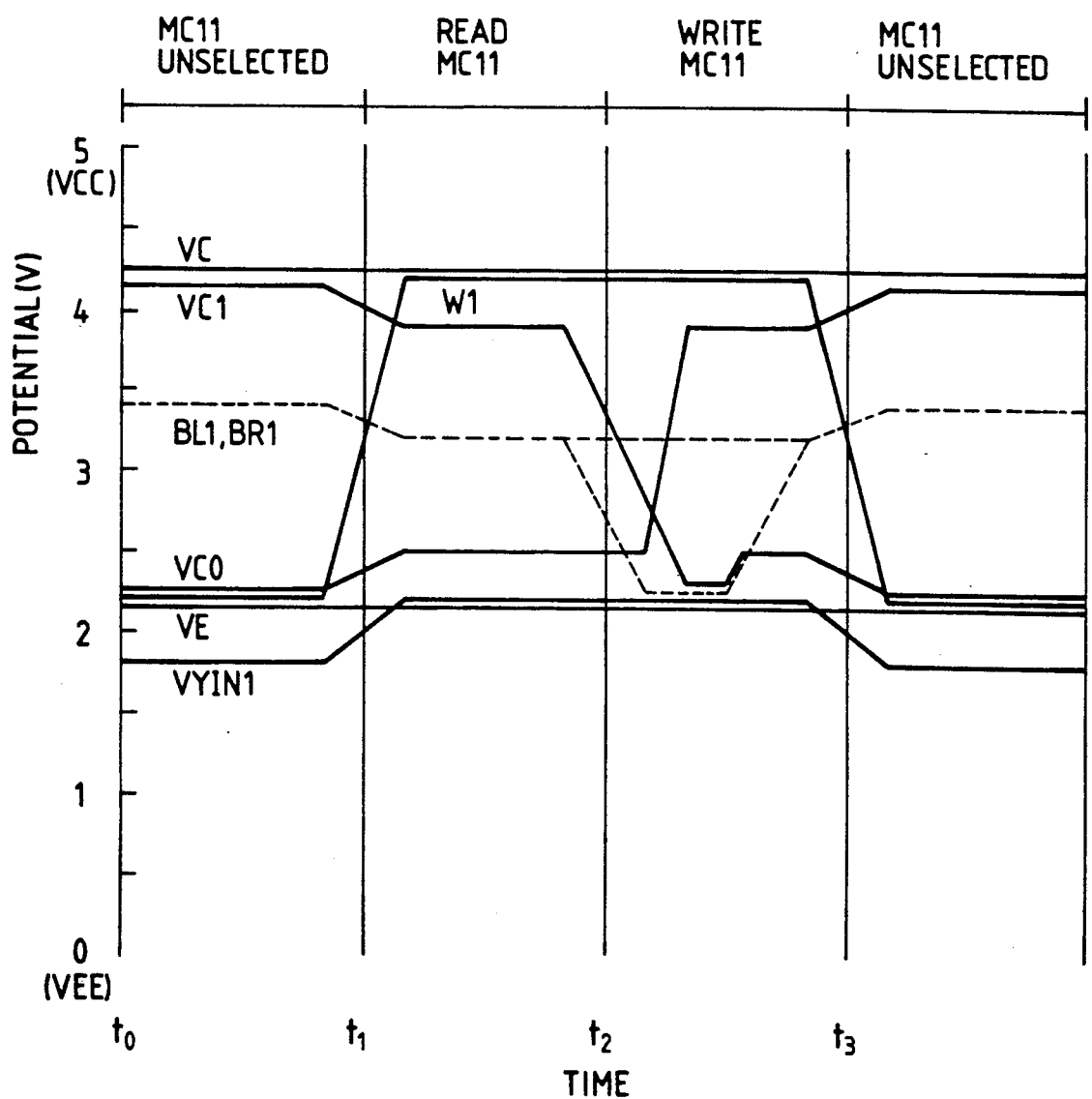
Figure 20C:
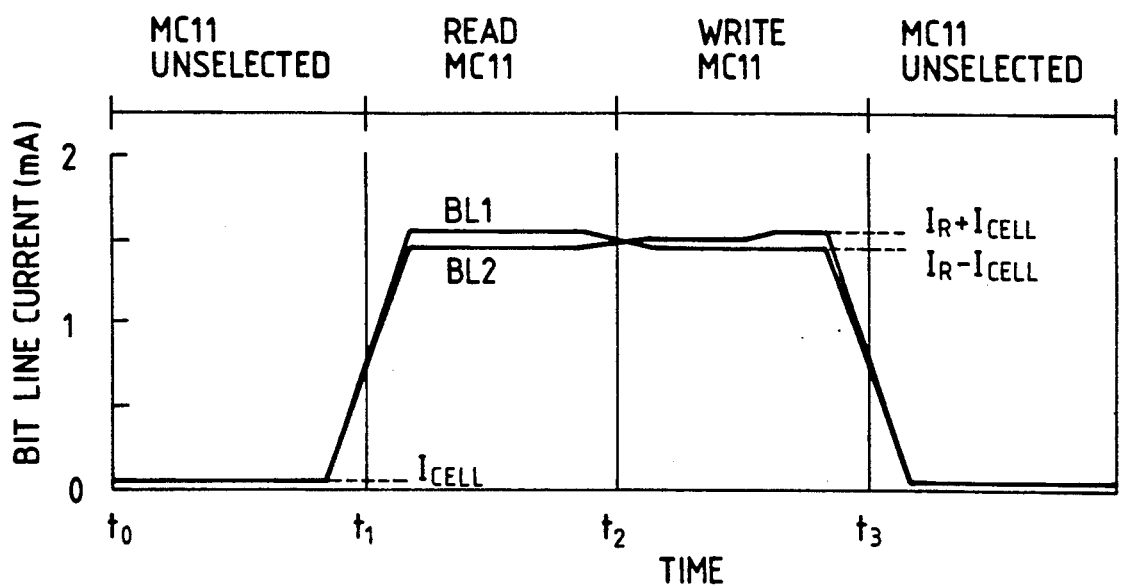
Figure 20D:
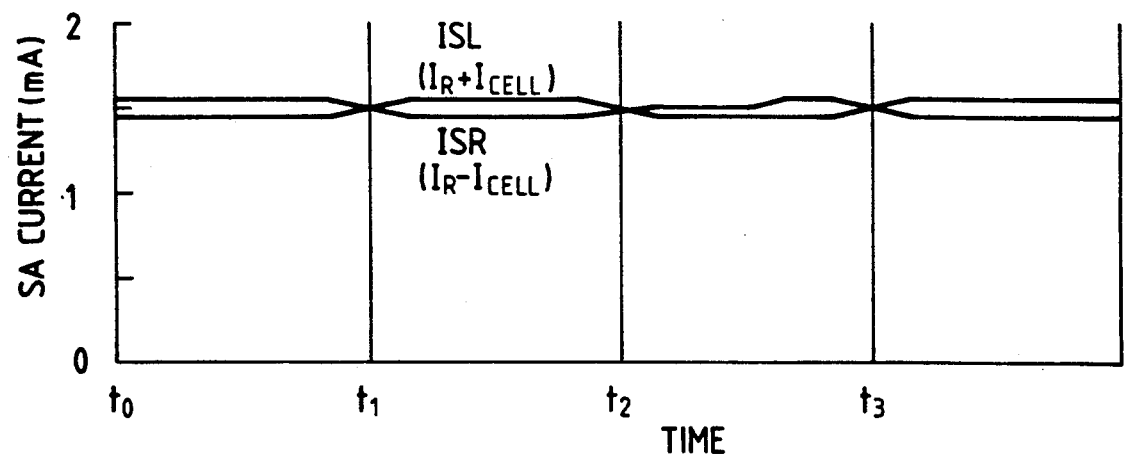

FIG. 20(a) is a circuit diagram showing the memory cells and peripheral circuits of the semiconductor memory of another embodiment of the present invention; FIG. 20(b) is a waveform chart showing the potentials of the individual portions; FIG. 20(c) is a waveform chart showing the currents to flow through the BIT lines; and FIG. 20(d) is a waveform chart showing the currents to flow through the sense amplifier. In the embodiment, like that of FIG. 19(a), a larger current is fed to the selected BIT lines than that to the unselected BIT lines so that the discharge time period of the BIT lines can be shortened. Moreover, according to the present invention, the constant voltage (VE) to be applied to the sources of the transistors QNL and QNR in the cell is raised from 0 V to 2.2 V so that the discharge time period of the BIT lines for the writing operation can be shortened. Now, the difference between this embodiment of FIG. 20(a) and the foregoing embodiment of FIG. 19(a) resides in that the loads to be connected with the drains of the transistors QNL and QNR in the memory cell are the resistors RL and RR in the embodiment of FIG. 19(a) whereas the aforementioned loads are PMOS transistors in FIG. 20(a). The reason why the loads are exemplified by the PMOS transistors in FIG. 20(a) is that the memory cells cannot be driven in a high speed cycle in FIG. 19(a), as will be explained in the following. When the memory cell MC11 is selected to read out the information in FIG. 19(a), as has been described hereinbefore, the word line W1 is driven to a high potential (4.2 V) to turn on the transistors QTL and QTR. If, at this time, the transistor QNL in the cell MC11 is ON, its drain voltage VC0 is at about 2.45 V, as indicated at times $t_1$ to $t_2$ in FIG. 19(b), because the ratio between the ON resistances of the transistors QNL and QNR is designed at about 1:3. Since, on the other hand, the transistor QNR is OFF when the transistor QNL is ON, the drain voltage VC1 of the transistor QNR is dropped to a value as low as the potential (3.2 V) of the BIT line BR1. Here, if the BIT line BR1 is dropped to 2.2 V and then raised again to 3.2 V after the information is written in the cell MC11, as indicated at times $t_2$ to $t_3$ in FIG. 19(b), the drain voltages VC0 and VC1 are interchanged but their values 3.2 V and 2.45 V are not varied. Here will be considered the case in which the memory cell MC11 is unselected again, as indicated at and after the time $t_3$ in FIG. 19(b). In order to unselect the cell MC11 again, the word line W1 is driven to the low potential (2.2 V), and the transistors QTL and QTR are turned off. At this time, the information is rewritten, the transistor QNR in the cell MC11 is ON so that the drain voltage VC1 of the transistor QNR is instantly changed to 2.2 V. On the contrary, the drain voltage VC0 of the transistor QNL is changed to 4.2 V, but the time period for this change is determined to 14 $\mu$s ($=14$ fF $\times$ 1 G$\Omega$) by the time constant of the parasitic capacity (the gate capacity of the QNR + the drain capacity of the QNL and the source capacity of the QTL $</=4$ fF + 5 fF + 5 fF = 14 fF) of the node, with which the drain of the transistor QNL is connected, and the resistor RL ($</=1$ G$\Omega$). In order to operate the memory cells stably, it is usually necessary to accomplish the next switching after the voltage VC0 takes 4.2 V. This makes it impossible to make the drive cycle time period of the present memory cell smaller than 14 $\mu$s. This time period is far longer than the access time (e.g., several nsec. to several tens nsec.) of the ordinary semiconductor memory so that the cycle time period of the memory cannot be shortened even if the access time period is short.

In FIG. 29(a), on the contrary, it is assumed that the transistor QNL in the cell MC11 is ON when the memory cell MC11 is selected, as indicated at the times $t_1$ to $t_2$ in FIG. 20(b). Then, the drain voltage VC0 of the transistor QNL is at about 2.45 V like before, but the transistor QPR is ON when the transistor QNL is ON. Since the ratio of the ON resistances of the transistors QPR and QTR is designed at about 1:3, the drain voltage VC1 of the transistor QNR is hardly dropped but remains at about 3.95 V. Like before, moreover, the information is written in the memory MC11 (at the times $t_2$ to $t_3$), and the memory MC11 is unselected (at and after the time $t_3$). At this time, the transistor QPL is ON and has an ON resistance of about 5 K$\Omega$ ($</=$k-$V_{cell}/I_{cell}</=0.25$ V $/0.05$ mA). As a result, the time period for the drain voltage of the transistor QNL to be changed to 4.2 V is at a sufficiently high speed, e.g., about 0.16 nsec. ($</=(14$ fF + the drain capacity of the QPL + the gate capacity of the QPR)$\times 5$ K$\Omega</=(14+7+10)\times 5$ K$\Omega$). Thus, not only the access time period but also the cycle time period can be shortened.

In the memory cells of FIG. 20(a), if the transistor QNL in the cell MC11 is ON when in the information reading operation of cell MC11, a cell current $I_{cell1}$ flows from the sense amplifier through the transistors QRL, QTL and QNL to the VE. Simultaneously with this, a cell current $I_{cell2}$ flows from the VC through the transistors QPR, QTR and IRR or IBR to the VEE. Thus, if the design is made to effect $I_{cell1} = I_{cell2} = I_{cell}$, the currents to flow through the BIT lines BL1 and BR1 take the waveforms shown in FIG. 20(c). When in the information reading operation (at the times of $t_1$ to $t_2$) and the information writing operation (at the times $t_2$ to $t_3$) of the cell MC11, more specifically, the currents ($I_R + I_{cell} = 1.55$ mA, $I_R - I_{cell} = 1.45$ mA) to flow through the BIT lines BL1 and BR1 are substantially equal to $I_R$ ($=1.5$ mA). Like the embodiment of FIG. 19(a)-(f), the discharge time period of the parasitic capacity of the BIT lines BL1 and BR1 can be shortened. Moreover, the currents ISL and ISR to flow through the sense amplifier SA take the waveforms shown in FIG. 20(d). Thus, the sense amplifier SA can read out the information by detecting the differences between the currents $ISL = I_R + I_{cell}$ and $ISR = I_R - I_{cell}$. In FIG. 5, moreover, the difference between these currents ISL and ISR is two times as large as that of the embodiment of FIG. 4 so that the strength against the noises can be increased.

In FIGS. 20(a)-(c), too, as has been described with reference to FIGS. 19(a)-(f), in case the information is to be rewritten when the transistor QNL in the cell MC11 is ON, the cell information may be inverted by driving the VRL from 4 V to 5 V and the BIT line BL1 from 3.2 V to 4.2 V and by switching the QNR from OFF to ON. This inversion is likewise applied to the following embodiments.

Figure 16B:
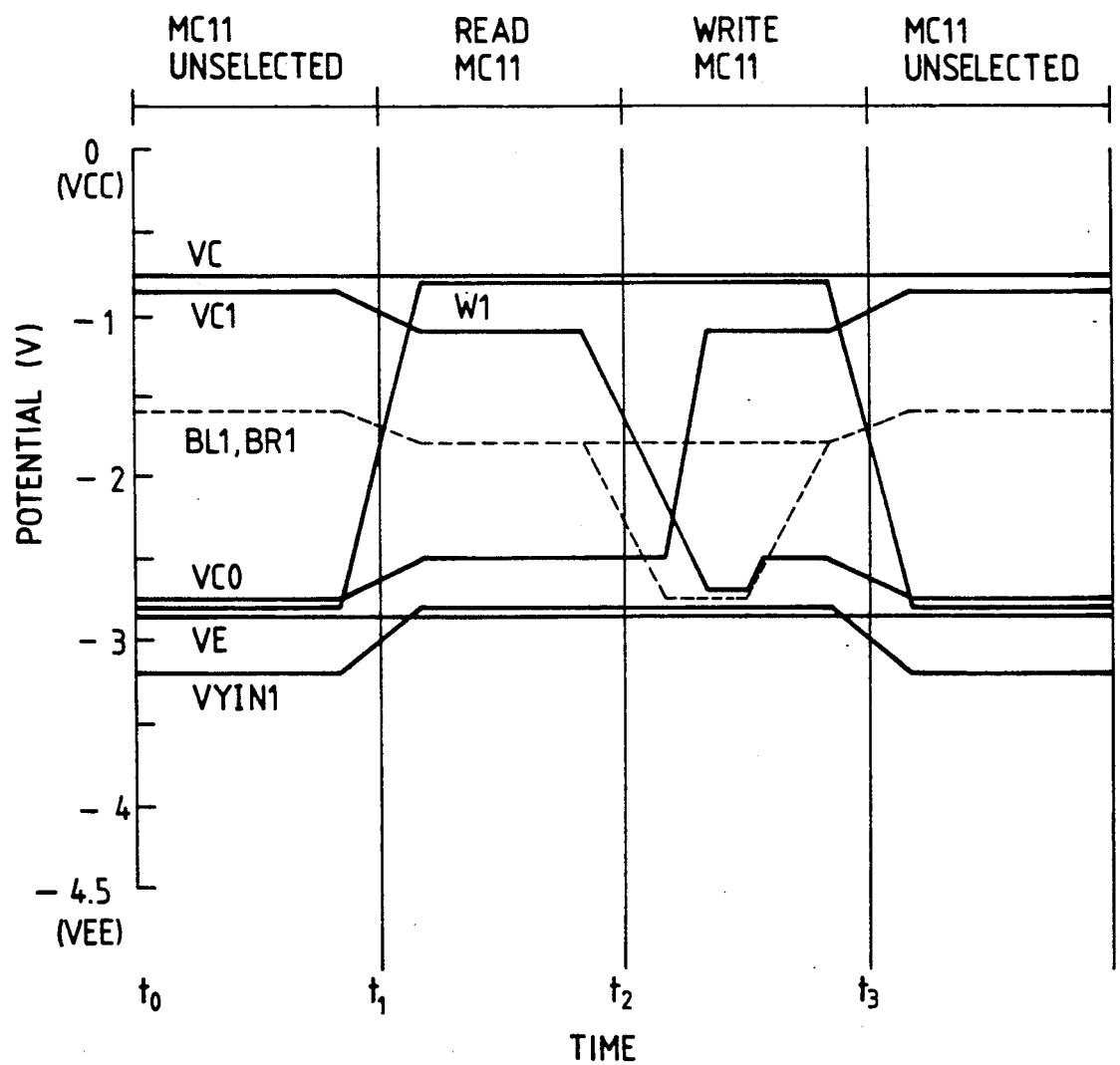
Figure 17:
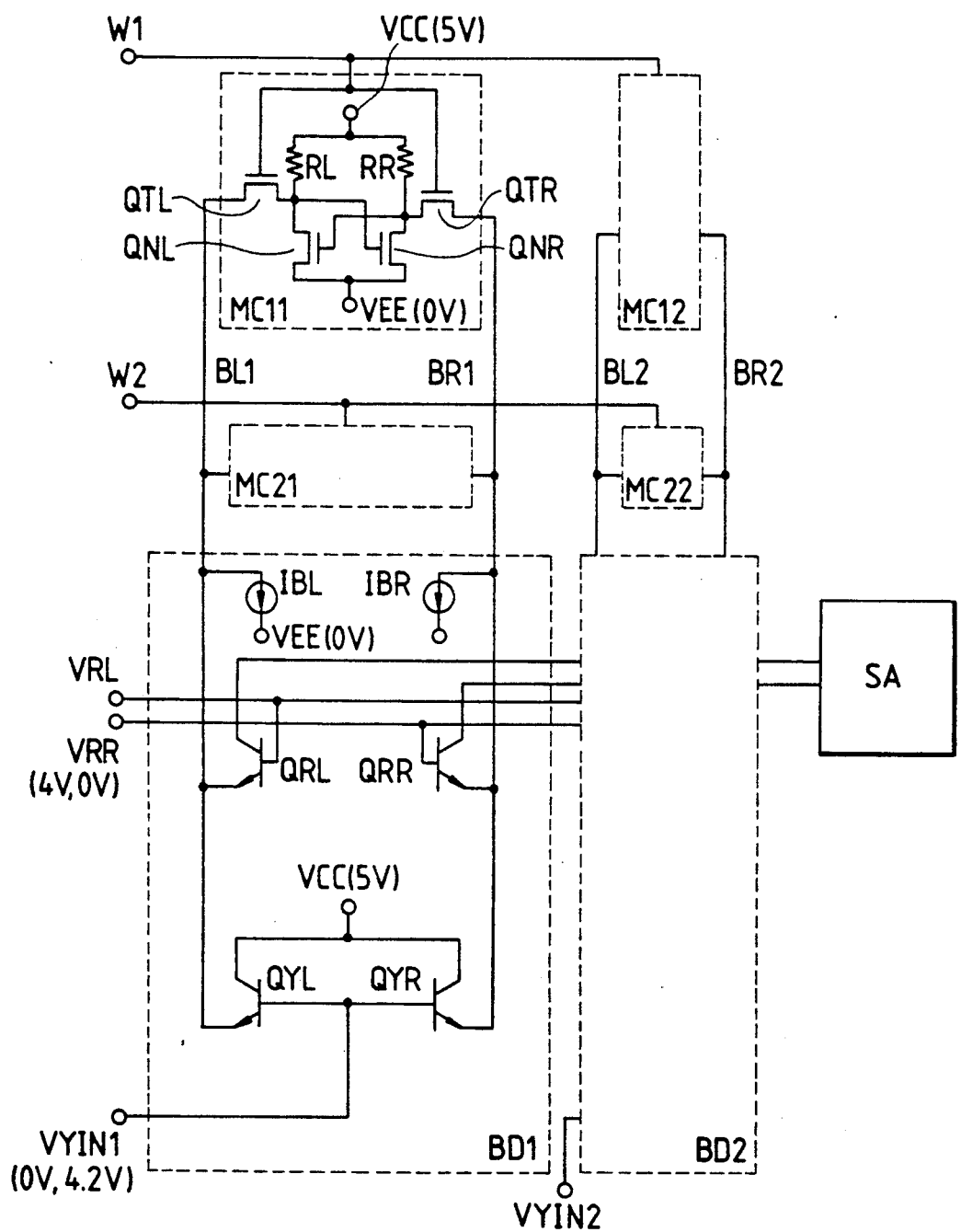
FIG. 17 is a circuit diagram showing the basic semiconductor memory.

FIG. 16(a) is a circuit diagram showing memory cells and peripheral circuits of a semiconductor memory; and FIG. 16(b) is a waveform chart showing the potentials of the individual portions. The difference of this embodiment from the aforementioned embodiment of FIG. 20(a)-(c) resides in that a power supply of $-4.5$ V (VCC = 0V, and VEE = $-4.5$ V) is used in FIG. 16(a) although the power supply of 5 V (VCC = 5 V, and VEE = 0 V) is used in FIG. 20(a). As a result, the voltage of the internal circuit is negative, as shown in FIG. 16(a). As shown in FIG. 16(b), however, the relations of the individual voltages are absolutely identical to those of FIG. 20(b), and the waveforms of the currents to flow through the BIT lines and the sense amplifier are absolutely identical to those of FIGS. 20(c) and 20(d). Therefore, the discussions described with reference to FIGS. 20(a)-(c) hold as they are in FIGS. 16(a) and (b). Since the constant voltage (VE) to be applied to the sources of the transistors QNL and QNR in the cell is set at a voltage of $-2.8$ V higher than the power-supply voltage ($-4.5$ V), the voltage amplitude of the BIT lines for the writing operations can be reduced to shorten the discharge time period. Since, moreover, a higher current is fed to the selected BIT lines than that for the unselected BIT lines, the discharge time period of the BIT lines for the information reading operations can be further shortened together with the discharge time period of the BIT lines for the information reading operations by switching the BIT lines. Since, moreover, the loads to be connected with the drains of the transistors QNL and QNR in the cell are exemplified by the PMOS transistors, the cycle time period can be shortened. Now, the reason why the power supply of $-4.5$ V is used in FIG. 16($a$) is that the voltage of $-4.5$ V is the main stream in the power-supply voltage of the recent high speed LSI. In other words, there is no need for providing any special power supply when the semiconductor memory of FIG. 16($a$) is installed in the system using the LSI.

Figure 21A:
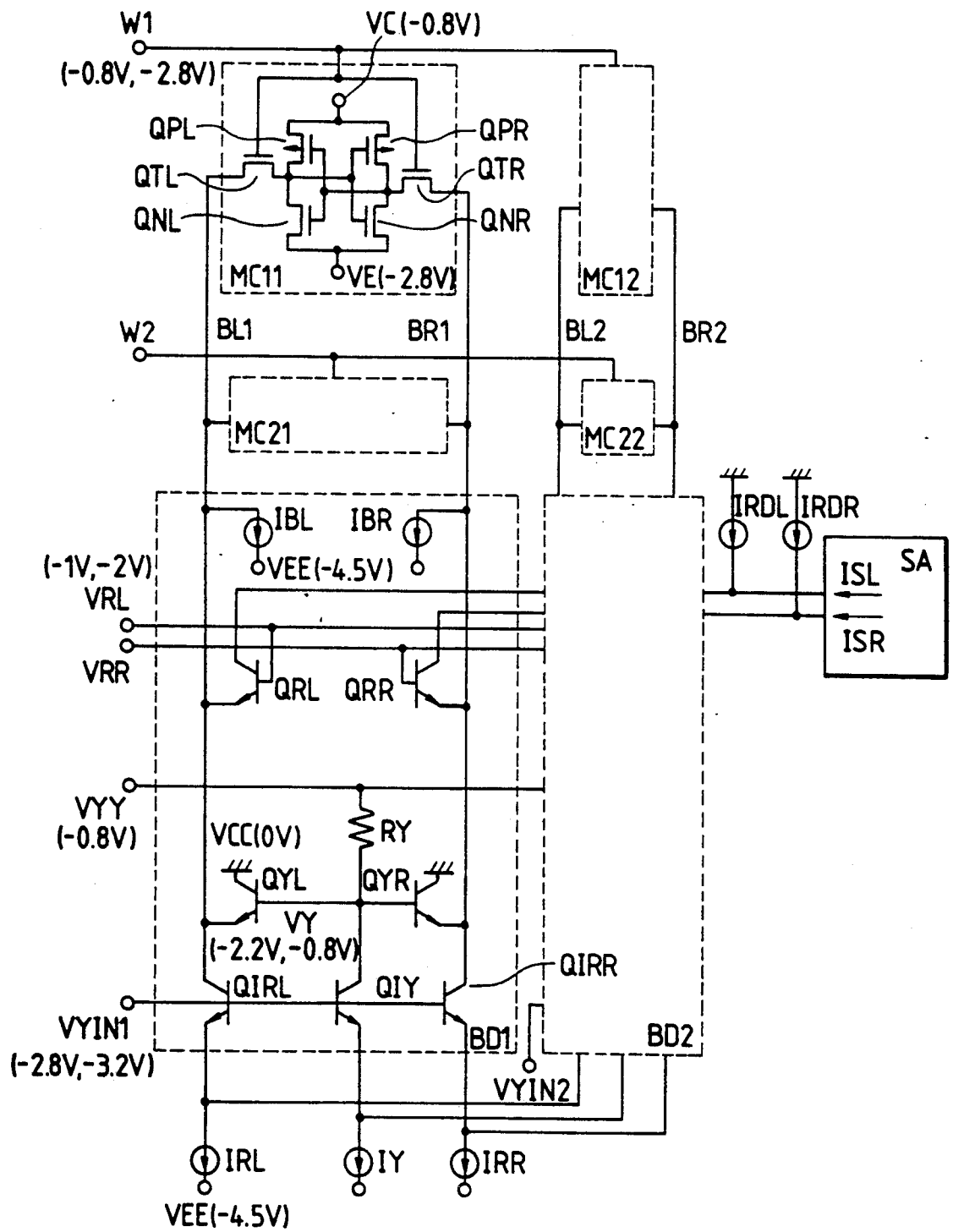
Figure 21B:
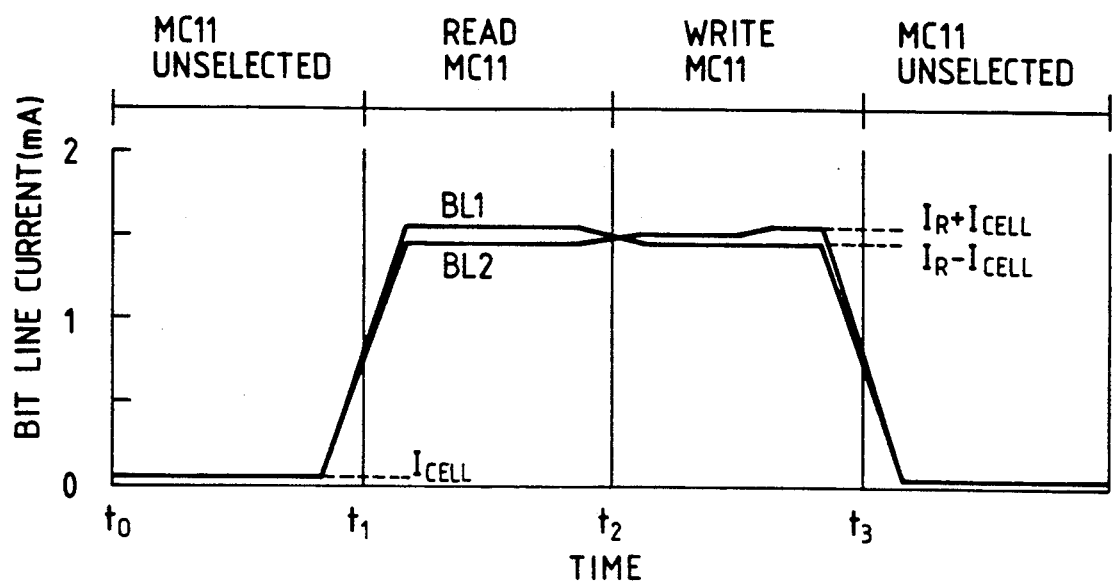
Figure 21C:
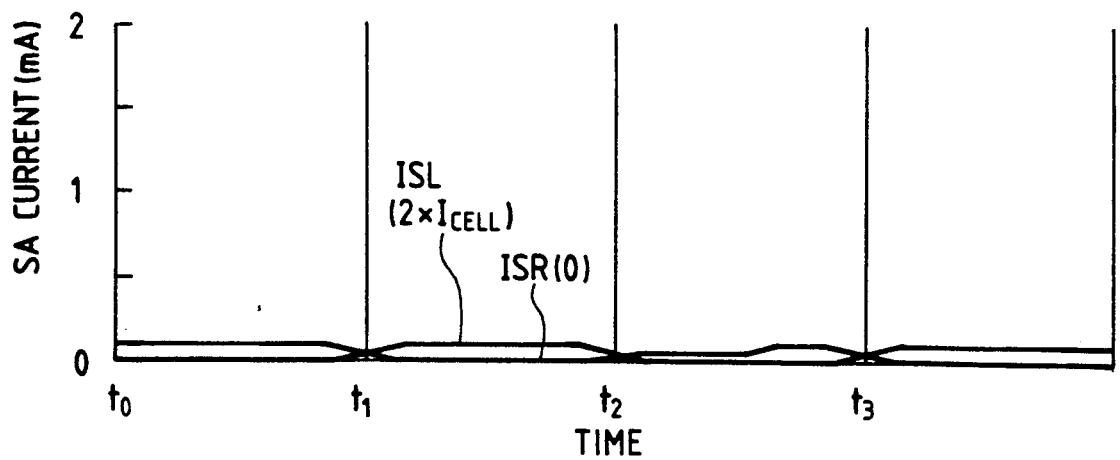

FIGS. 21($a$)-($c$) show another embodiment of the present invention; FIG. 21($a$) is a circuit diagram showing the memory cells and peripheral circuits of the semiconductor memory; FIG. 21($b$) is a waveform chart showing the currents to flow through the BIT lines; and FIG. 21($c$) is a waveform chart showing the currents to flow through the sense amplifier. The difference of this embodiment of FIGS. 21($a$)-($c$) from the foregoing embodiment of FIGS. 16($a$), ($b$) resides in that bipolar transistors QRL and QRR having their emitters connected with the BIT lines and their bases fed with the read/write control signals are made to have their collectors equipped with current sources IRDL and IRDR for feeding currents of magnitudes substantially equal to the current $I_R$ of the current sources IRL and IRR. However, the potential waveforms of the individual portions are absolutely identical to those of FIG. 16($b$), and the current waveforms to flow through the BIT lines are also absolutely identical to those of the circuit of FIG. 16($a$), as shown in FIG. 21($b$). Therefore, the aforementioned discussions hold as they are, too, in FIGS. 21($a$)-($c$). Now, the reason why the current sources IRDL and IRDR are provided will be described in the following. Now, in FIG. 16($a$), if the transistor QNL in the cell MC11 is ON, the currents ISL and ISR to flow from the transistor QRL to the sense amplifier SA and from the transistor QRR to the sense amplifier SA when in the information reading operation of the memory cell MC11 are $I_R + I_{cell}$ and $I_R - I_{cell}$, respectively. Therefore, the sense amplifier SA has to detect the difference between those currents that is feared to become weak against the noises because of the small signal amplitude especially in case $I_R > > I_{cell}$. If, on the contrary, the design is made to satisfy IRDL=IRDR=$I_R - I_{cell}$ in FIG. 21($a$), the ISL takes a current of $2 \times I_{cell}'$ and the ISR takes a current of zero, as indicated at times of $t_1$ to $t_2$ in FIG. 21($c$). As a result, the sense amplifier SA may detect only whether or not the current of $2 \times I_{cell}$ flows, so that the aforementioned problems can be avoided.

Figure 22:
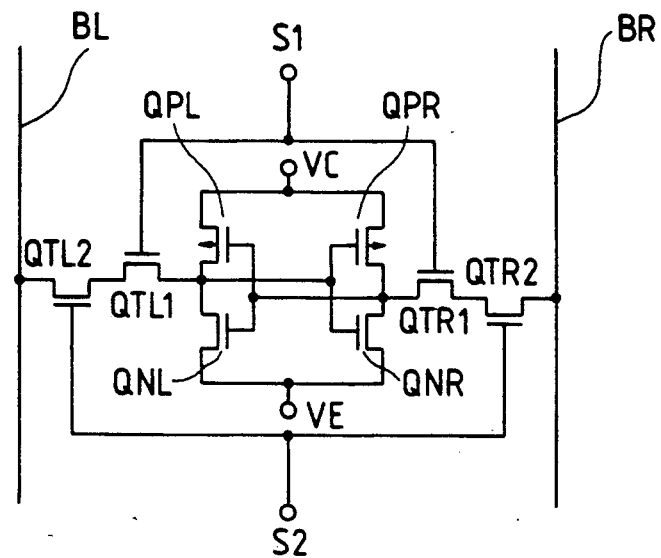
FIGS. 22 to 31 are circuit diagrams showing the memory cells according to embodiments of the present invention.

FIG. 22 is a circuit diagram showing a memory cell according to the present invention. The foregoing embodiments are limited in the reduction of the power consumption because the cell currents flow to all the cells connected with the selected word lines, as has been described hereinbefore. In FIG. 22, on the contrary, the cell currents are made to flow only when both the X-selection signal and the Y-selection signal to be fed to the memory cells are at the selection level, so that the power consumption can be reduced. In FIG. 22, more specifically, between the BIT line BL and the drain of the transistor QNL and between the BIT line BR and the drain of the transistor QNR, there are connected NMOS transistors QTL1 and QTR1, which have their gates fed with the X-selection signal S1, and NMOS transistors QTL2 and QTR2 which have their gates fed with the Y-selection signal S2. Only when the X-selection signal S1 is at the high potential of the selection level and when the Y-selection signal S2 is at the high potential of the selection level, respectively, the transistors QTL1 and QTR1 and the transistors QTL2 and QTR2 are turned on to form the current paths for the cell currents. Incidentally, it is apparent from FIG. 22 that the input positions of the X-selection signal and the Y-selection signal can be reversed.

Figure 23:
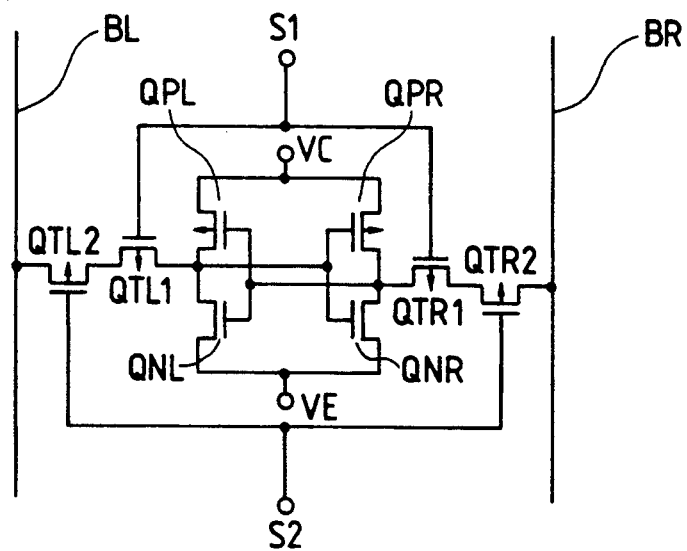

FIG. 23 is a circuit diagram showing a memory cell according to the present invention. In the embodiment of FIG. 23, like that of FIG. 22, the cell current is made to flow only when both the X-selection signal and Y-selection signal to be fed to the memory cell are at the selection level, so that the power consumption can be reduced. In FIG. 23, more specifically, between the BIT line BL and the drain of the transistor QNL and between the BIT line BR and the drain of the transistor QNR, there are connected PMOS transistors QTL1 and QTR1, which have their gates fed with the X-selection signal S1, and PMOS transistors QTL2 and QTR2 which have their gates fed with the Y-selection signal S2. The transistors QTL1 and QTR1 and the transistors QTL2 and QTR2 are turned on only when the X-selection signal S1 is dropped to the low potential of the selection level and when the Y-selection signal S2 is dropped to the low potential of the selection level, to form the current paths for the cell currents. Incidentally, it is apparent from FIG. 23 that the input positions of the X-selection signal and the Y-selection signal can be reversed.

Figure 24:
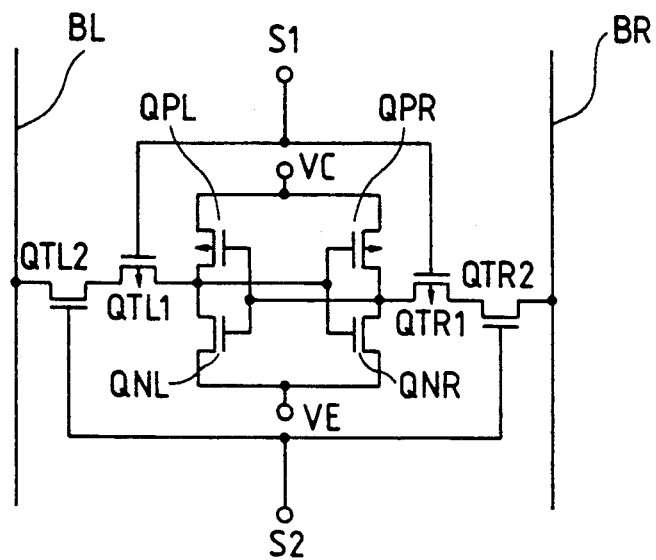

FIG. 24 is a circuit diagram showing a memory cell according to the present invention. In the embodiment of FIG. 24, like that of FIG. 22, the cell current is made to flow only when both the X-selection signal and Y-selection signal to be fed to the memory cell are at the selection level, so that the power consumption can be reduced. In FIG. 24, more specifically, between the BIT line BL and the drain of the transistor QNL and between the BIT line BR and the drain of the transistor QNR, there are connected PMOS transistors QTL1 and QTR1, which have their gates fed with the X-selection signal S1, and NMOS transistors QTL2 and QTR2 which have their gates fed with the Y-selection signal S2. The transistors QTL1 and QTR1 and the transistors QTL2 and QTR2 are turned on only when the X-selection signal S1 is dropped to the low potential of the selection level and when the Y-selection signal S2 is raised to the high potential of the selection level, to form the current paths for the cell currents. Incidentally, it is apparent from FIG. 24 that the input positions of the X-selection signal and the Y-selection signal can be reversed.

Figure 25:
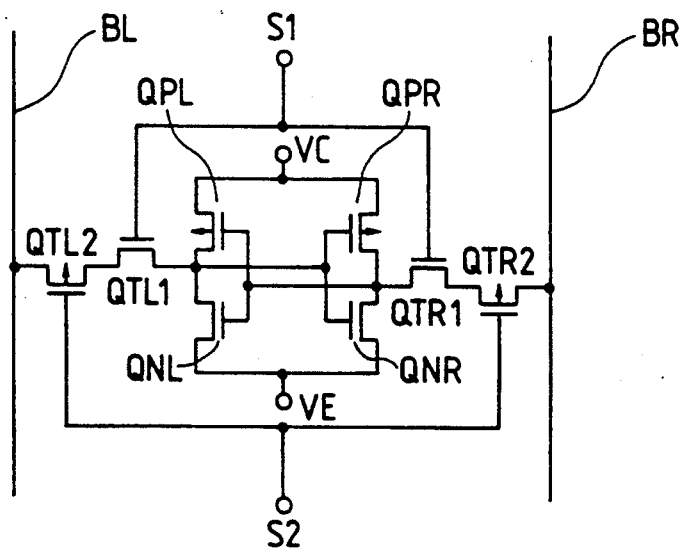

FIG. 25 is a circuit diagram showing a memory cell according to another embodiment of the present invention. In the embodiment of FIG. 25, like that of FIG. 22, the cell current is made to flow only when both the X-selection signal and Y-selection signal to be fed to the memory cell are at the selection level, so that the power consumption can be reduced. In FIG. 25, more specifically, between the BIT line BL and the drain of the transistor QNL and between the BIT line BR and the drain of the transistor QNR, there are connected NMOS transistors QTL1 and QTR1, which have their gates fed with the X-selection signal S1, and PMOS transistors QTL2 and QTR2 which have their gates fed with the Y-selection signal S2. The transistors QTL1 and QTR1 and the transistors QTL2 and QTR2 are turned on only when the X-selection signal S1 is raised to the high potential of the selection level and when the Y-selection signal S2 is dropped to the low potential of the selection level, to form the current paths for the cell currents. Incidentally, it is apparent from FIG. 25 that the input positions of the X-selection signal and the Y-selection signal can be reversed.

Figure 26:
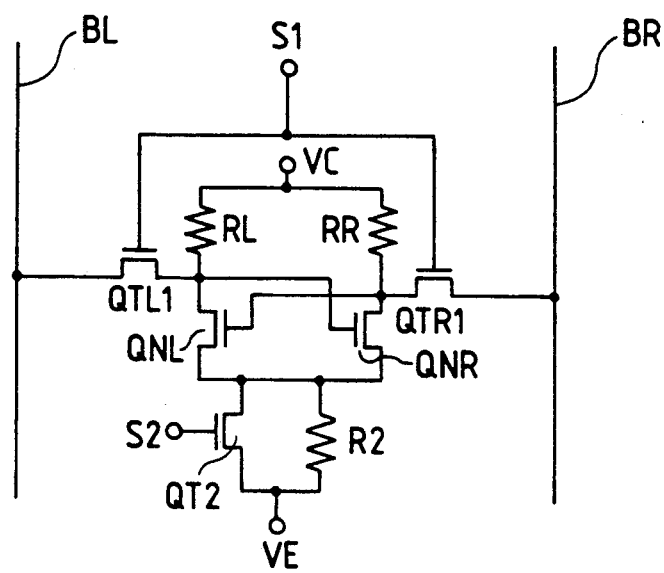

FIG. 26 is a circuit diagram showing a memory cell according to the present invention. In the embodiment of FIG. 26, like that of FIG. 22, the cell current is made to flow only when both the X-selection signal and Y-selection signal to be fed to the memory cell are at the selection level, so that the power consumption can be reduced. In FIG. 26, more specifically, between the BIT line BL and the drain of the transistor QNL and between the BIT line BR and the drain of the transistor QNR, there are connected NMOS transistors QTL1 and QTL1, which have their gates fed with the X-selection signal S1. Between the supply line of the constant voltage VE and the sources of the transistors QNL and QNR, there is connected an NMOS transistor QT2 which has its gate fed with the Y-selection signal S2. The transistors QTL1 and QTR1 and the transistor QT2 are turned on only when the X-selection signal S1 is raised to the high potential of the selection level and when the Y-selection signal S2 is dropped to the low potential of the selection level, to form the current paths for the cell currents. Incidentally, it is apparent from FIG. 26 that the input positions of the X-selection signal and the Y-selection signal can be reversed. Moreover, the resistor R2 connected in parallel with the transistor QT2 prevents from the sources of the transistors QNL and QNR from floating when the transistor Qt2 is turned off.

Figure 27:
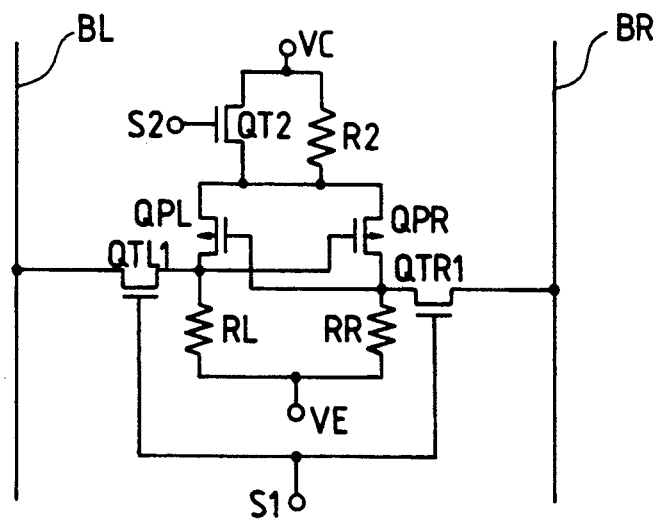

FIG. 27 is a circuit diagram showing a memory cell according to the present invention. In the embodiment of FIG. 27, like that of FIG. 22, the cell current is made to flow only when both the X-selection signal and Y-selection signal to be fed to the memory cell are at the selection level, so that the power consumption can be reduced. In FIG. 27, more specifically, between the BIT line BL and the drain of the transistor QPL and between the BIT line BR and the drain of the transistor QPR, there are connected NMOS transistors QTL1 and QTR1, which have their gates fed with the X-selection signal S1. Between the supply line of the constant voltage VC and the sources of the transistors QPL and QPR, there is connected an NMOS transistor QT2 which has its gate fed with the Y-selection signal S2. The transistors QTL1 and QTR1 and the transistor QT2 are turned on only when the X-selection signal S1 is raised to the high potential of the selection level and when the Y-selection signal S2 is dropped to the low potential of the selection level, to form the current paths for the cell currents. Incidentally, it is apparent from FIG. 27 that the input positions of the X-selection signal and the Y-selection signal can be reversed. Moreover, the resistor R2 connected in parallel with the transistor QT2 prevents the sources of the transistors QPL and QPR from floating when the transistor Qt2 is turned off.

Figure 28A:
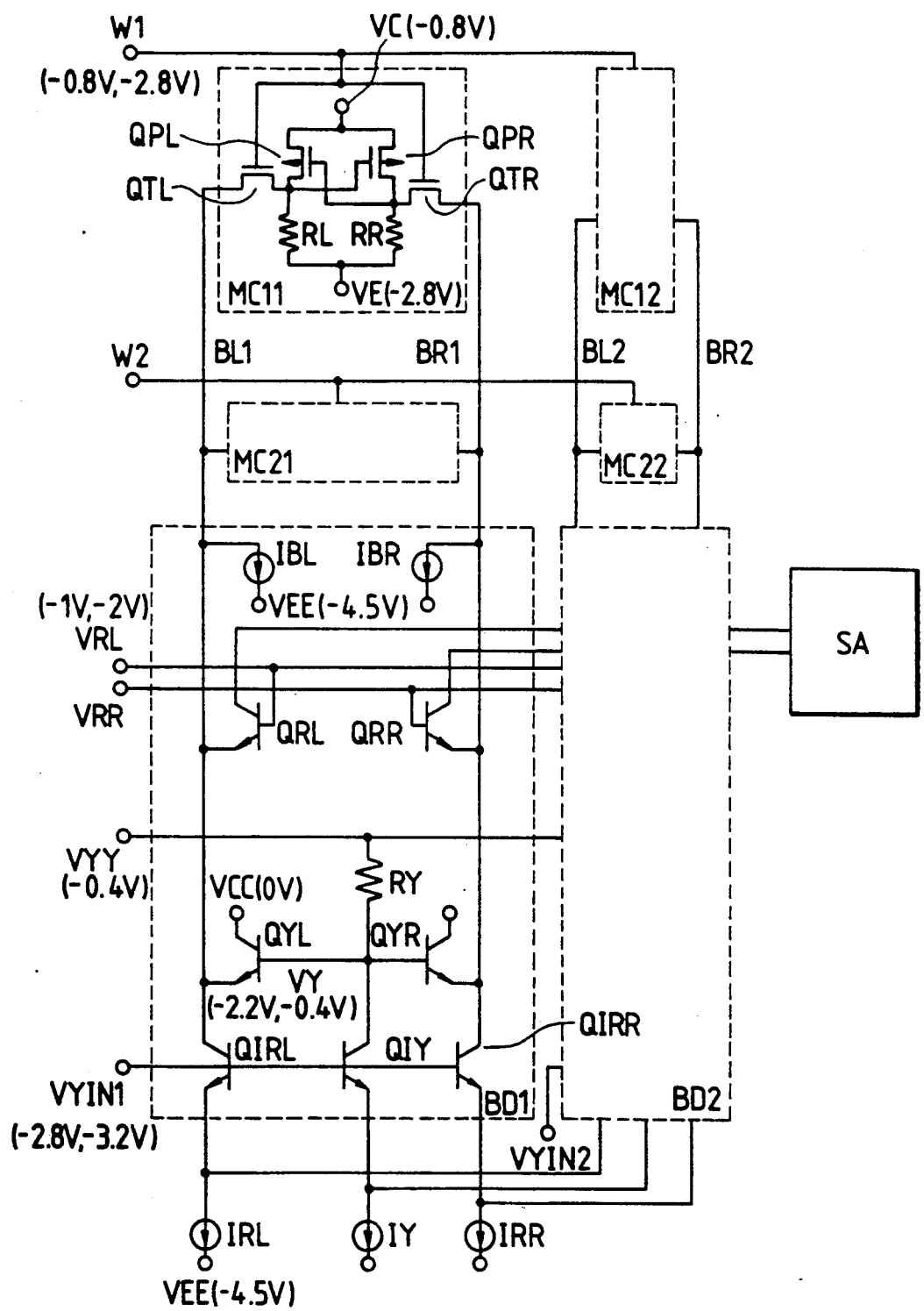
Figure 28B:
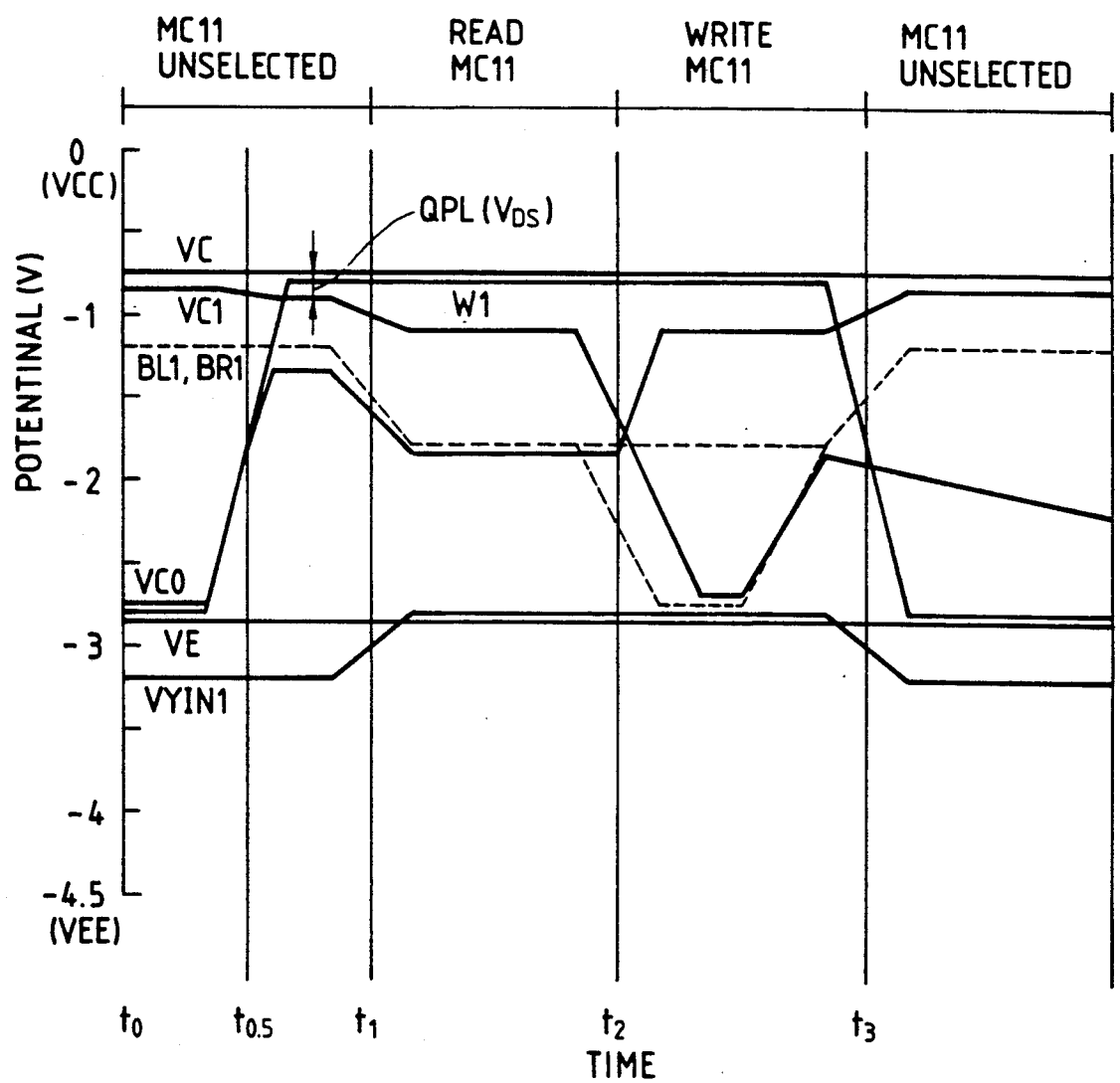

FIGS. 13(a) and (b) show an embodiment of the present invention. FIG. 28(a) is a circuit diagram showing the memory cells and peripheral circuits of the semiconductor memory; and FIG. 28(b) is a waveform chart showing the potentials of the individual portions. In the present embodiment, the cell current is not fed to all the cells that are connected with the selected word lines but only to the cells which are connected to the selected word lines and the selected BIT lines, so that the power consumption can be reduced. In FIG. 28(a), more specifically, the paired bipolar transistors QRL and QRR, which have their emitters connected with the BIT lines BL1 and BR1, their bases fed with the read/write control signals VRL and VRR and their collectors for outputting the memory cell information, are NPN bipolar transistors. According to the present invention, therefore, insulated gate type transistors QPL and QPR composing the cells are P-channel type insulated gate type transistors. There will be described the reason why the cell current flows to all the cells connected with the selected word lines.

Before this description, if the insulated gate type transistors composing the cells are N-channel insulated gate type transistors, the cell current flows to all the cells connected with the selected word lines, as detailed with reference to the embodiment of FIG. 19(a)–(b). The times $t_{05}$ to $t_1$ of FIG. 19(f) show the potential waveforms of the individual portions in case the word lines W1 to be connected with the cell MC11 of FIG. 19(a) are selected whereas the BIT lines BL1 and BR1 are unselected. As should be noted here, if the word line W1 is selected and driven to the high potential (4.2 V), the transistors QTL and QTR in the cell MC 11 are turned on. If, therefore, the transistor QNL is turned on, its drain voltage VCO is raised as in the reading operations (at the times $t_1$ to $t_2$). Here, the difference between the voltages VCO and VE is the drain-source voltage $V_{DS}$ of the transistor QNL and generates the cell current $I_{cell}$ if it is raised. For the period of the times $t_{05}$ to $t_1$, more specifically, the word line W1 is selected although the BIT lines BL1 and BR1 are unselected, so that the cell current $I_{cell}$ flows to the cell MC11. This holds for all the cells connected with the selected word lines. This is the reason why the cell current flows to all the cells connected with the selected word lines.

The following description is directed to the reason why the insulated gate type transistors composing the cells are of the P-channel, as shown in FIG. 28(a). As at the times $t_{05}$ to $t_1$ in FIG. 28(b), there are illustrated the potential waveforms of the individual portions in case the word line W1 connected with the cell MC11 of FIG. 28(a) is selected whereas the BIT lines BL1 and BR1 are unselected. Here, if the word line W1 is selected and driven to the high potential (4.2 V), the transistors QTL and QTR in the cell MC11 are turned on. Now, if the transistor QPL is ON, the drain voltage VC1 of the transistor QPL is dropped as in the reading operations (at the times $t_1$ to $t_2$). However, what should be noted here is that, if the potentials of the unselected BIT lines BL1 and BR1 are designed at the high level (e.g., 1.2 V in the present embodiment), the drop of the voltage VC1 can be reduced so that the drain-source voltage $V_{DS}$ of the transistor QPL can be dropped enough for substantially eliminating the cell current $I_{cell}$. In other words, this is the reason why the cell current can be prevented from flowing to all the cells connected with the selected word lines in FIG. 28(a).

In FIG. 28(a), moreover, the insulated gate type transistors QPL and QPR composing the cells are Pchannel insulated gate type transistors. According to the present invention, therefore, the insulated gate type transistors QTL and QTR to be coupled to the paired BIT lines are N-channel insulated gate type transistors. Then, the following advantages can be attained. At the times $t_{05}$ to $t_1$ of FIG. 28(b), the potentials of the unselected BIT lines BL1 and BR1 are designed at the high level. If the transistor QPL in the cell is then ON, its drain voltage VC1 can be raised, and the drain voltage VCO of the transistor QPR is also raised. Thus, if the BIT lines BL1 and BR1 are raised to the excessively high potential, the cell information voltage (VC1−VCO) is dropped to reduce the cell margin. If, however, the transistors QTL and QTR are N-channel insulated gate type transistors, the voltage VCO is clamped at a potential (1.3 V) which is lower by the threshold voltage (e.g., 0.5 V) of the transistor QTL than the potential (0.8 V) of the word line W1. As a result, the cell information voltage is dropped so that the cell margin is not reduced. In FIG. 28(a), the constant voltage to be applied to the resistors RL and RR in the cell are at the level of −2.8 V higher than the power-supply voltage (−4.5 V) so that the voltage amplitude of the BIT lines in the writing operations can be reduced to shorten the discharge time period. Since, moreover, the current fed to the selected BIT lines is larger than that of the unselected BIT lines, the discharge time period for the information writing operation can be further shortened together with the discharge time period of the BIT lines in the reading operations by switching the BIT lines.

Figure 29:
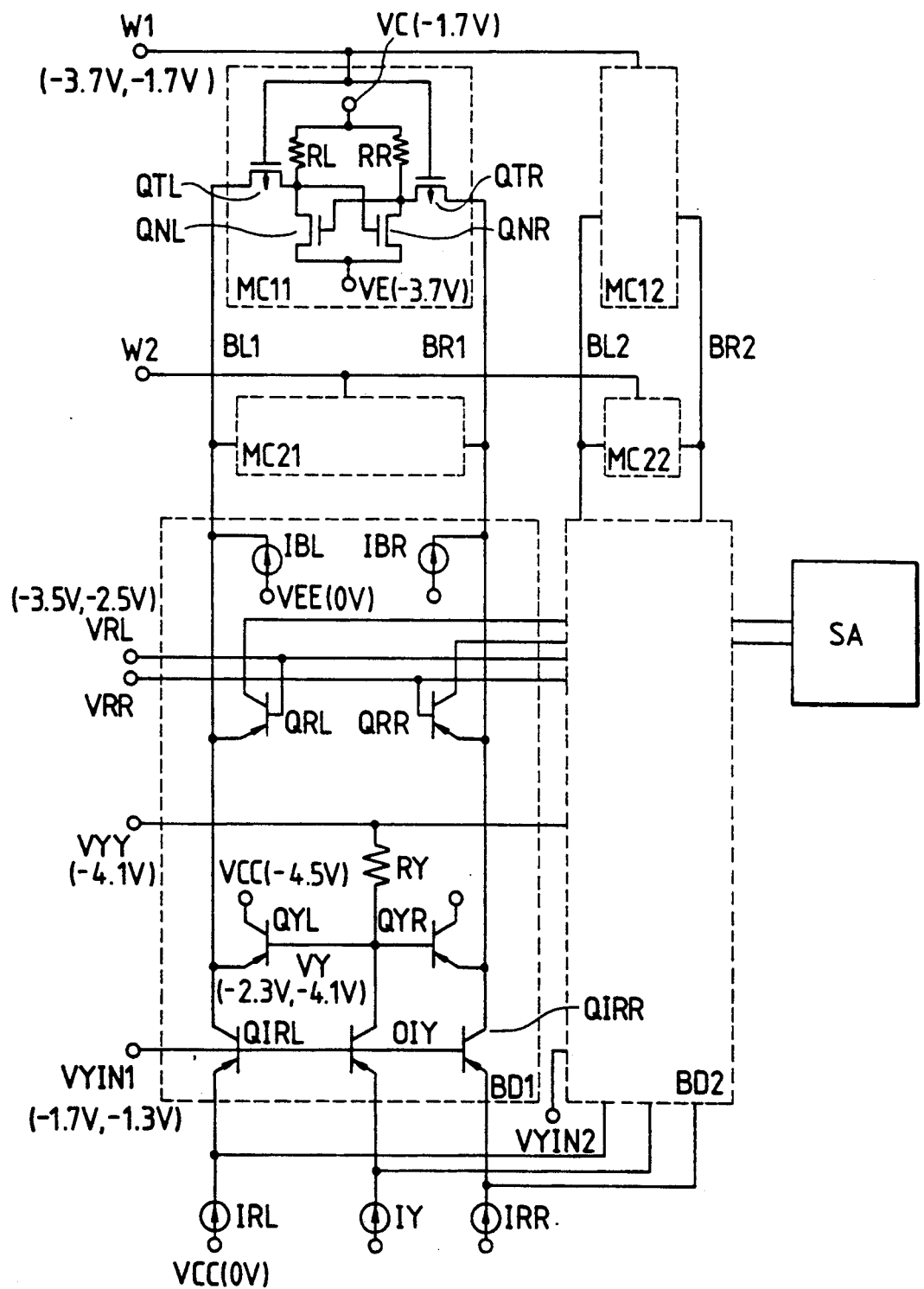

FIG. 29 shows an embodiment of the present invention. In the present embodiment, the NPN bipolar transistors, the P-channel insulated gate type transistors and N-channel insulated gate type transistors of FIG. 28(a) are changed to PNP, N-channel and P-channel types so that the relations of all the voltages are reversed. In the present embodiment, therefore, the discussions of FIGS. 29(a) and (b) likewise hold.

Figure 30:
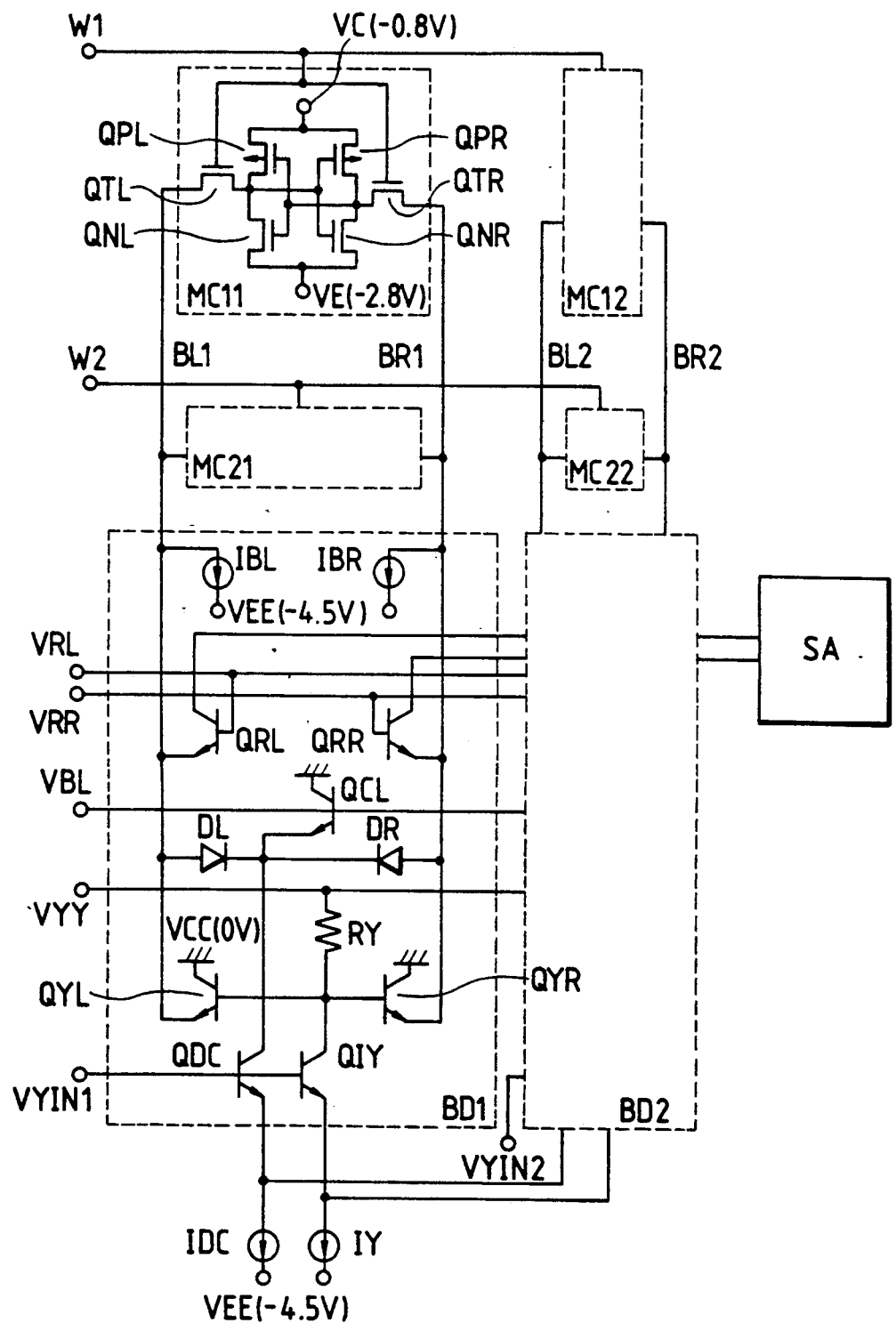

FIG. 30 shows an embodiment of the present invention. This embodiment is generally identical to the embodiment of the present invention shown in FIG. 16(a), excepting the following point. In FIG. 16(a), specifically, the current supplies IRL and IRR and the bipolar transistors QIRL and QIRR are provided to feed the selected BIT lines with a larger current than that of the unselected BIT lines. In the present embodiment of FIG. 30, on the contrary, the aforementioned current supplies and bipolar transistors are replaced by a current supply IDC, bipolar transistors QDC and QCL and diodes DL and DR so that a current may flow transiently when the BIT lines are switched from the unselected to selected states. When the BIT line selection signal VYIN1 is switched from the low potential at the unselected level to the high potential at the selected level, as shown in FIG. 30, the aforementioned transistor QDC is turned on to feed the current IDC to the selected BIT lines BL1 and BR1 through the diodes DL and DR. If, however, the base potential VBL of the transistor QCL is set at a slightly higher level than the low potential of the selection level of the BIT lines, the BIT lines are discharged with the current IDC. If the potential of the BIT lines come close to the low potential of the selection level, the current IDC flows not to the diodes DL and DR but from the transistor QCL. After all, the current IDC transiently flows to the BIT lines only when the BIT lines are switched from the unselected to selected states. Thus, like FIG. 16(a), it is apparently possible to shorten the discharge time period of the BIT lines for the information reading operation by switching the BIT lines. In FIG. 30, the current is transiently fed only when the BIT lines are switched from the unselected to selected states, as will be explained in the following. Since the current is not steadily fed to the selected BIT lines, the voltage drop due to the wiring resistance of the BIT lines can be reduced to reduce the wiring width of the BIT lines accordingly so that the high integration can be achieved.

Figure 31:
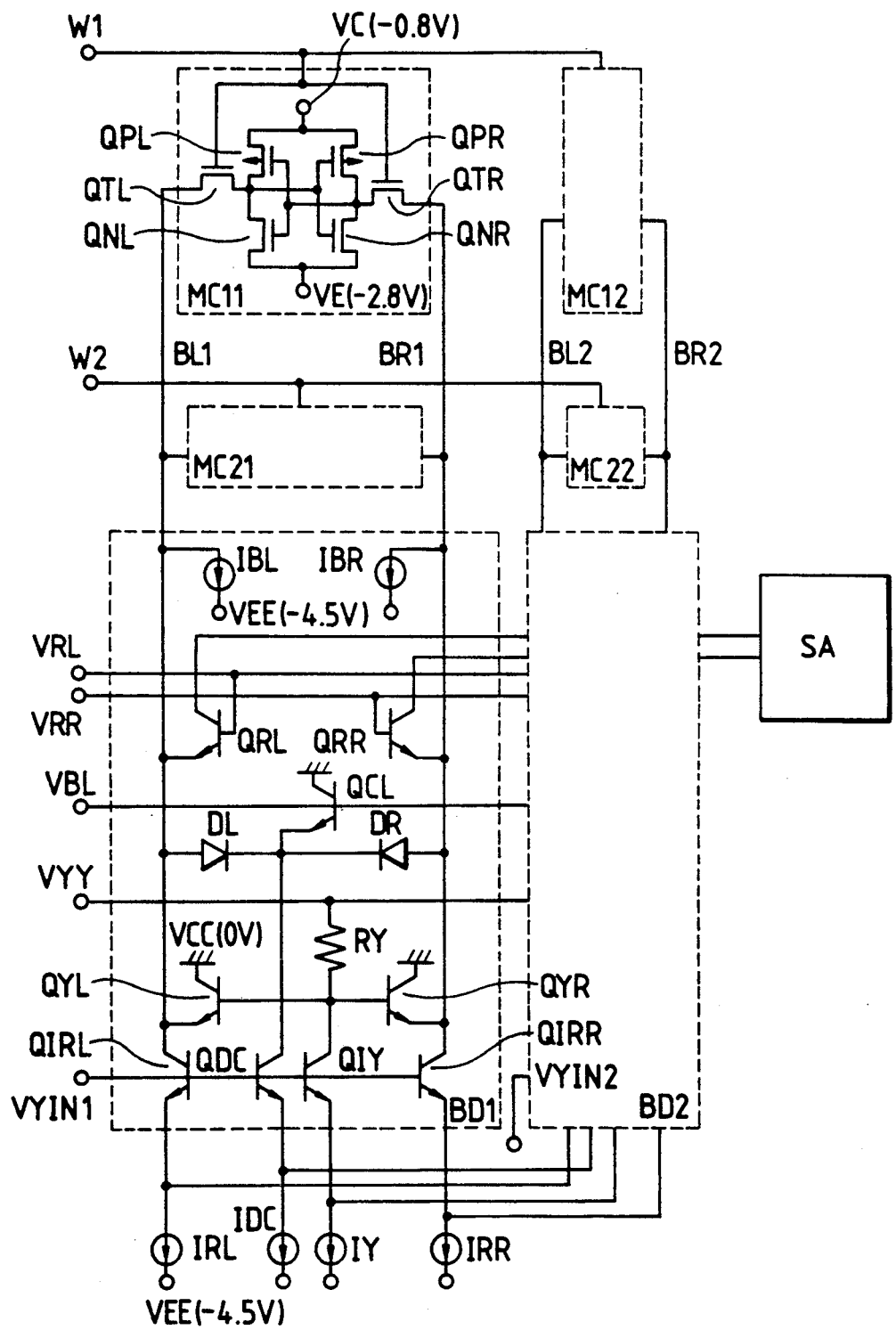

FIG. 31 shows an embodiment of the present invention. The present embodiment is characterized in the points that a larger current is fed to the selected BIT lines than that for the unselected BIT lines as in FIG. 16(a), and that the current is transiently fed when the BIT lines are switched from the unselected to selected states as in FIG. 30. According to these characteristics, it is apparently possible to shorten the discharge time periods of the BIT lines for the information reading operations by switching the BIT lines.

Figure 32:
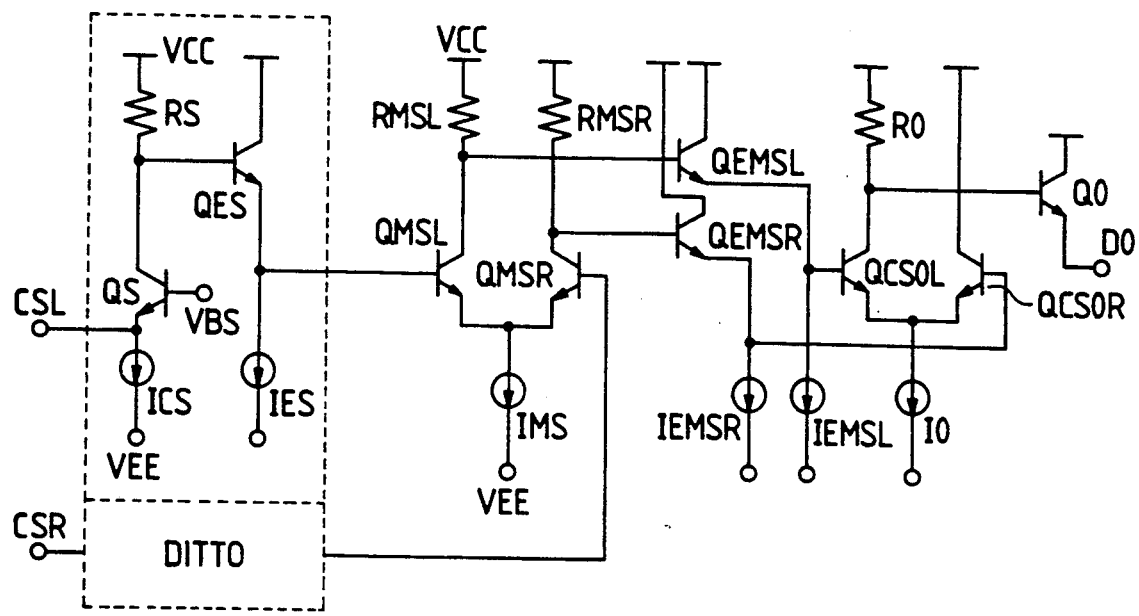
FIG. 32 is a circuit diagram showing the sense amplifier of the present invention.

FIG. 32 shows an embodiment of the present invention and presents examples of the structure of the sense amplifiers SA shown in any of the embodiments herein. As shown in FIG. 18 of the Japanese Patent Publication No. 6331879, for example, the sense amplifier of the prior art is constructed of: two current-voltage converters composed of a resistor and a bipolar transistor; and one differential amplifier composed of bipolar transistors. According to the characteristics of the present embodiment, on the contrary, the sense amplifier is constructed, as shown in FIG. 32, of: two current-voltage converters composed of a resistor RS and a bipolar transistor QS; and two differential amplifiers composed of bipolar transistors QMSL and QMSR or QCSOL and QCSOR. The reason why the sense amplifiers are constructed of the two differential amplifiers will be described in the following. In order to speed up the charge and discharge of the BIT lines, according to the present invention, there is provided either means for feeding a larger current to the selected BIT lines than that for the unselected BIT lines or means for feeding a current transiently when the BIT lines are switched from the unselected to selected states, as has been described hereinbefore. Those currents would wholly flow to the resistors RS as long as the countermeasures such as the current sources IRDL and IRDR shown in FIG. 21 are not provided. This makes it necessary to make the resistor RS lower than the prior art so that the bipolar transistor QS may be prevented from being saturated. As a result the signal voltage amplitude, which is converted from the cell information $I_{cell}$, is reduced so that the mere amplification of the signal with one differential amplifier could not establish a sufficient signal-voltage amplitude to weaken the strength against the noises. This fear will be specifically described in connection with the embodiment of FIG. 20. If the transistor QNL in the memory cell MC11 is ON during the information reading operation of the cell MC11 of FIG. 20(a), as has been described hereinbefore, the current to flow through the sense amplifier SA is ISL=$I_R$+$I_{cell}$, and ISR.=$I_R$−$I_{cell}$, as shown in FIG. 20(d). As a result, the sense amplifier SA reads out the information by detecting the difference of those currents. For $I_R$=1.5 mA and $I_{cell}$=0.05 mA, for example, ISL=1.5+0.05=1.55 mA, and ISR=1.5−0.05=1.45 mA. If, moreover, the $I_{cell}$ of FIG. 32 is designed at 0.05 mA, the current to flow through the resistor RS is 1.60 (=1.55+0.05) mA at the maximum. Now, if the VBS is designed at 4.2 V, the transistor QS is saturated for the collector voltage lower than 4.2 V. For VCC=5 V, therefore, the resistor RS has to be 0.5 KΩ (=(5−4.2)V/1.6 mA) or less. Now, for RS=0.50 KΩ, the voltage amplitude VS of the cell information signal to be outputted from the current voltage converter is $VS = RS \times (ISL - ISR) = 0.5\ k\Omega \times (1.55 - 1.45)\ mA = 50\ mV$. Usually, a sufficient output signal voltage amplitude cannot be achieved unless the voltage amplitude of the signal to be fed to the differential amplitude is at least 100 mV. The signal of 50 mV could not be sufficiently amplified with the single differential amplifier. In FIG. 32, on the contrary, that problem can be avoided because the sense amplifier is constructed of the two differential amplifiers. Incidentally, this problem can also be avoided by providing the current sources IRDL and IRDR shown in FIG. 21, as has been described hereinbefore. The design could be advantageously simplified if more differential amplifiers are provided as in the present embodiment.

Figure 33:
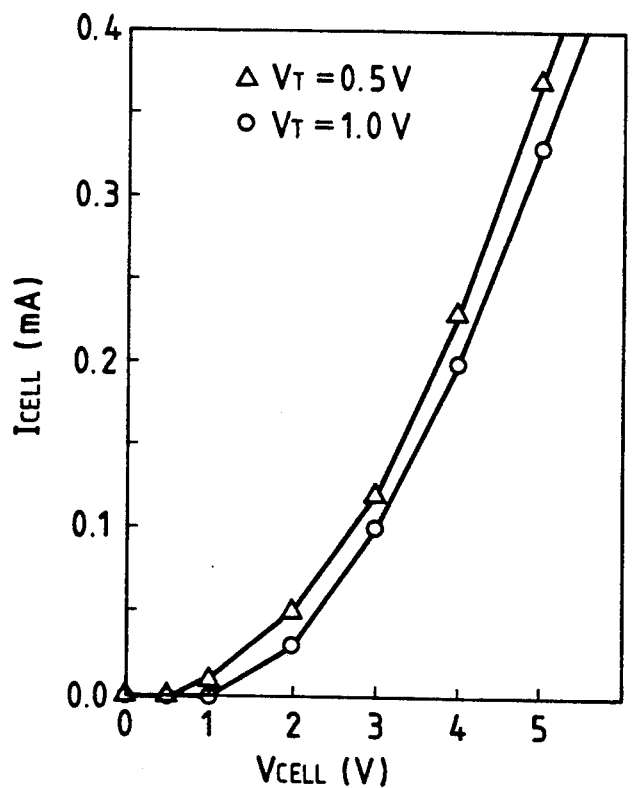
FIG. 33 is a diagram showing the relations between the cell current $I_{cell}$ and the cell voltage $V_{cell}$.

The relationship between the cell current and cell voltage is shown in FIG. 33.

As has been described hereinbefore, according to the present invention, it is possible: (1) to shorten the charge and discharge time period of the BIT lines when the information is to be read out by switching the BIT lines; (2) to shorten the charge and discharge time period of the BIT lines when in the information writing operation; and (3) to prevent the cell current from flowing into the unselected cells. As a result, it is possible to realize a semiconductor memory which can enjoy the high integration and speed but the low power consumption.

Figure 37:
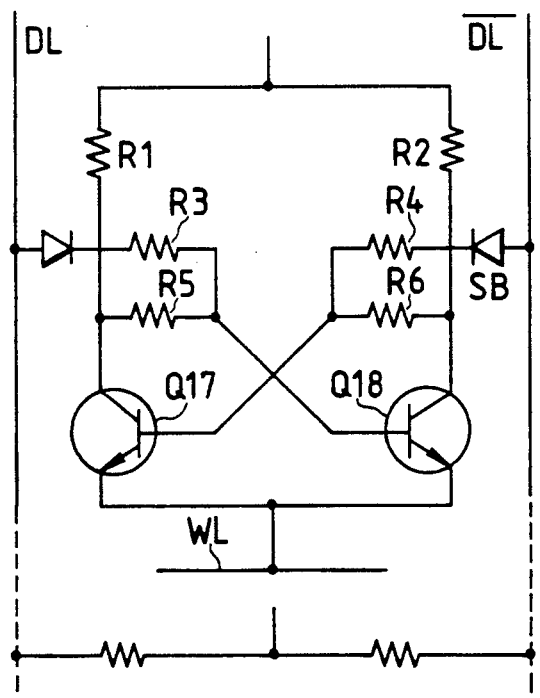
FIG. 37 is a circuit diagram showing one example of the memory cell of the prior art.

FIG. 37 shows a well-known memory cell connected between complementary data lines DL, DL NOT by diodes 5B (which is disclosed in ISSCC Digest of Technical Papers pp. 4445, Feb. 1970), for example. In this cell the cross-coupled bipolar drive transistors Q17 and Q18 are connected at their emitters to word line WL, and, the load resistors are designated at $R_1$ and $R_2$ but other resistors $R_3$–$R_6$ are merely for improving the writing characteristics but have no relation to the fundamental memory operations so that they can be omitted. Therefore, there has been proposed a BiCMOS memory (as disclosed in Japanese Patent Laid-Open No. 62-58486), in which the resistors $R_3$ to $R_6$ of FIG. 37 are omitted and where the bipolar transistors are replaced by MOS transistors, as shown in FIG. 38A.

Figure 38A:
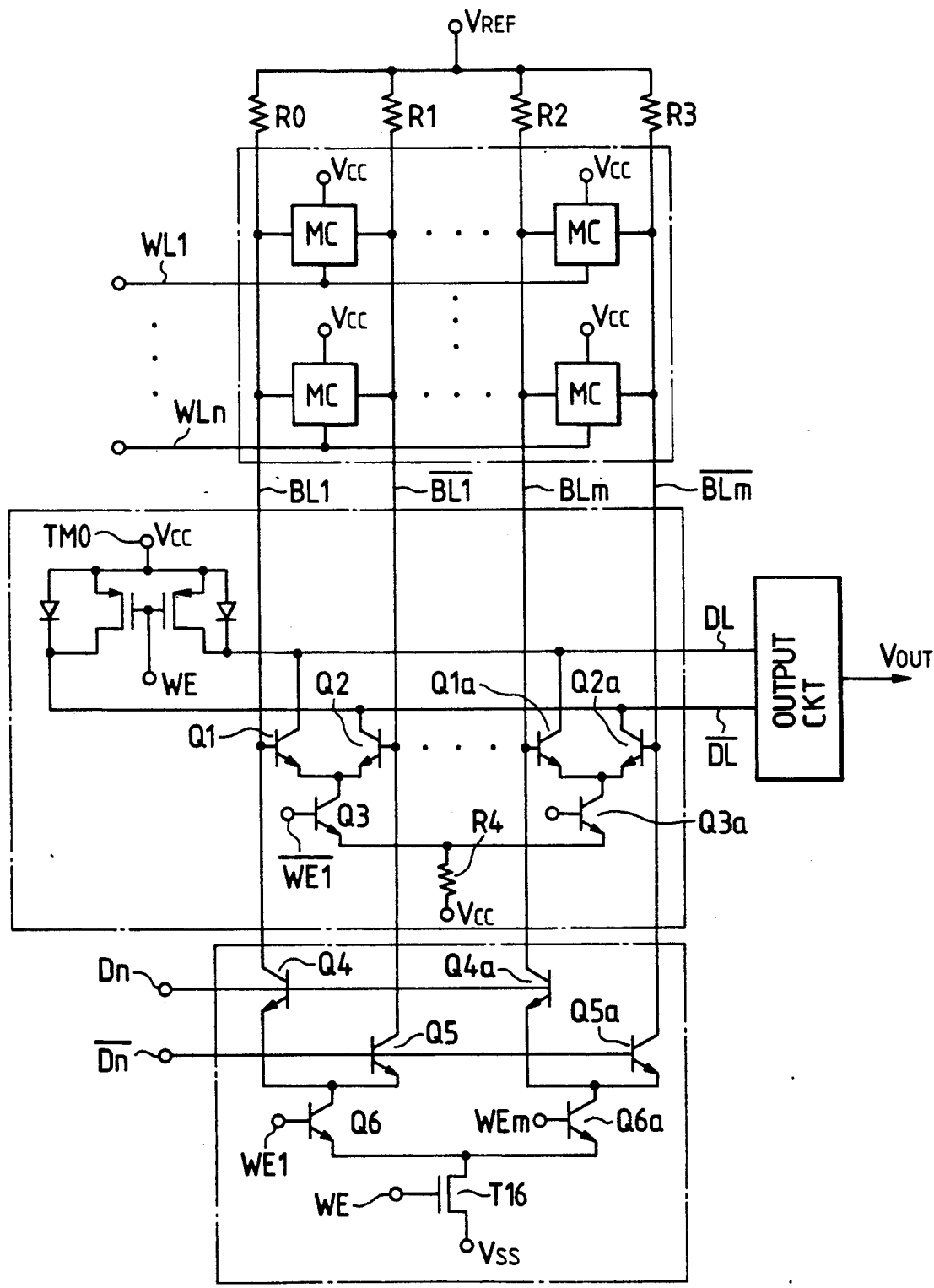
FIGS. 38A and 38C are circuit diagrams showing the semiconductor memory and the memory cell of the prior art.
Figure 38B:
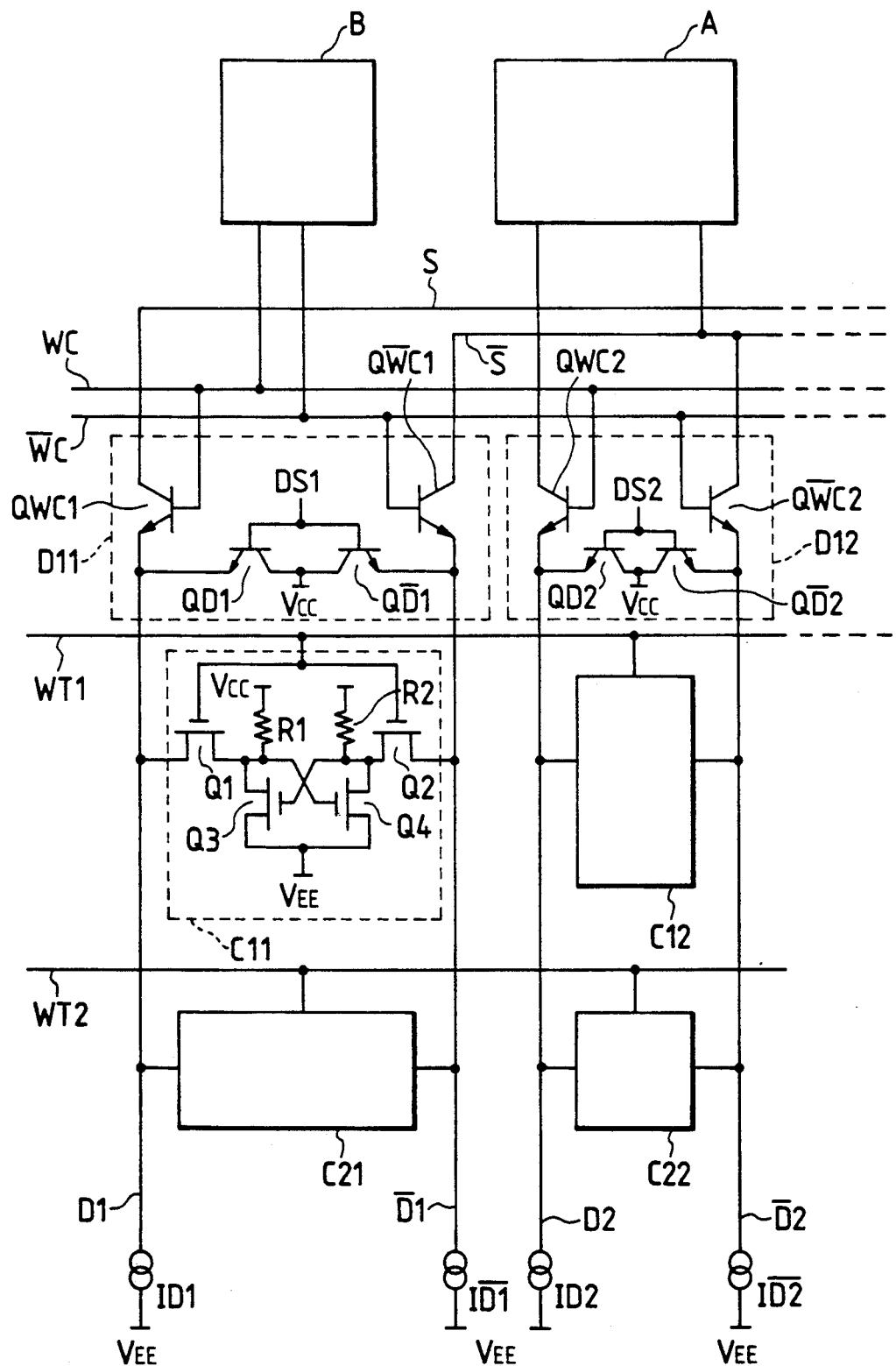
FIG. 38B is a circuit diagram showing another memory of the prior art.
Figure 38C:
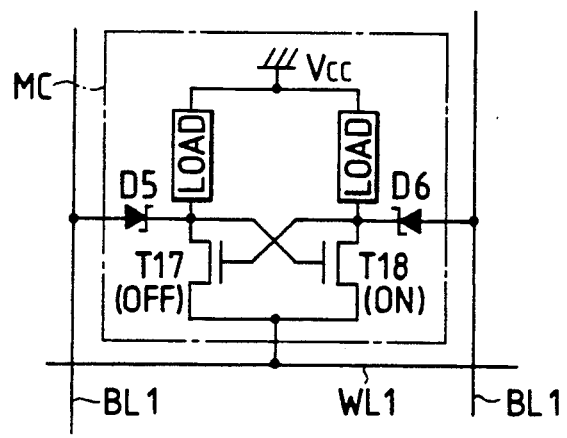

Another example of CMOS memory cells, is disclosed in Japanese Patent Laid-Open No. 63-31879 as shown in FIG. 38B.

For example, FIG. 38A corresponds to Japanese Patent Laid-Open No. 62-58486.

In one embodiment of the semiconductor memory according to the present invention, one, two or more bipolar transistors have their emitters connected with the BIT lines of a memory cell array using the aforementioned memory cells of FIG. 38A so that they may sense and drive the BIT lines. Thanks to this structure, the potential of the BIT lines is hardly fluctuated in the reading operation because it is clamped by the bipolar transistors so that a sufficiently high-speed read can be accomplished even with the small current of the MOS transistors. In the writing operation, on the other hand, the base voltage of the bipolar transistors is raised to raise the potential of the BIT lines so that the transistors are forcibly turned ON for the writing operation. For the selection of the memory cells, on the other hand, all the memory cells connected with the selection word line can be simultaneous read out by holding the base voltage of the aforementioned bipolar transistors at a suitable value. Alternatively, only the selected BIT line can be read out by dropping all the base voltages of the transistors of the unselected BIT lines. In case all the memory cells are simultaneously read out, a high speed is achieved, but the current flows to all the BIT lines so that the power consumption is increased. In case only one memory cell is to be selected, on the contrary, the base voltage of the transistors connected with the selected BIT line is switched from the low to high levels to change the BIT lines from the low to high levels. At this time, a large discharge current flows to the sense system so that the reading has to be delayed until the current is suppressed. Although the high-speed is thus sacrificed more or less, the reading current flows into only one word line so that the power consumption is dropped to a very low level. Since, moreover, the current to flow into one word line is very small, there can be attained an advantage in the voltage drop or the migration.

As has been described hereinbefore, according to the present invention, a high speed similar to that of the bipolar memories can be achieved by using the memory cells of FIG. 38A. It is, however, difficult to obtain the low power consumption and the high speed at the same time. In order to achieve not only the high speed but also the lower power consumption, according to the present invention, the MOS or CMOS cell is constructed such that the coupling diodes between the drains of the MOS transistors and the BIT lines have their polarities inverted from those of FIG. 38A, and such that the BIT lines are connected with the emitter of one or more bipolar transistors and the constant current source so that the read current may flow out from the memory cells. In this structure, the base of the bipolar transistors is at the low level, when the BIT lines are to be selected, to drop the potential of the BIT lines. Thus, for the switching from the selected to unselected states, the charge current of the BIT lines flows through the bipolar transistors but is fed from the sense transistors but the BIT line driving transistors so that the reading is not retarded.

These memory operations cannot be accomplished when the memory cells having the constant current drivability like the MOS memory cells and the bipolar peripheral circuits are combined and a current larger than that of the memory cells is fed to the sense current. Thus, the high-speed operation cannot be realized with memory cells having the constant voltage drivability such as the ordinary bipolar memory cells or in the case of a memory in which the current to the sense circuit is essentially equal to the cell current, like the bipolar memory of the prior art, even if the memory cell of the constant current characteristics are used.

As has been described hereinbefore, according to the present invention, a memory cell having the constant current drivability of the type different from that of the bipolar memory cell of the prior art, namely, a memory cell capable of realizing both the high speed and the low power consumption can be provided by using the diode coupling type MOS or CMOS cells, for example.

Moreover, the high speed like that of the bipolar memory cell can be achieved by using the diode coupling type bipolar memory cell, i.e., a memory cell in which the bipolar transistors are replaced by the MOS transistors.

Figure 41:
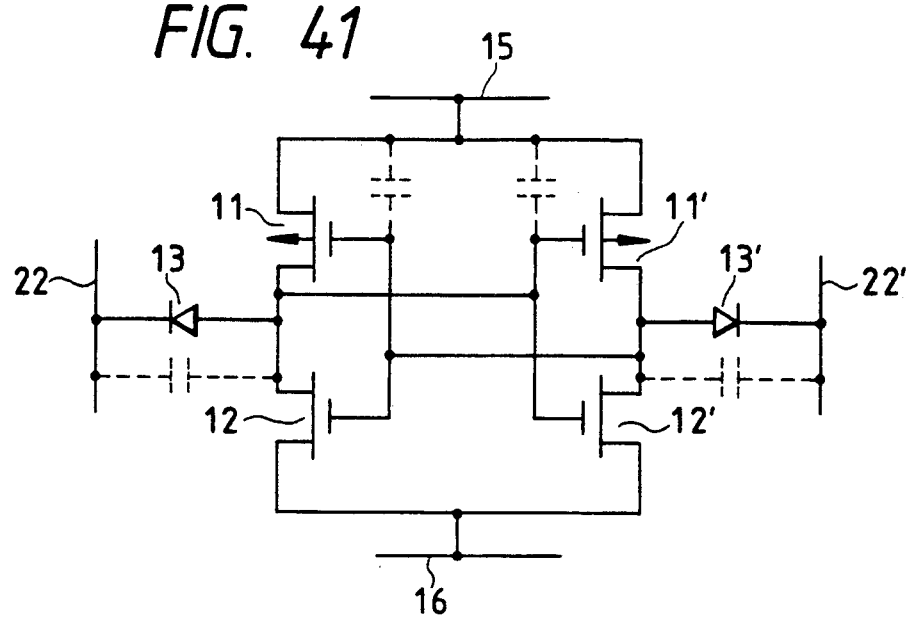
FIG. 41 is a diagram showing one embodiment of the memory cell of the present invention to be used in the semiconductor memory of FIG. 34A.

FIG. 34A is a diagram showing one embodiment of the semiconductor memory of the present invention using the memory cell of the present invention shown in FIG. 41. For conveniences of the description, however, the embodiment of FIG. 35A will be described beforehand.

Figure 35A:
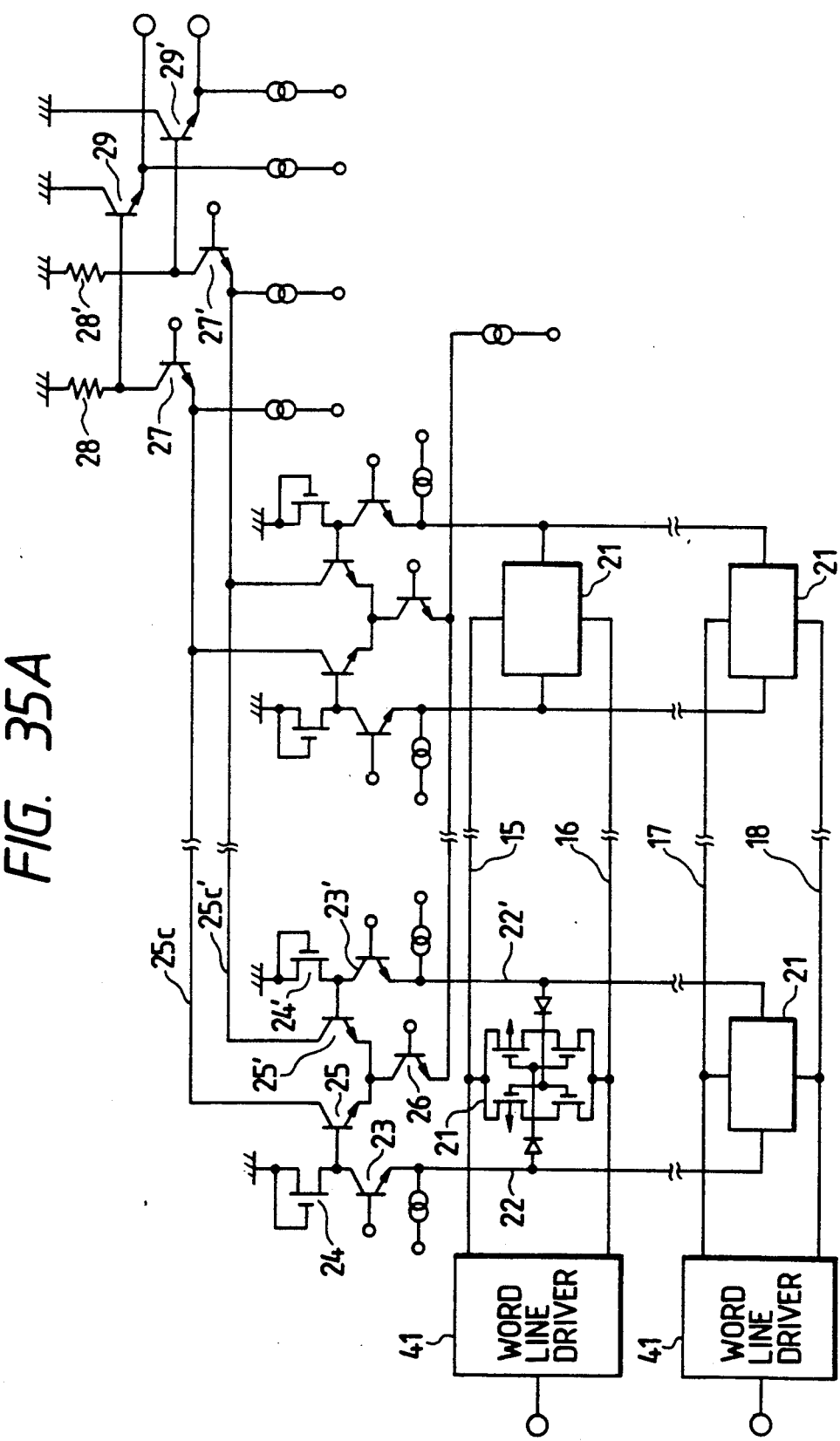
FIG. 35A is a circuit diagram showing another embodiment of the semiconductor memory of the present invention.

FIG. 35A is a circuit diagram showing one embodiment of the present invention, i.e., a semiconductor memory having a peripheral circuit, which is well suited for constructing a super-high speed memory of memory cells disclosed in Japanese Patent Laid-Open No. 62-58487.

Figure 39:
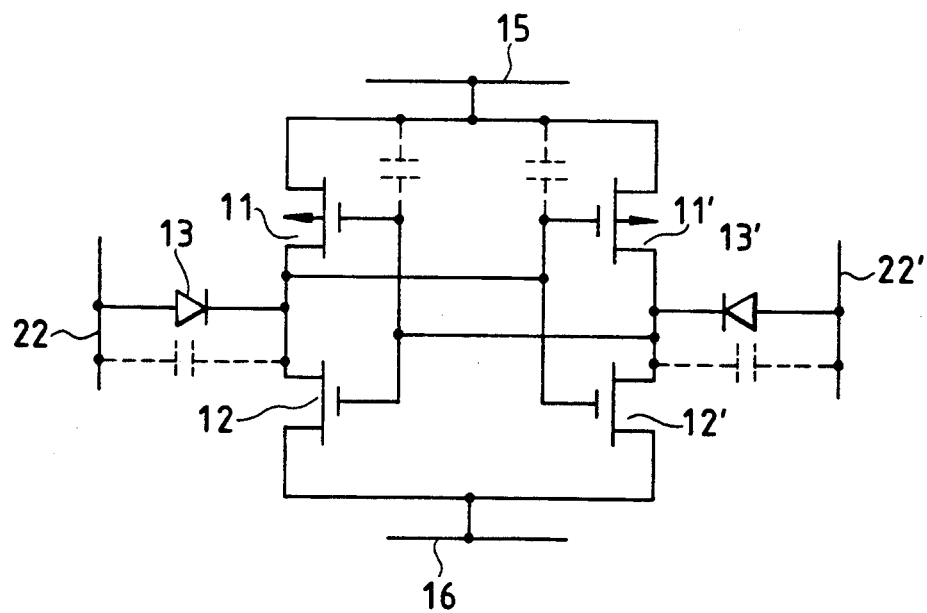
FIG. 39 is a circuit diagram showing one embodiment of the memory cell to be used in the semiconductor memory of FIG. 35A.
Figure 45A:
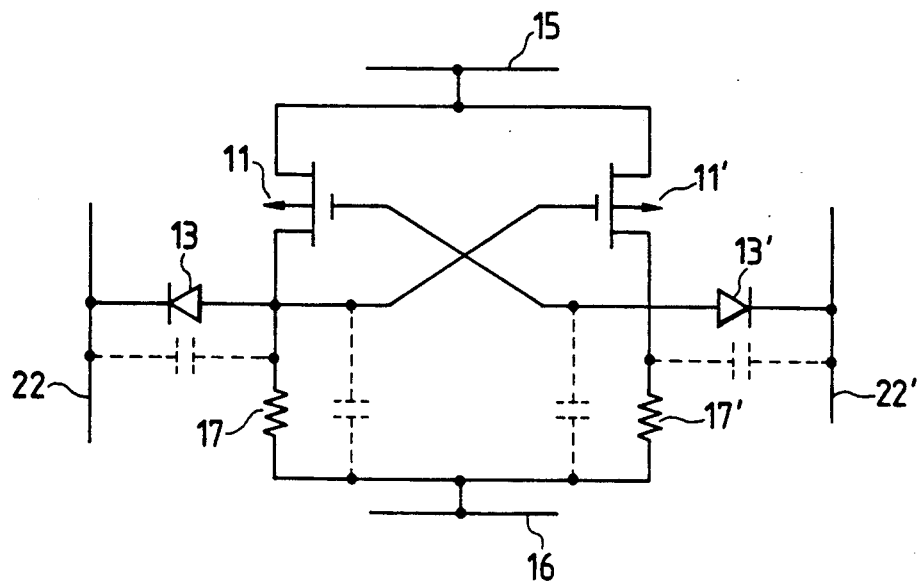
Figure 45B:
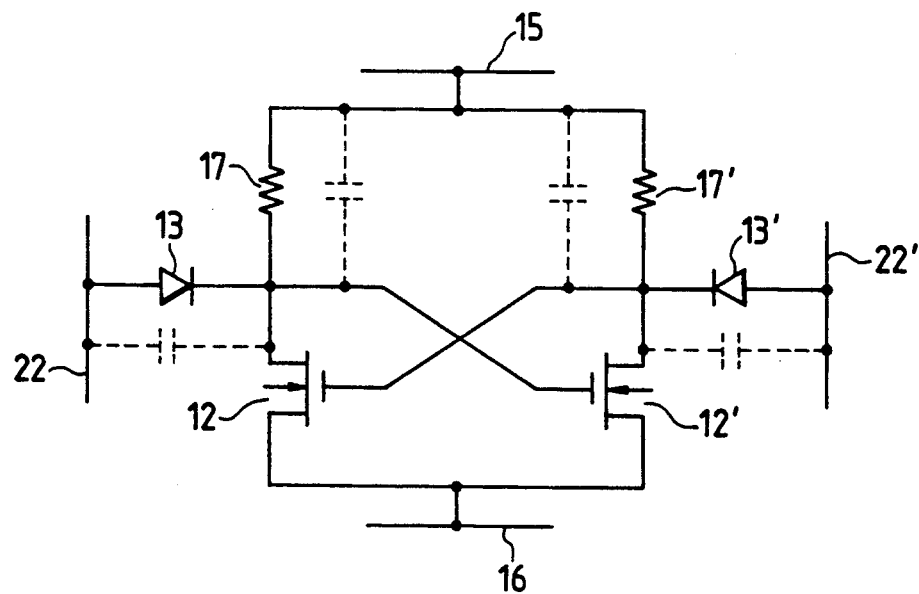

As the memory cell having constant voltage drivability, the cmos type memory cell, as shown in FIG. 39, is superior in characteristics to the resistance load type memory cell, as shown in FIGS. 38B and 45(b).

The memory cell (to be used as the memory cell 21 of FIG. 35) of FIG. 39 is constructed of: a flip-flop composed of two p-MOSes 11 and two n-MOSes 12 cross coupled between word lines 15, 16; and a coupling element composed of diodes 13 and 13', connected with BIT lines 22 and 22'.

The broken lines in FIG. 39 are capacitors used for higher speed and the immunity from α-induced soft errors, but they may be omitted, if unnecessary. The diodes 13 and 13' may be of any type, but polysilicon diodes or SBDs (Schottky barrier diodes), are preferred due to their speed and if size reduction is considered.

Reverting to FIG. 35A, the BIT lines 22 and 22' are connected with the emitters of sense and drive bipolar transistors 23 and 23' which have their collectors connected with load devices 24 and 24'. These load devices are the MOS transistors but may be ordinary resistors. The sense outputs from the collectors of the bipolar transistors 23 and 23' are applied to a preamplifier composed of transistors 25, 25' and 26. The collectors of the transistors 25 and 25' are respectively connected with those of a number of similar transistors for other BIT lines and connected with the emitters of sense transistors 27 and 27', by common sense lines 25c, 25c'. Moreover, the sense outputs extracted from the collectors of the transistors 27 and 27' are applied through emitter-followers 29 and 29' to an output circuit or the like. The drivers 41 of word lines 15, 16, 17, 18 select the memory cell 21, as is well known.

Figure 36A:
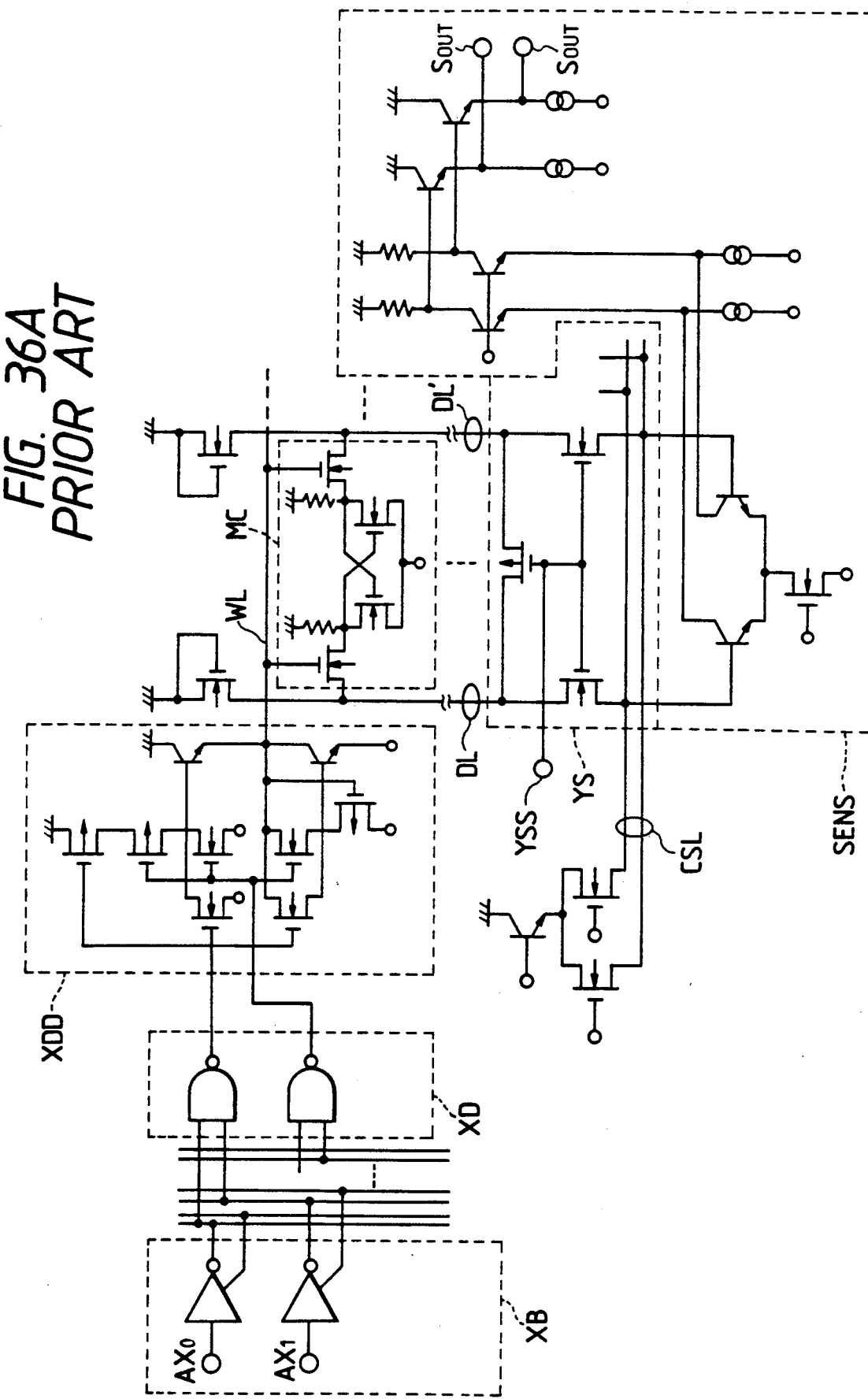
FIG. 36A is a circuit diagram showing the semiconductor memory of the prior art.
Figure 36B:
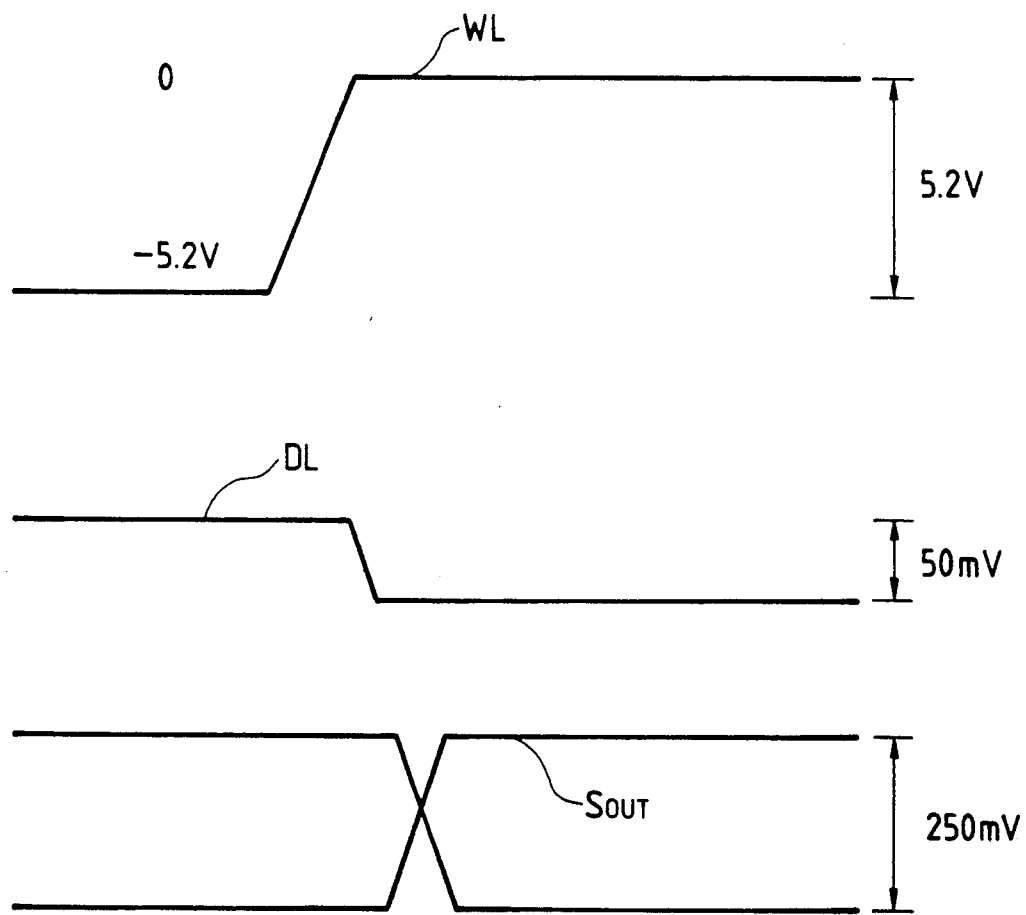
FIG. 36B is a synchronized waveform chart showing the waveform from operation of the major portions of FIG. 36A.
Figure 36C:
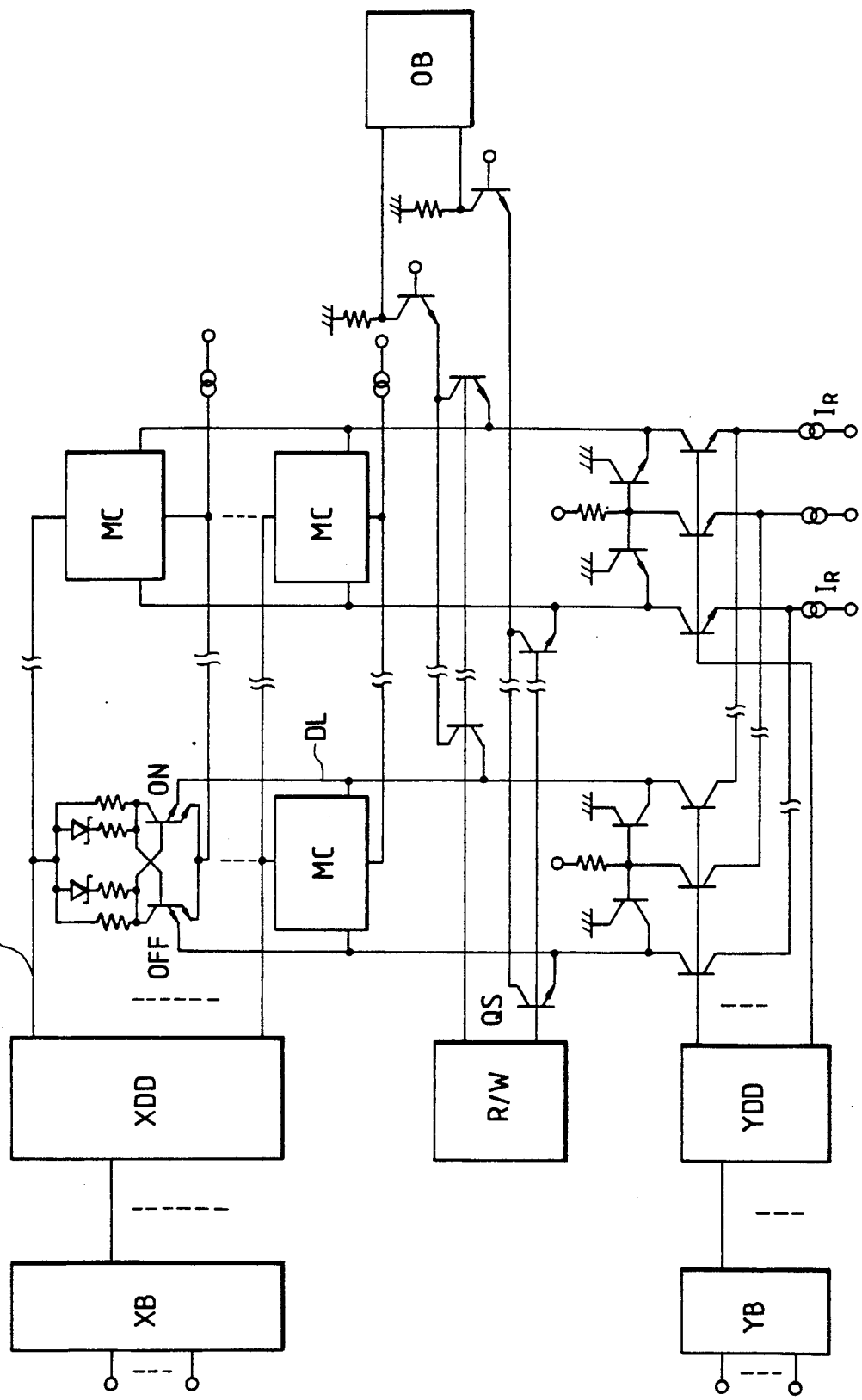
FIG. 36C is a circuit diagram showing the bipolar memory of the prior art.
Figure 36D:
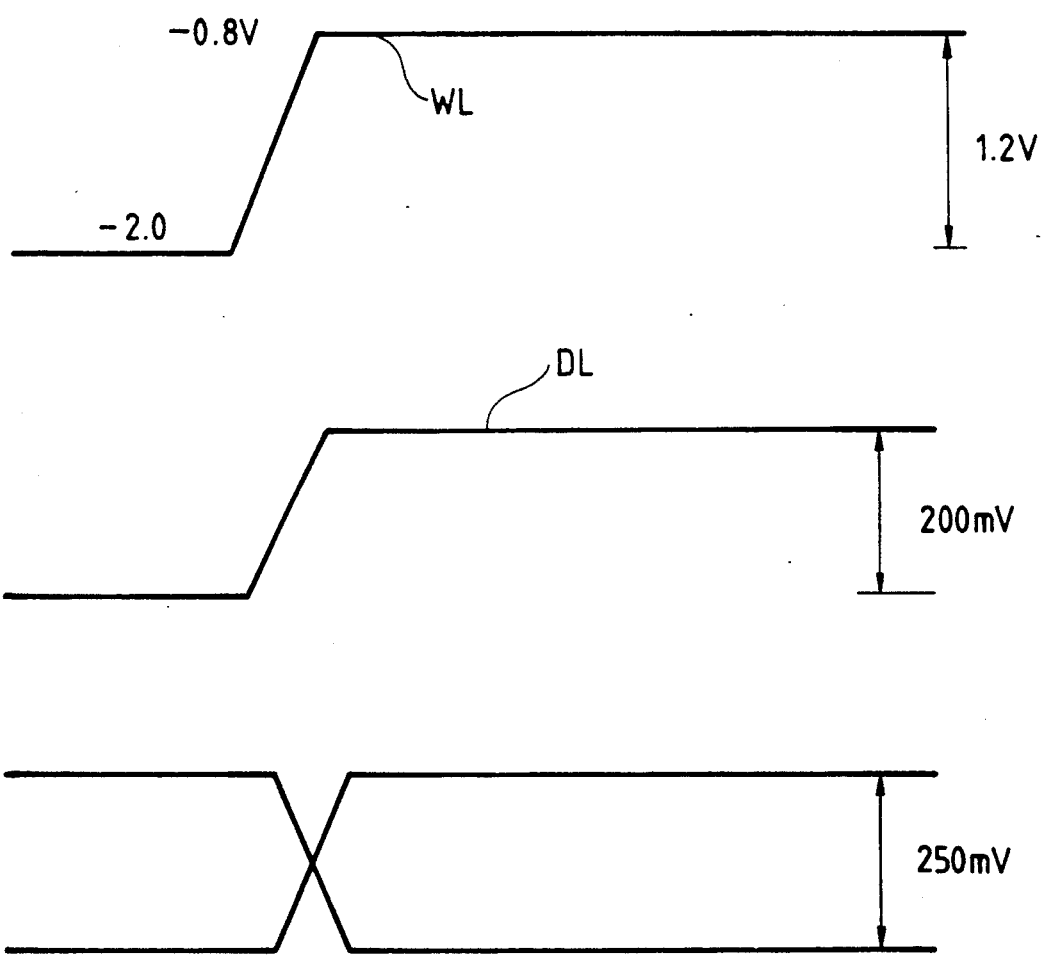
FIG. 36D is a synchronized waveform chart showing the waveform from operation of the major portions of FIG. 36C.

Thanks to the memory structure described, the voltage fluctuations of the BIT lines are small, unlike the memory of the prior art shown in FIGS. 36A and 38A. Thus, the information (i.e., the level of the potential) of the memory cells can be read out at a high speed to the BIT lines. For the writing operations, on the other hand, the voltage on the BIT lines can be likewise driven at a high speed by the bipolar transistors, and the information on the BIT lines can be introduced at a high speed to the memory cells, so that the high-speed operations can be accomplished.

Figure 35B:
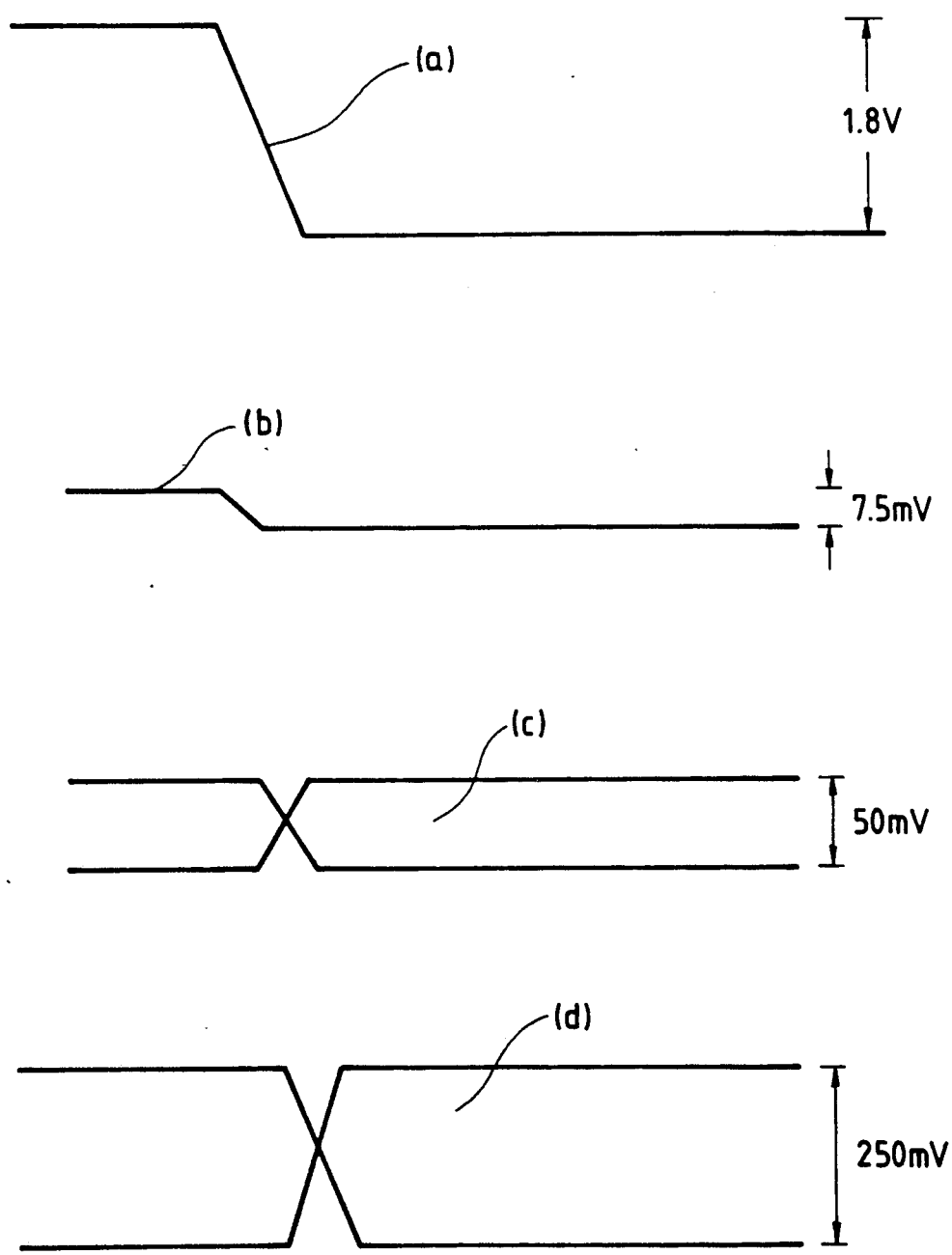
FIG. 35B is a synchronized waveform chart showing the waveforms from operation of the major portions of FIG. 35A.
Figure 40:
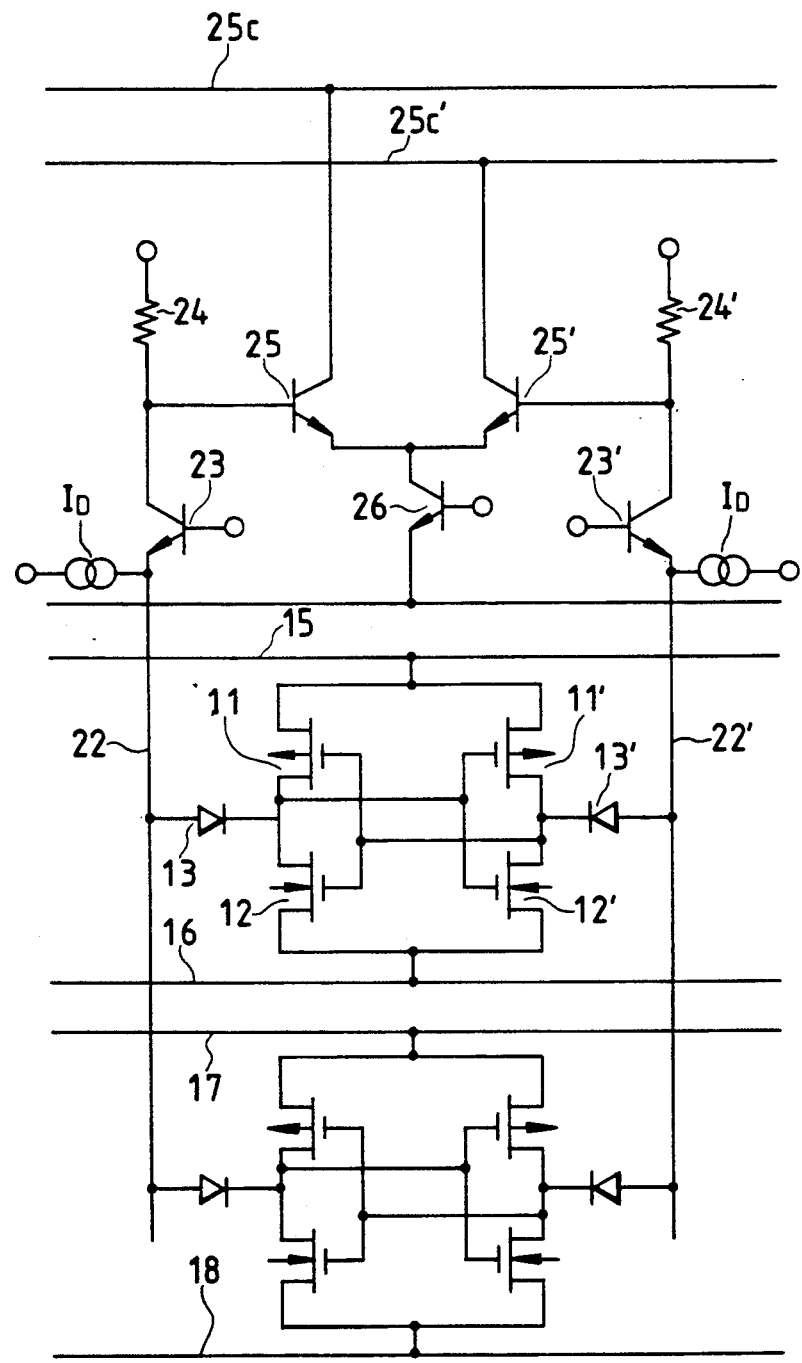
FIG. 40 is an enlarged diagram showing a major portion of FIG. 35A.

Next, FIG. 40 is a circuit diagram showing the main portion of the semiconductor memory of FIGS. 35A and 39. On the other hand, FIG. 35B shows the operation waveforms of the individual portions of FIG. 35A. The fundamental operations of the memory of FIG. 35 will be described in the following with reference to FIG. 40.

In the reading state, as shown in FIG. 40, the sense transistors 23 and 23' have their bases fed with −2.6 V, for example. In this embodiment, the upper and lower word lines are driven by driver 41 to have a substantially constant potential difference whether they might be selected or not. Incidentally, only the lower word line can naturally be drive, as disclosed in Japanese Patent Laid-Open No. 62-58487.

In order to select the word lines, the selected word line is set at the low level (e.g., the lower word line at −4.4 V), and the non-selected word line is set at the high level (e.g., the lower word line at −2.6 V). If word line 15 is selected, in the memory cell connected with the selected word line 15, n-MOS 12' and p-MOS 11 are ON, whereas n-MOS 12 and p-MOS 11' are OFF. If, at this time, both $V_{BE}$ of the transistor and $V_F$ of the diode are at 0.75 V, the BIT line 22' is at −3.15 V, and the drain of the transistor 12' is at −3.9 V.

Figure 42B:
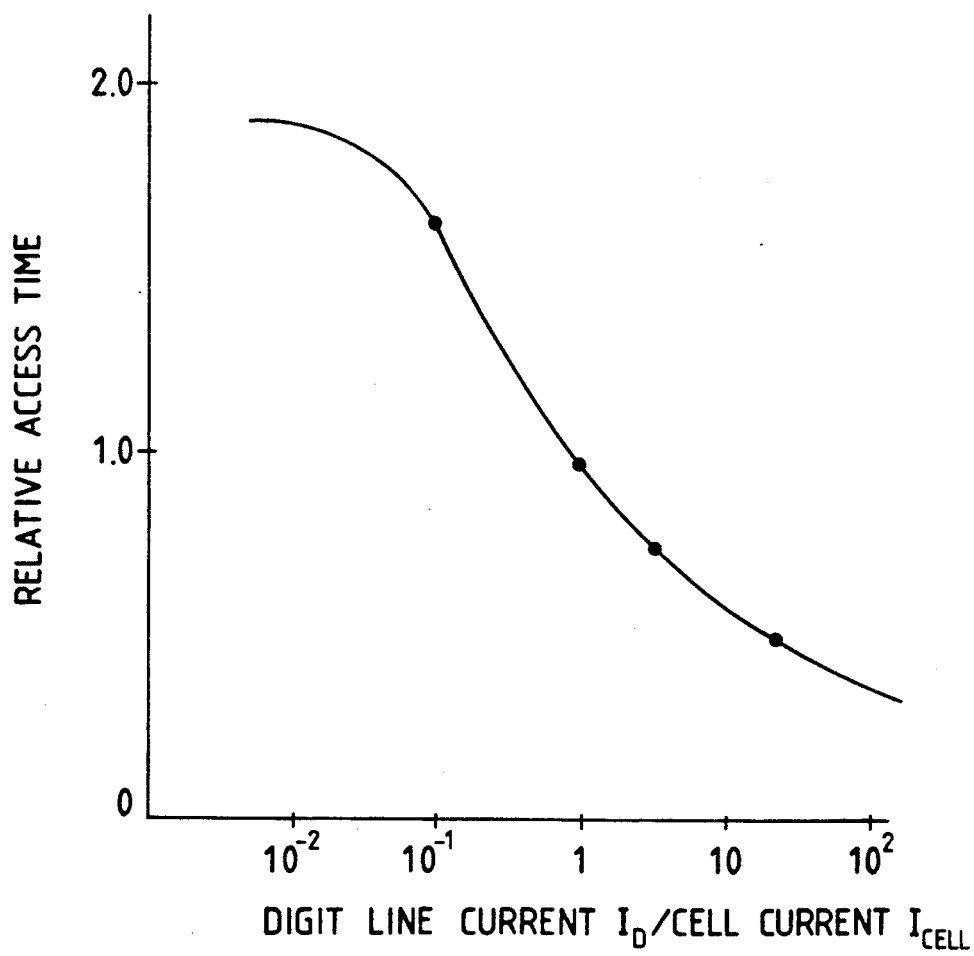
FIG. 42B is a diagram showing the influences of the BIT line current upon the access time.
Figure 42A:
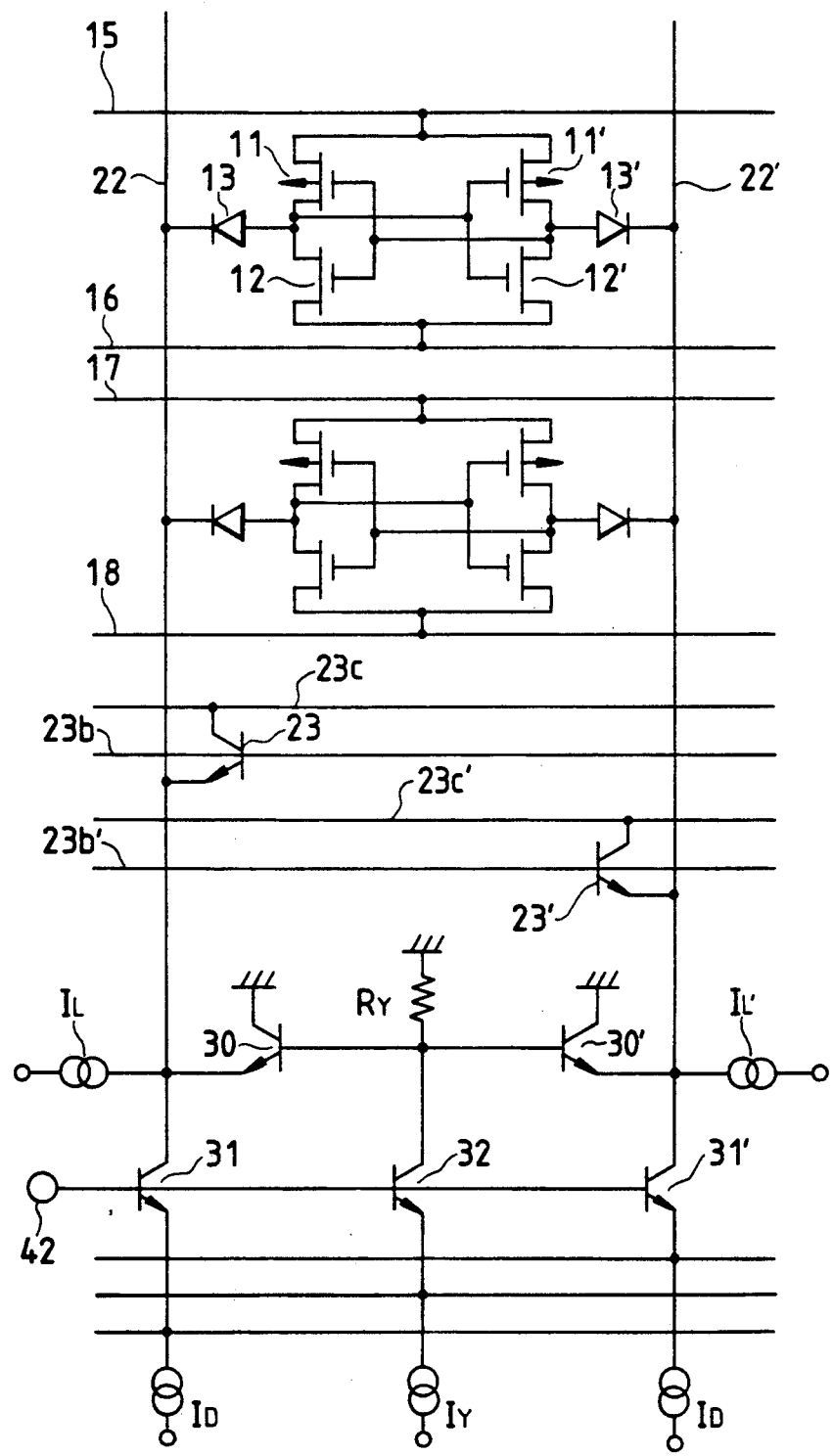
FIG. 42A is an enlarged diagram showing a major portion of FIG. 34A.

Since the upper and lower word lines 15 and 16 are driven to have a substantially constant potential difference (a) of 1.8 V, as shown in FIG. 35B, the potential of the lower word line 16 selected is −4.4 V. As a result, a voltage of 0.5 V is applied between the source and drain of the n-MOS 12' in the ON state so that a constant current of about 0.1 mA flows. This current flows out through the diode 13' and the transistor 23' from the resistor 24' (the loads 24 and 24' are of resistors although they are n-MOSes in FIG. 35A). If, in this instance, a suitable current ID equal to or larger than the reading current flows through the data/BIT lines 22 and 22', the current difference when the transistors 23 and 23' are ON and OFF is reduced so that the potential on the BIT lines hardly fluctuates. For example, the amplitude (b) of the BIT lines can be set at about 7.5 mV, as shown in FIG. 35A. Incidentally, the larger current ID can increase the speed but the power consumption is more. For this, the current difference circuit may be used, as shown in FIG. 34A or 42A. Since, on the other hand, the collector voltage of the ON n-MOS transistor 12 is −2.6 V (equal to the voltage of the upper word line 15), the diode 13 is not rendered conductive. As a result, the current from the memory cell will not flow to the resistor 24. Thus, the current from the memory cell flows to either of the resistors 24 and 24' in accordance with the information stored in the memory cell so that a difference (of about 50 mV) is the sense output voltage drop LC, as shown in FIG. 35A. This difference is amplified by the differential preamplifier composed of the transistors 25, 25' and 26 and is outputted (at about 250 mV) to common sense lines 25c and 25c', at (d) in FIG. 35A.

The feed of the output of a BIT line to the common sense line is accomplished by feeding the output (which takes the high level for only the selected one whereas the remainder are at the low level) of the BIT line decoder to the base of the transistor 26 so that the current may flow through only the differential amplifier of the BIT line selected.

As is now seen from the description thus far made, the potential of the BIT line having a heavy load is fluctuates little, when it is to be read out, to provide a quick response. The potential fluctuations are large at the collectors of the transistors 23 and 23' or the collectors of the transistors 27 and 27' (shown in FIG. 35A), but their nodes have light loads so that the high-speed operations can be attained.

In the reading operations thus far described, the reading current is fed to all the memory cells connected to the selected word line. However, what is actually read out is only one memory cell. If, therefore, the read current is fed to only one memory cell selected, it is possible to spare the useless power consumption. For this, the base voltage of the sense transistors of the BIT lines left unselected may be dropped. For example, only one memory cell selected can be fed with the current, if the sense transistors of the 23 and 23' have their base voltages at −2.4 V whereas all the transistors of the remaining BIT lines have their base voltages at −3.6 V.

With this structure, however, a discharge current higher by one order or more than the read current will flow and take a considerable time period until it settles, when the BIT lines are switched from their unselected to selected states, namely, when the base voltages of the transistors 23 and 23' are switched from the low to high level to raise the BIT lines at a high speed. Since this current flows through the sense transistors 23 and 23', a remarkably high voltage appears in their collectors. The prevention of those transistors from being saturated can be effected by clamping the collectors. Despite this fact, however, the reading has to wait till the transient large current settles. This raises a defect that the reading speed (accordingly the writing speed) is increased although the power consumption is dropped.

Like the reading operation, the writing operation is accomplished by selecting the word lines and by applying a voltage having a level according to the writing information to the bases of the sense transistors 23 and 23' belonging to the BIT lines for the writing operations. In order to invert the state in which the transistors 12' and 11 are ON whereas the transistors 12 and 11' are OFF, as shown in FIG. 35A, it is sufficient to set the base voltage of the transistor 23' at −1.2 V. At this time, the BIT line 22' takes the level of −1.95 V so that the drain of the transistor 12', i.e., the gates of the transistors 11 and 12 are forcibly raised to −2.7 V. As a result, the transistor 12 is forcibly turned ON whereas the transistor 11 is forcibly turned OFF. As a result, the drains of the transistors 11 and 12, i.e., the gates of the transistor 11' and 12' are dropped to −4.4 V so that the transistor 11' is turned ON whereas the transistor 12' is turned OFF, thus effecting the writing operations. At this time, the base voltage of the transistor 23 may be at the same level of −2.4 V as that of the reading operation. However, the base voltage of the transistor 23 may be dropped to invert the bias of the diode 13 to prevent the current from flowing through the diode 13 to the transistor 12 being turned ON thereby to have the collector voltage dropped (namely, the writing operation is obstructed and retarded). For this, the base voltage of the transistor 23 may be set at −3.6 V.

In memory cell of FIG. 39, as has been described hereinbefore, the contradiction between the reduction in the power consumption and high speed makes it difficult to construct a large capacity memory which can operate at a high speed with a low power consumption.

FIG. 41 is a diagram showing one embodiment of the memory cell which has the constant-current drivability suited especially for the present invention. This memory cell is constructed of: a flip-flop composed of two p-MOSes 11 and 11' and two n-MOSes 12 and 12'; and diodes 13 and 13' for coupling BIT lines 22 and 22'. This circuit is characterized in that the polarities of connecting the diodes 13 and 13' are inverted from those of the circuit of FIG. 39 such that the flop-flop side is positive whereas the BIT line side is negative. The capacitors, as indicated by broken lines, are used to improve the immunity from the a induced soft errors or to speed up the operations and may be omitted, if unnecessary. On the other hand, the diodes 13 and 13' may be exemplified by any diodes such as the SBD (i.e., Schottky barrier diodes) or polysilicon diode made of polycrystalline silicon, the latter are especially suitable for reducing the size of the memory cell, because the polysilicon diodes could be formed in small sizes over the MOS transistors or the isolation areas.

In FIG. 34A, each memory cell 21 is shown in FIG. 41, and is connected with the BIT lines 22 and 22' through the diodes 13 and 13' of FIG. 41. The BIT lines 22 and 22' are connected with the emitters of the sense and write bipolar transistors 23 and 23'. These bipolar transistors 23 and 23' have their collectors connected commonly with the collectors of similar transistors of other BIT lines through data lines 23c and 23c'. The signal, read out as the current difference at the data lines 23c and 23c', is converted through the bipolar transistors 27 and 27' into a potential difference signal at resistors 28 and 28'. The load resistors 28 and 28' may be replaced by MOS transistors. In case the loads are made of the MOS transistors, these transistors will fluctuate like those of the memory cell, even if the gate width is changed, so that a substantially constant signal amplitude can be achieved.

The outputs from the collectors of the transistors 27 and 27' are applied to a sense amplifier 40. The outputs of the sense amplifier 40 are fed to an output circuit (not shown). Blocks, as designated at 41, are drivers (as will be specified hereinafter) of the word lines.

In FIG. 34A, for both the reading and writing operations, BIT line transistors 30, 30', 31, 31' and 32 are employed. The transistor 32 may always be selected for the reading operation and only the writing BIT lines transistors 31, 31' may be selected for the writing operations. With this structure, the reading operation can be speeded up and the reading and writing current sources $I_D$ and a Y-Selection current source $I_Y$ can be switched, as shown, by the transistors 31, 31' and 32.

Instead of the constant current sources shown, resistors may connect the individual emitters of the transistors 31, 31' and 32 with a suitable voltage source. If, in this case, a high voltage is applied to feed a current only to the base of the transistor corresponding to the BIT line selected, then the current will flow to only the selected BIT line.

Figure 34B:
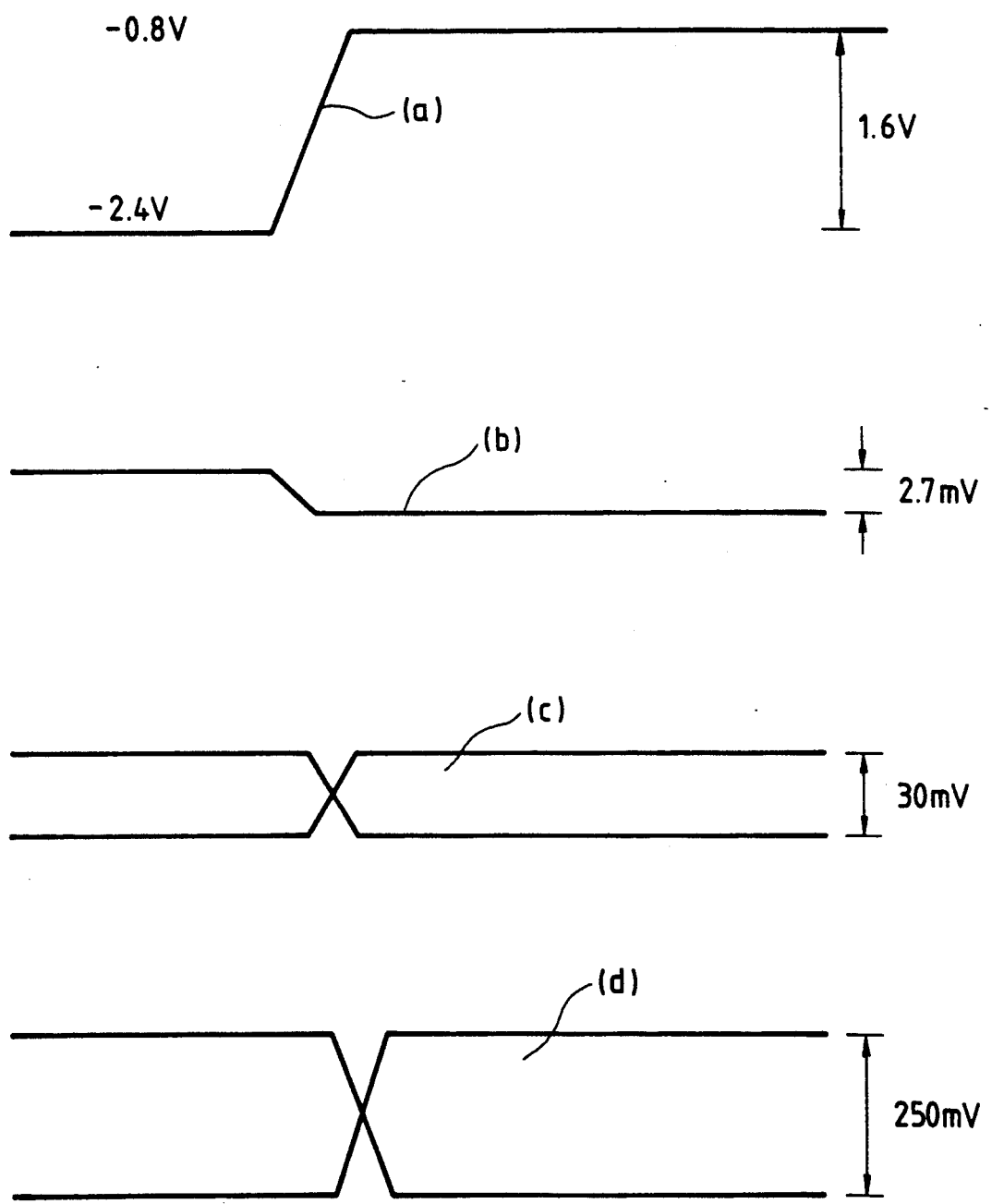
FIG. 34B is a waveform chart of a synchronized showing of waveforms of the operation of the major portions of FIG. 34A.

The fundamental operations of the memory of FIG. 1A will be described with reference to FIG. 42A and waveforms in FIG. 34B.

In FIG. 42A, the power supply voltage $V_{cc}=0$ V and $V_{EE}$ 5.2 V. In case the word lines 15 and 16 are selected, the voltage at the upper word line 17 in the unselected state is set at −2.4 V, and the voltage of the upper word line 15 in the selected state is set at −0.8 V. As a result, the waveform (a) in FIG. 34B is applied to the upper word line. Moreover, the forward voltage VF of the diodes 13 and 13' and the base-emitter voltage $V_{BE}$ of the transistors 23 and 23' are set at 0.75 V.

In the reading state, the sense transistors 23 and 23' have their bases fed with −1.3 V, for example. In the memory cell connected with the selected word line 15, it is assumed that the n-MOS 12' and p-MOS 11 are ON whereas n-MOS 12 and p-MOS 11' are OFF. At this time, the BIT line 22 is at −2.05 V, and the drain of the p-MOS 11 is at −1.3 V. Since the upper and lower word lines are always driven to have a potential difference of 2.0 V, the potential of the selected word line 16 is at −2.8 V. As a result, a voltage of 0.5 V is applied between the source and drain of the p-MOS 11 in the ON state to establish a current of about 0.1 mA (which is different depending upon the characteristics and the drain-source voltage of the MOS transistors), for example. This current flows through the diode 13 to the BIT line 22.

If the current source $I_D$ is 1 mA (which can be drastically changed according to the design), the reading transistor 23 is fed with a current of 1 mA−0.1 mA=0.9 mA. Upon the reading operation, the potentials (b) of the BIT lines fluctuate for the current change as small as about 3 mA (namely, the potential fluctuations will become less if the current $I_D$ is more than 1 mA), as shown in FIG. 34B. Since the drain voltage of the p-MOS 11' at the OFF side is at −2.8 V (equal to the voltage of the lower word line 16) the diode 13' is not rendered conductive. As a result, the current of $I_D=1$ mA will flow to the transistor 23'. This current difference is read as the sense output, as shown at (c) in FIG. 34(B), as the difference in the voltage drop at the resistors 28 and 28' of FIG. 34A. Since the voltage drops at the resistors 28 and 28' become different in accordance with the information stored in the memory cell, as has been described, the difference is amplified, to provide the preamplifier 40 output (d) in FIG. 34B.

The feed of the output of a BIT line to the common sense lines 23c and 23c' is accomplished by feeding the output of the Y-decoder high for only the selected BIT line, whereas the remainder Y-decoder outputs are at the low level to a Y-selection line 42 so that the current ID may flow through only the BIT line selected.

The present invention is different from the bipolar memory of the prior art. The memory cells of the prior art have the constant voltage drivability so that the current $I_D$ (the reading current in the bipolar memory) is selected wholly or never fed from the memory cells. Even if memory cells having constant current characteristics are used, what is fed to the sense circuit is substantially coming from the memory cells. In the present invention, however, the current $I_D$ is larger than the cell current, noting that the current from the memory cells has no relationship to the current $I_D$ because the memory cells have the constant current drivability. In the present invention, the current to flow out from the memory cells is far smaller than the current $I_D$ so that the current to flow through the sense transistor is slightly larger or smaller than the cell current. Therefore, the BIT lines are switched at a high speed from the unselected to selected states (namely, the current $I_D$ is wholly used for the discharge). Although a small current flows for the reading operations, the amount of current to be switched is so small that the BIT lines are hardly changed (e.g., as low as several mV, as shown at (b) in FIG. 34B) to effect a very-high speed operation even with a small current. Thus, for the high speed the BIT line current is larger than the memory cell current, as exemplified by the relation of the access time to the ratio of the BIT line current to the cell current in FIG. 42B. It is found for the cell current of 100 μA that the access time is dropped to 1/5 or less of its former value when the current is changed from $I_D=1$ μA ($I_D/I_{cell}=1/100$) to $I_D$=several mA ($I_D/I_{cell}$=several tens). Here, the writing is likewise speeded up. These results can be achieved with the present invention where the bi-polar peripheral circuit and the memory cells having the constant current drivability are combined to feed the sense circuit with a current larger than the memory cell current.

Moreover, the current is fed to the transistor 32 of the selected BIT line so that the potential of the BIT line can be dropped. Since the unselected BIT line is held at a high potential by transistors 30 and 30', no information is read out from the memory cells.

Incidentally, current source $I_L$ is a leak current source for deciding the potential of the BIT line.

Because of less potential fluctuations of the BIT lines, the present embodiment enjoys a higher speed than that of the memory of FIG. 35A.

In the reading operations thus far described, only one memory cell selected is read out. This system is suited for low power consumption because less current will flow through the memory cell being read out. In the circuit shown in FIG. 43, however, it is possible to read out all the memory cells that are connected to the selected word lines.

Figure 43:
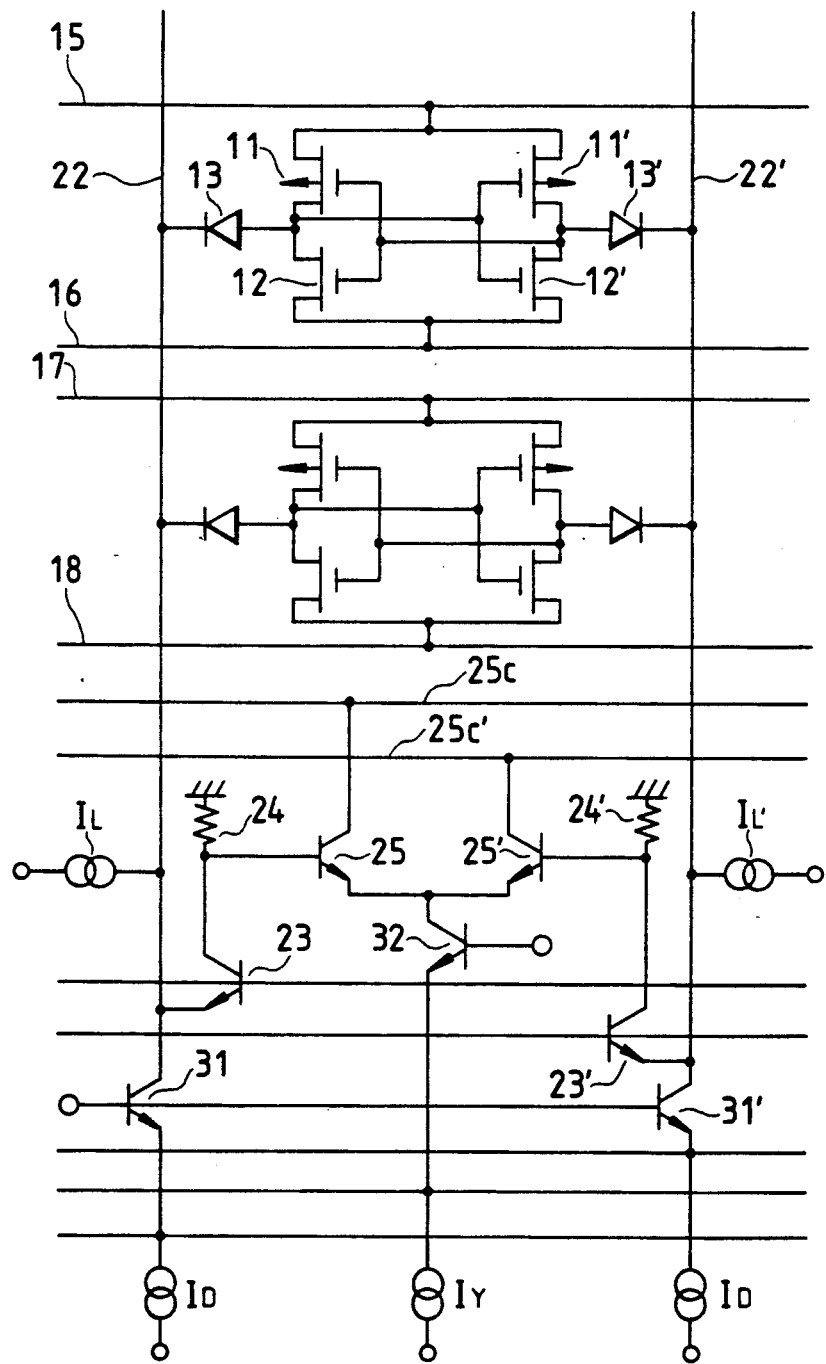
FIG. 43 is a circuit diagram showing one embodiment of the semiconductor memory of a different reading type.

In FIG. 43, the current switching transistors 31 and 31' have their bases fed with the same voltage as that of the reading operation. As a result, the common current $I_D$ is fed to all the BIT lines 22, 22' so that all the memory cells connected to the selected word lines are selected. What is actually read out of the selected plural memory cells is information on the BIT line having the high level applied to the base of the transistor 32. In the case of the writing operation, the high level is applied to only the bases of the transistors 31 and 31' of the selected BIT lines so that only the selected memory cells are written. In this embodiment, it is possible that only the bases of the transistors 31 and 31' selected in the reading operation are raised to the high level to feed the read current to only one memory cell. If, however, the selection and sense of the row are accomplished by the common transistor 32, the discharge current flows to the sense transistor 23, 23' so that the reading operations are retarded like the case of FIG. 35A.

For the writing operation, according to the embodiment of FIG. 42A, the voltage having a level according to the write information is applied to the bases of the sense transistors 23 and 23' belonging to the BIT lines to be written, simultaneously with the selection of the word lines like the reading operations. In FIG. 42A, consider the case where the base voltage of the transistor 23 is set at −2.8 V, and the transistors 12' and 11 are ON, whereas the transistors 12 and 11' are OFF. As a result, the drains of the transistors 11 and 12, i.e., the gates of the transistors 11' and 12' are dropped at a high speed to −2.8 V to invert the information of the memory cells. On the other hand, the base voltage of the transistor 23' is at the same level of −1.3 V as that for the reading operation. In order to prevent the current from flowing from the ON transistor 11' to the diode 13' to obstruct the rise in the collector voltage of the transistor 12' (namely, to obstruct and retard the writing operation), the base voltage of the transistor 23' may be raised to invert the base of the diode 13'. For this, the base voltage of the transistor 23' may be set at −0.8 V.

In the description of the embodiment thus far made, the upper word line and the lower word line are changed generally in parallel, but only the upper word line may be changed while the lower word line may have its potential fixed at a suitable constant level. In this case, the circuit structure is simplified, but the writing time is elongated.

In the embodiment thus, the semiconductor memory of FIG. 34A used the memory cell of FIG. 41. However, the memory cell having the constant current drivability to be used in the semiconductor memory of the present invention may be modified, as will be described in the following.

Figure 44:
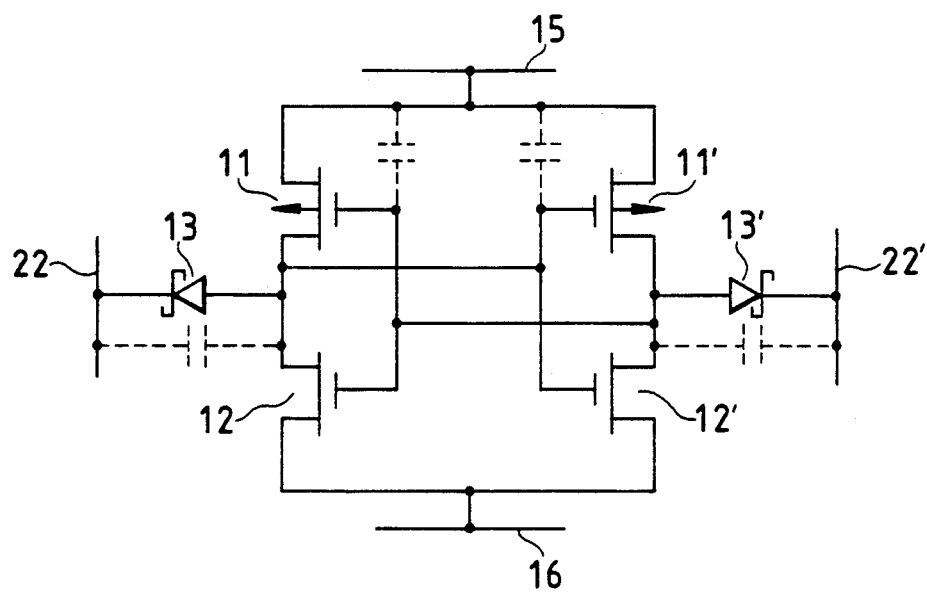
FIGS. 44(a) and (b), 45(a) and (b), 46(a) and (b), 47(a) and (b), and 48(a) and (b) are circuit diagrams showing other embodiments of the memory cell of the present invention, respectively.
Figure 44:
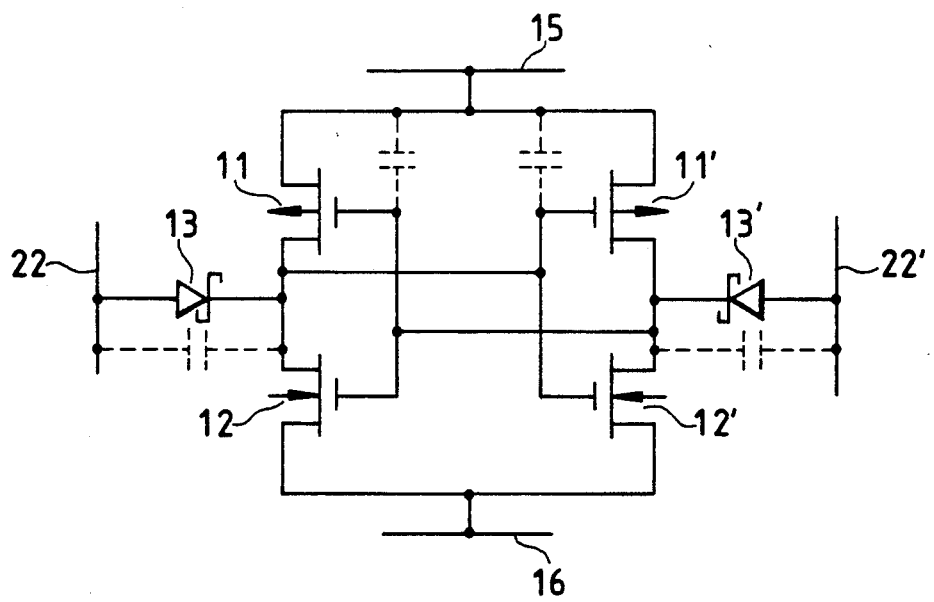

FIG. 44(a) shows a memory cell to be used in the semiconductor memory of FIG. 34A; and FIG. 44(b) shows a memory cell to be used in the semiconductor memory of FIG. 35A. Specifically, the coupling diodes 13 and 13' have the same polarity in FIG. 44(a) as that of FIG. 41 and in FIG. 44(b) as that of FIG. 39. The coupling diodes 13 and 13' are SBDs (i.e., Schottky Barrier Diodes). Since the SBDs have a low forward voltage $V_F$, the supply voltage can be lowered accordingly. In order to reduce the size of the anode of the SBD together with the drain layer of the MOS, the SBD may desirably be formed between p-type silicon and the electrode.

Next, FIG. 45(a) is a memory cell to be used in the semiconductor memory of FIG. 34A; and FIG. 45(b) is a memory cell to be used in the semiconductor memory of FIG. 35A. Specifically, the coupling diodes 13 and 13' have the same polarity FIG. 44(a) as that of FIG. 41 and in FIG. 44(b) as that of FIG. 39. The loads of the flip-flop are the resistors 17 and 17' used for the n-MOSes 12 and 12' in FIG. 45(a), and for the p-MOSes 11 and 11' in FIG. 45(b). The aforementioned resistors 17 and 17' are usually made of polysilicon to reduce the size of the memory cells.

Figure 46A:
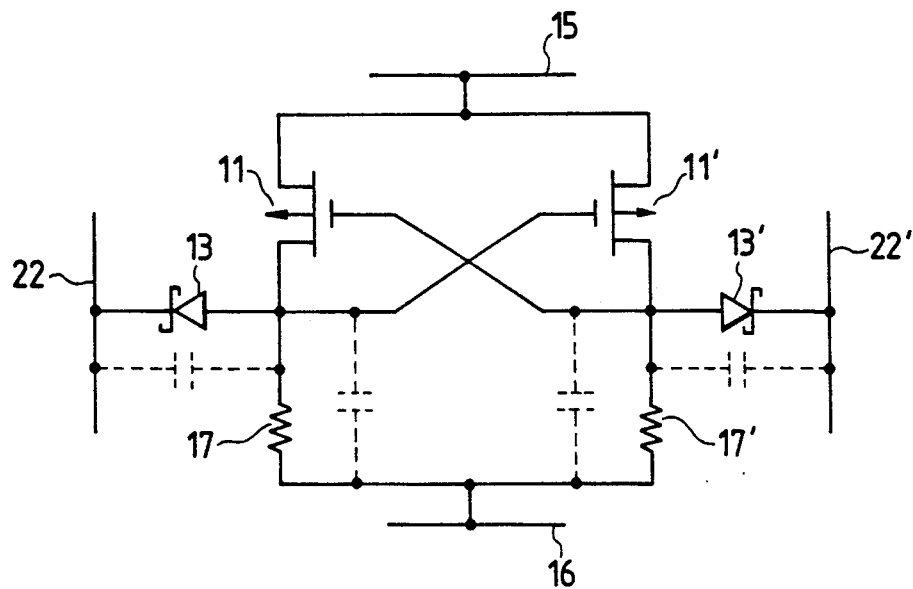
Figure 46B:
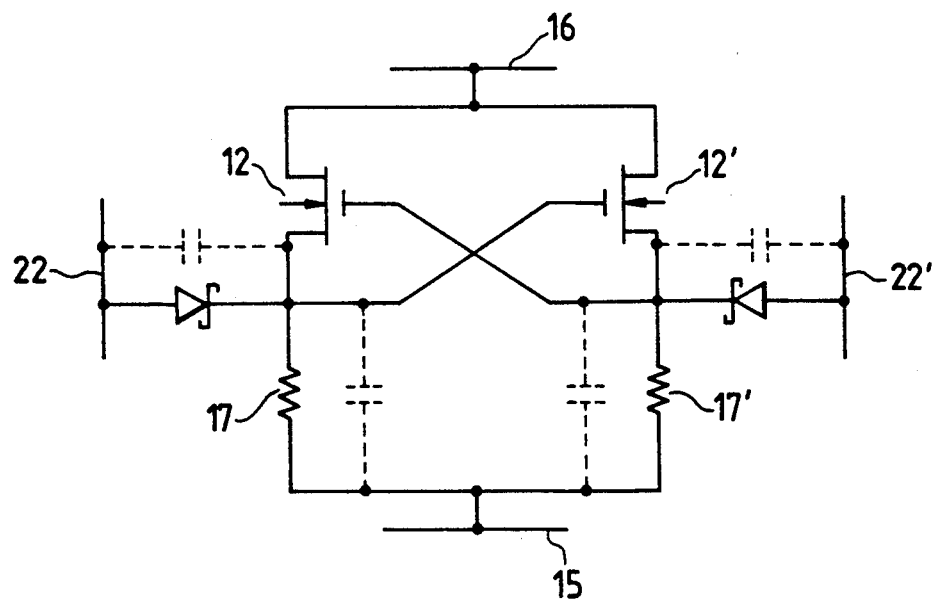

Next, FIG. 46 is different from FIG. 45 only in that the junction diodes of FIG. 45 are replaced by the SBDs.

Figure 47A:
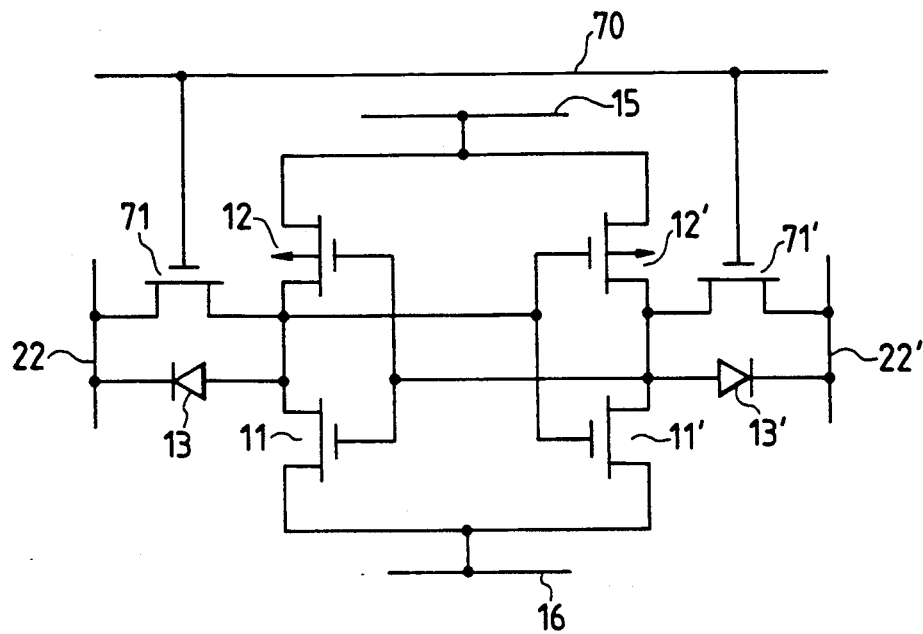
Figure 47B:
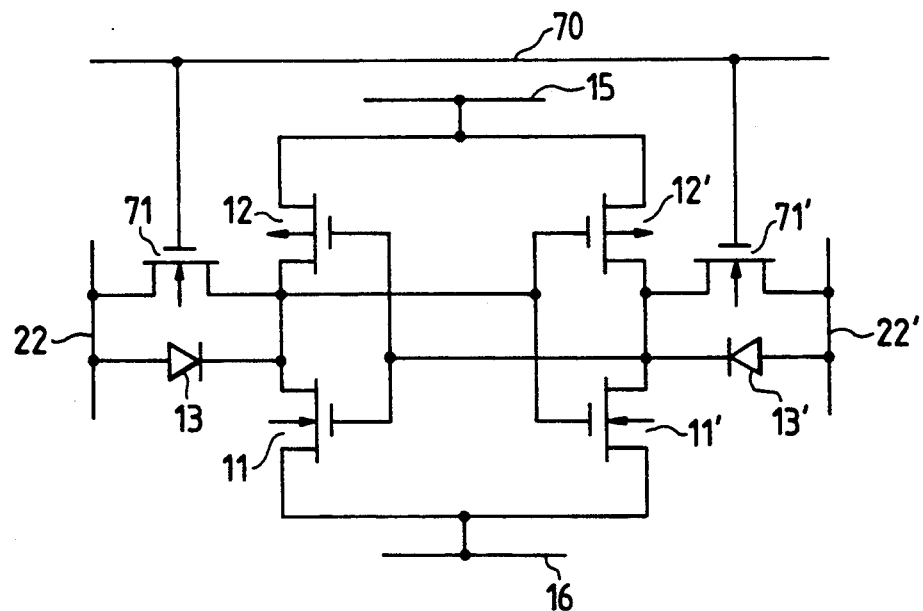

Next, FIG. 47 shows a modification in which MOS transistors 71 and 71' are connected in parallel with the coupling diodes 13 and 13'. FIG. 47(a) is a memory cell to be used in the semiconductor memory of FIG. 34A, and FIG. 47(b) is a memory cell to be used in the semiconductor memory of FIG. 35A. Specifically, the coupling diodes 13 and 13' have the same polarity in FIG. 47(a) as that of FIG. 41 and in FIG. 47(b) as that of FIG. 39.

In FIGS. 47(a) and (b), a word line 70 takes the selection level when in the writing operation. In the memory cell of FIG. 34A, the diode 13, for example, is rendered conductive when in the writing operation so that the drains of the transistors 11 and 12, i.e., the gates of the transistors 11' and 12' are abruptly dropped to the low level. On the other hand, the gates of the transistors 11 and 12 are raised to the high level by the p-MOS 12' which is turned ON. This rise of the voltage is aided by an n-MOS 71' so that the writing speed is accelerated in the memory cell of this embodiment.

Figure 48A:
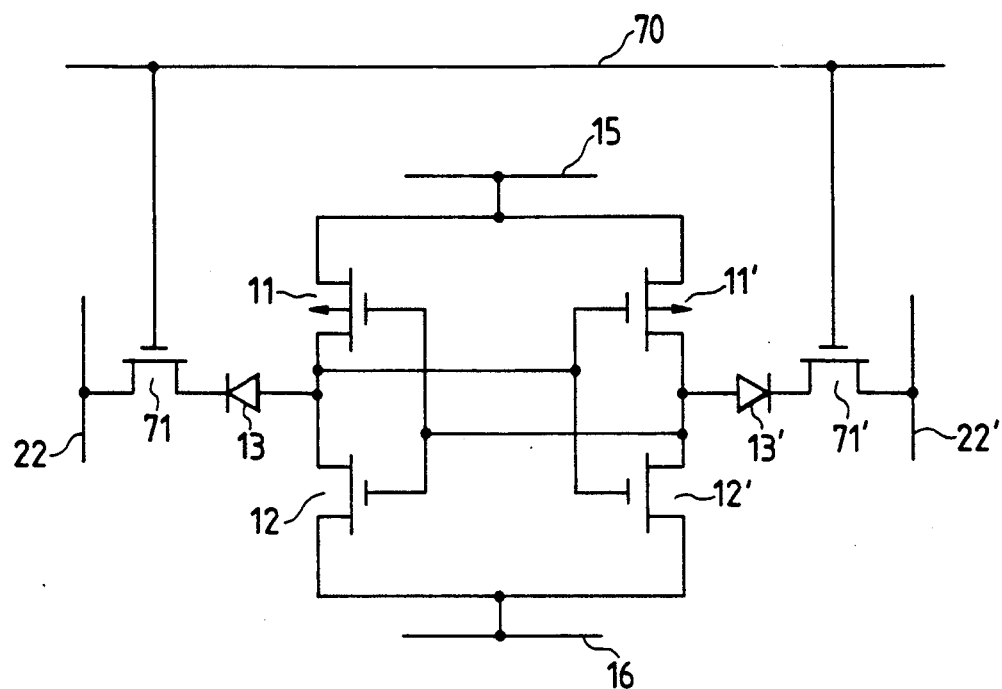
Figure 48B:
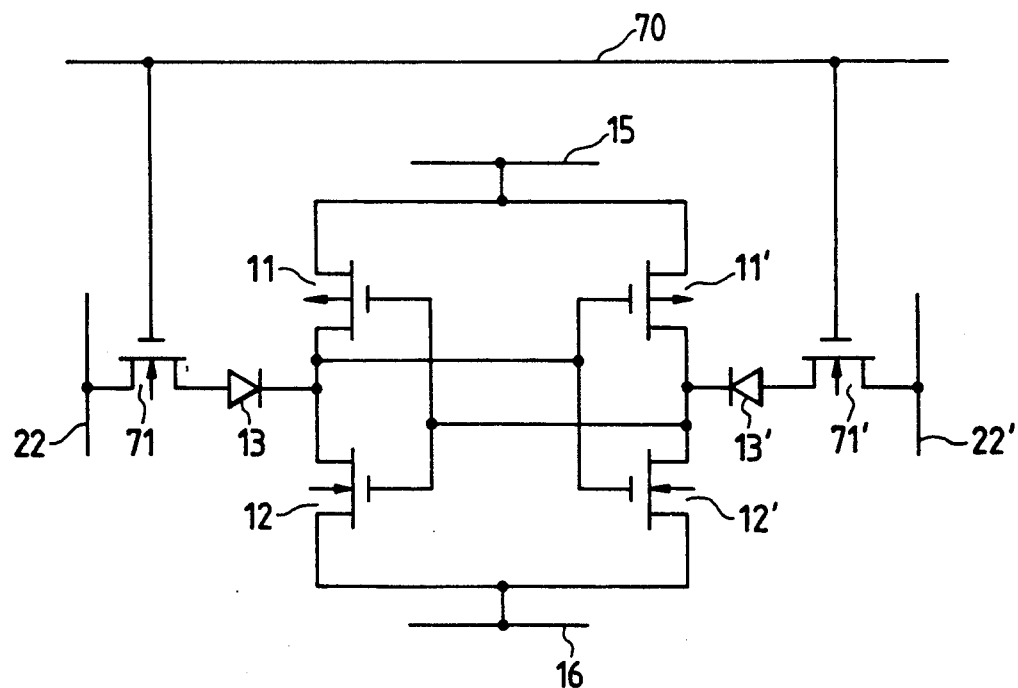

Next, FIGS. 48(a) and (b) show MOS transistors 71 and 71' connected between the coupling diodes 13 and 13' and the BIT lines 22 and 22'. A memory to be used in the semiconductor memory of FIG. 1A is in FIG. 48(a), and a memory to be used in the semiconductor memory of FIG. 35A is shown in FIG. 48(b). Specifically, the coupling diodes 13 and 13' have the same polarity in FIG. 48(a) as that of FIG. 41 and in FIG. 48(b) as that of FIG. 39. Since the selection of the memory cells is accomplished by the word line 70 selecting MOS transistors 71 and 71', the word lines 15, 16 may be the voltage supply lines. Since, the word lines 70 drive the gates of the MOS transistors 71, 71', the flip-flop loads can be lightened to achieve the high-speed operations.

The other operations of the memory cells of the embodiments of FIGS. 47(a), (b) and 48(a), (b) are similar to those of the memory cells of FIG. 41. Thus, it is unnecessary to limit the ratio of the gate widths of the coupling MOSes of the CMOS cells and the transistors composing the flip-flops of the memory cells, which was necessary in the prior art.

In the embodiments of FIGS. 47(a), (b) and 48(a), (b), the coupling diodes 13 and 13' can be any kind of diodes such as the SBDs or the polysilicon diodes.

Figure 49A:
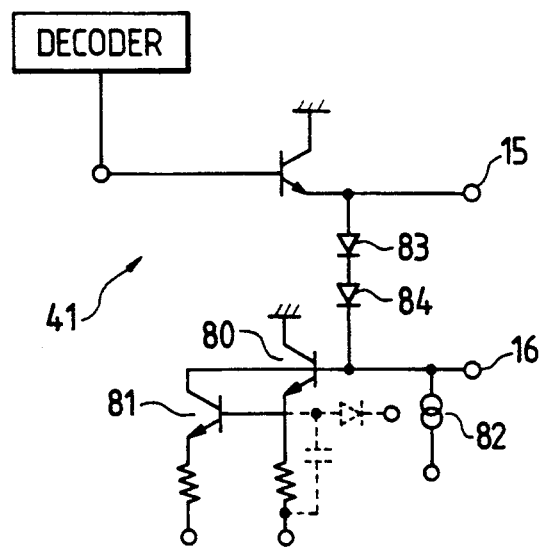
FIGS. 49(a) and (b), and 50 are circuit diagrams showing other embodiments of the drive circuit.

Next, FIGS. 49(a) and (b) drivers 41 suited for driving the upper and lower word lines 15 and 16 of FIG. 34. In FIG. 49(a), the potential difference between the upper word line 15 and the lower word line 16 is established by the voltage drop between two diodes 83 and 84. Two transistors 80 and 81 connected to the lower word line 16 constitute a discharge circuit for speeding up the voltage drop of the word lines. Constant current source 82 supplies a small current to be fed to the unselected word line. The capacitor and the diode, as indicated by broken lines, are used for increasing speed and may be omitted, if unnecessary.

Figure 49B:
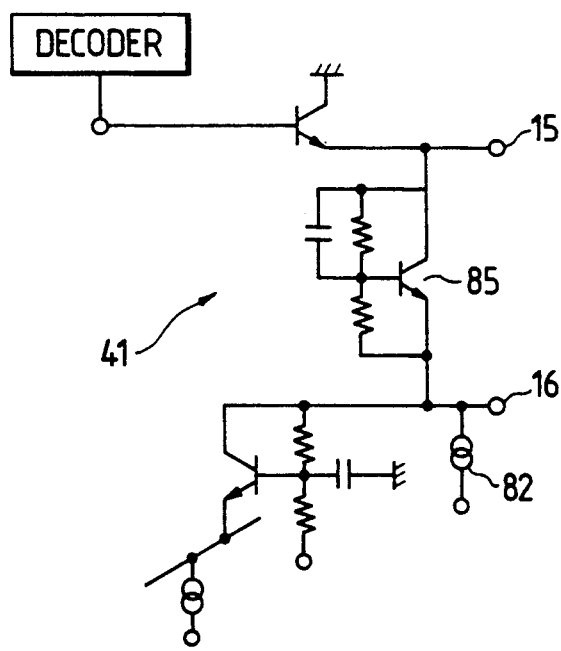

FIG. 49(b) shows a circuit like FIG. 49(a), but the level shift is accomplished by a transistor 85 and resistors. Moreover, the discharge circuit is different from that of FIG. 49(a) but has similar operations.

Figure 50:
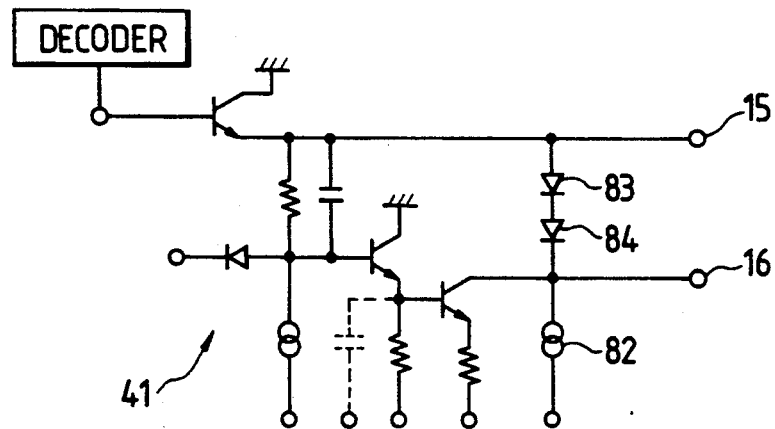

Next, FIG. 50 shows another embodiment of the word line drive circuit 41. This drive circuit is different in the discharge circuit from the circuit of FIG. 49(a) but has similar operations.

Incidentally, the drive circuit of the prior art can be used to drive only the upper or lower word line, in case the gate of the MOS transistor is to be driven.

In the embodiments of the present invention, the memory cell area can be made smaller than that in the coupling MOS transistors if polysilicon diodes or SBDs of polysilicon are used as the coupling diodes 13 and 13'.

In the embodiments, e.g., FIG. 34(a) and of FIG. 41d, the capacitors are shown by broken lines as one example of the counter-measures for the soft errors. For the high-speed operations with the addition of such capacitors, however, the gate width of the MOS transistors has to be increased to enlarge the memory cell area. In order to realize a small-sized memory cell sufficiently strong against the soft errors without any addition of the capacitors, countermeasures other than the capacitors are taken in the present invention. In case a p-substrate 104 is used, for example in FIG. 51, the p-MOS is formed in the n-well so that the noise charges established in the substrate will not migrate to the transistor portion. Since the n-MOS is usually formed in the p-substrate, on the other hand, the noise charges established by the $\alpha$-rays in the substrate will migrate to the transistor portion. As the case may be, therefore, it is necessary to form a p+-layer below the n-MOS or an n+-layer below the n-MOS to insulate the p-well from the substrate, or an insulating layer below the MOS transistor.

Figure 51:
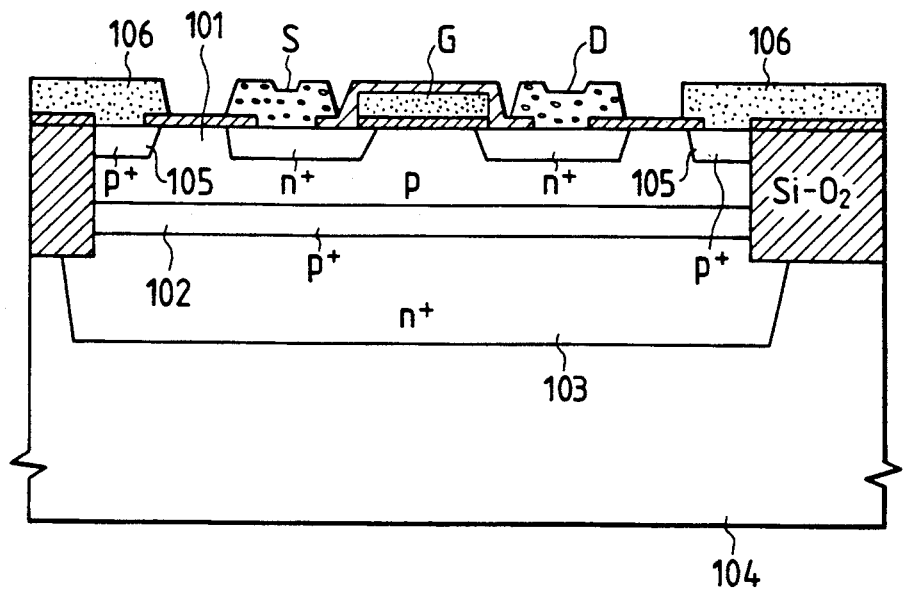
FIGS. 51 and 52 are cross-sections showing the embodiments of the MOS transistor with counter-measures for noise prevention.

FIG. 51 is a section showing one embodiment of the MOS transistor to which the aforementioned counter-measures for the noises are taken. The embodiment is exemplified by an n-MOS transistor, which has a p-layer 101 constituting the transistor underlaid by p+-layer 102 and an n+-layer 103 to prevent the $\alpha$-rays from being generated in the p substrate 104.

In this structure, the p-layer 101 is fed with a suitable potential through a p+-layer 105 by a polycrystalline silicon 106. Moreover, the noise charges generated in the p substrate 104 by the $\alpha$-rays are shielded by the n+-layer 103 so that they fail to reach the drain D and source S of metallic connections and n+ layers. The gate G is of polycrystalline silicon. $SiO_2$ is used as an insulator.

Figure 52:
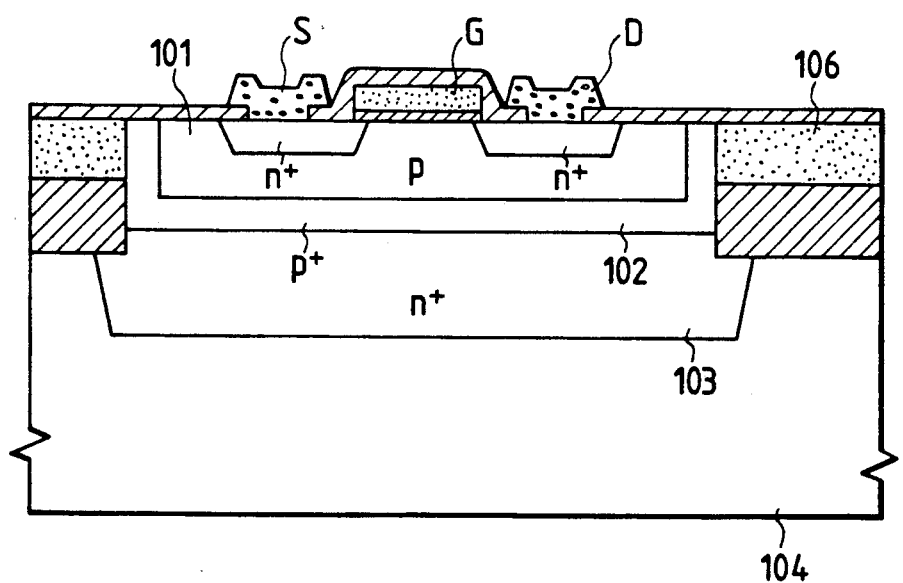

Next, FIG. 52 is a section showing another embodiment of the MOS transistors having the countermeasures for the noise prevention. This embodiment is also exemplified by the n-MOS, in which the lead electrode 106 of the p+-layer 102 is led out from the side of the silicon area so that the transistor can be formed in a small area.

Figure 53:
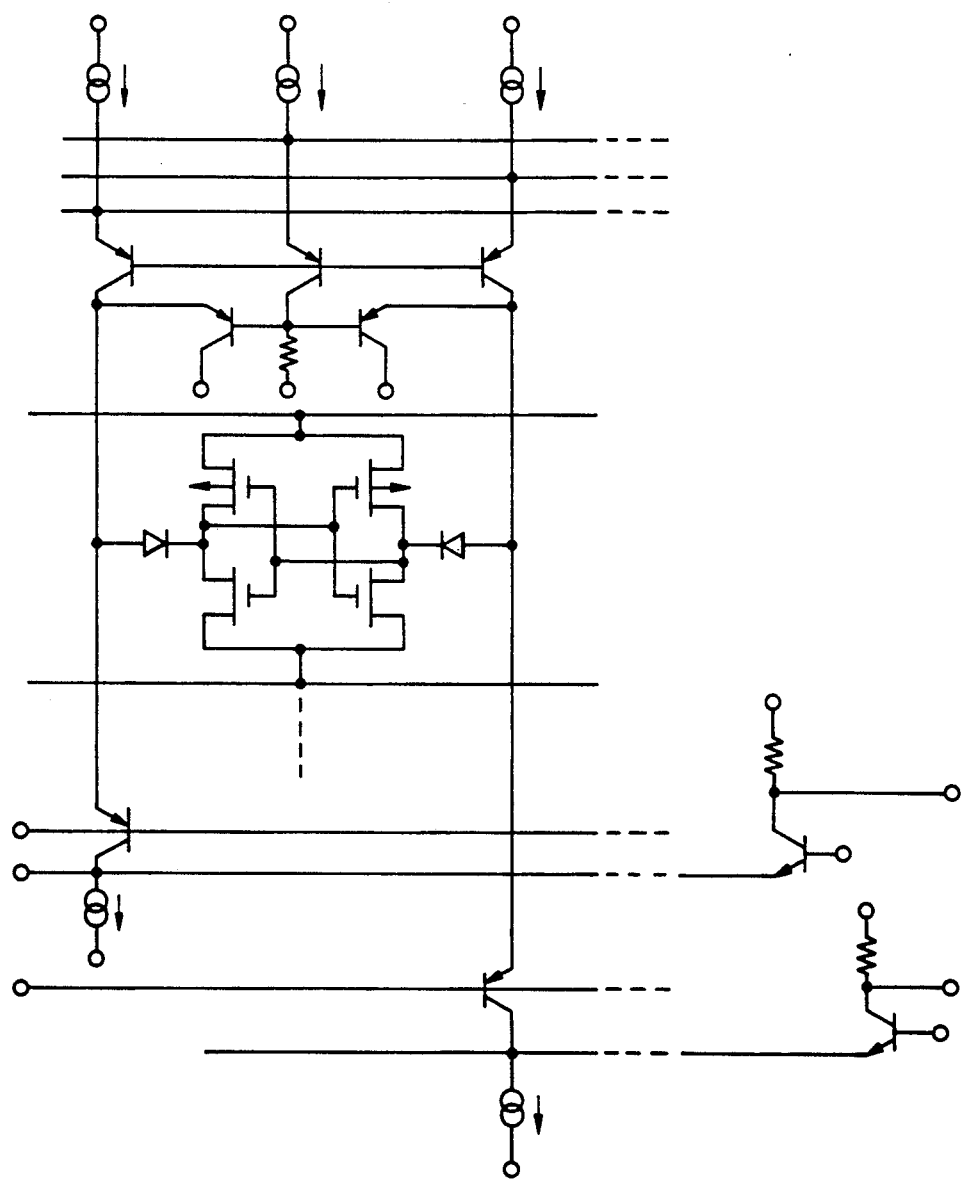
FIG. 53 is a circuit diagram showing one embodiment of the semiconductor memory using pnp transistors.

In the description thus far made, the present invention has been exemplified only by using an npn transistor as the bipolar transistor. FIG. 53 is a diagram showing one embodiment in which the pnp transistors are used. If the pnp transistors are used, as shown in FIG. 53, the same operations as those of the embodiment of FIG. 34 can be accomplished by using the memory cell of FIG. 39. The operations of the embodiment of FIG. 53 have been described because they are similar to the ones of FIG. 34. It is considerably difficult to fabricate the pnp transistors of high performance.

The present invention has been described in connection with its embodiments in which the MOS transistors are used in the memory cells, because the memory cells of the constant current drivability can be produced easily in small sizes. Even if the bipolar transistors were used for the memory cells, it would not be absolutely impossible to construct the memory cells with constant current drivability, although the circuit structure would be considerably different from that of the prior art. However, it is generally impossible to avoid the disadvantage that the bipolar memory cell area is larger than the MOS memory cell.

The present invention has also been described in connection with its embodiments in which the specific peripheral circuits are used for driving the memory cells. The peripheral circuits to be used in combination with the memory cells of the present invention should not be limited to specific ones of the embodiments. In order to make use of the low power consumption of the memory cells of the present invention, the high speed and the low power consumption are advantageously compatible if the peripheral circuits used are the B-CMOS circuit using the bipolar transistors and the MOS transistors in combination. It is possible to construct the peripheral circuits wholly of the bipolar transistors for the highest speed and of the MOS transistors in case the speed is not so important.

According to the present invention, the super-high speed, which could not be obtained without the bipolar transistors in the prior art, can be realized by the MOS cells of very small area so that the memories of higher speed and larger capacity than the prior art can be realized. In order to cause the large-capacity memory to exhibit its performance sufficiently, it is desirable to lay the logic circuits over the common chip, thereby to give a high performance to the chip. This object can be properly achieved by the present invention because the super-high speed memory of the present invention has such a small area as to support the logic circuits sufficiently.

In the present invention, it is possible to fabricate a memory of large capacity and super-high speed with a small area. Thus, very high merits can be attained if the present invention is applied when an LSI chip is to be constructed by arranging the logic circuit and the memory circuit in the common chip.

Both high speed and low power consumption can be achieved simultaneously by the invention which comprises: a memory cell array having a constant current drivability; and a sense circuit including bipolar transistors having emitters coupled to BIT lines. According to the present invention, a high speed similar to the bipolar memory cells can be realized by the use of a memory cell of constant current drivability using MOS transistors. According to the present invention, therefore, there can be attained the following excellent effects: a speed equal to or higher than that of the bipolar memory cell can be achieved by the memory cells having a size equal to or larger than that of the CMOS or MOS static memory cell; and the memory cells for the current flow can be restricted to one, although they are connected with the selected word lines, so that the memory cell to be constructed can consumer a lower power than that of the CMOS of the prior art.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A semiconductor memory, comprising:
    a memory cell array including a plurality of memory cells having on or off states;
    BIT lines and word lines connecting said memory cells in a matrix;
    means for selecting said BIT lines;
    said memory cells each providing constant cell currents respectively to flow into or out of corresponding ones of said BIT lines in it's on state;
    a sense circuit including a plurality of current source means;
    each of said current source means being connected with a corresponding one of said BIT lines for providing BIT line drive current flowing into or out of said corresponding BIT lines when said one of said BIT line is selected said BIT line drive current being larger than said constant cell current in said corresponding BIT lines to form a superimposed current comprising said BIT line drive current and said constant cell current;
    said sense circuit including a plurality of sense transistors; and
    each of said sense transistors being connected with a corresponding one of said BIT lines for sensing a change of the superimposed current that flows into or out of said corresponding one of said BIT lines from or to said sense transistor, when said change of said superimposed current is corresponding to the on or off state of a corresponding one of said memory cells.

2. A semiconductor memory as set forth in claim 1, wherein said sense circuit has means to add or subtract said BIT line drive current and said constant cell current to obtain said superimposed current,
    and wherein said sense circuit has means that reads out information by sensing the sense current.

3. A semiconductor memory as set forth in claim 2, further comprising a logic circuit, and constructed entirely on a single common chip.

4. A semiconductor memory as set forth in any of claim 2, including peripheral circuits including at least a sense amplifier, an array drive circuit, a decoder circuit and a buffer circuit, and wherein said peripheral circuits are constructed of bipolar transistors.

5. A semiconductor memory as set forth in claim 2, wherein said memory cells include MOS transistors that are one of n-MOSes and p-MOSes, and load devices that are the other of n-MOSes and p-MOSes.

6. A semiconductor memory as set forth in claim 2,
wherein said memory cells are MOS transistors;
including load devices in each of said memory cells
connected between said MOS transistors and one
of said word lines;
wherein the sources of said MOS transistors are connected with the other word lines; and
including coupling means connected between said
MOS transistors and said BIT lines.

7. A semiconductor memory as set forth in claim 2,
wherein one of said word lines is connected with a
constant voltage source.

8. A semiconductor memory as set forth in claim 2,
wherein said sense transistors are bipolar transistors and
said sense circuit has sense outputs respectively at the
collectors of said bipolar transistors.

9. A semiconductor memory as set forth in claim 2,
wherein each of said memory cells includes a flipflop
having at least two cross coupled MOS transistors,
and input/output terminals; and
wherein said MOS transistors have a substrate and
means between said substrate and said transistors
for preventing noise charges from reaching said
tranistors from said substrate.

10. A semiconductor memory as set forth in claim 1,
wherein each of said memory cells includes a flipflop
having at least two cross coupled MOS transistors,
and two input/output terminals;
including two coupling means for connecting said
two terminals with said BIT lines, respectively; and
wherein each of said coupling means has at least one
means providing a voltage drop connected between the drain of a respective one of said MOS
transistors and said BIT lines.

11. A semiconductor memory as set forth in claim 10,
wherein said memory cell MOS transistors are one of
n-MOSes and p-MOSes, and load devices are the other
of n-MOSes and p-MOSes.

12. A semiconductor memory as set forth in claim 11,
wherein said coupling means has MOS transistors with
gates connected with said word lines, and their drains
and sources connected between said terminals and said
BIT lines.

13. A semiconductor memory as set forth in claim 10,
wherein each of said coupling means has MOS transistors with gates connected with said word lines, and
their drains and sources connected between said terminals and said BIT lines.

14. A semiconductor memory as set forth in any of
claim 1, including peripheral circuits including at least a
sense amplifier, an array drive circuit, a decoder circuit
and a buffer circuit, and wherein said peripheral circuits
are constructed of bipolar transistors.

15. A semiconductor memory as set forth in claim 1,
further comprising a logic circuit, and constructed entirely on a single common chip.

16. A semiconductor memory as set forth in claim 1,
further including:
said means for selecting said BIT lines including
switching them from unselected to selected states;
said memory cells each being connected with a pair
of said BIT lines;
each of said memory cells having first means for
feeding said constant cell current as $I_{cell}$ to one of
said BIT lines of said pair in accordance with
stored information when at least said pair of BIT
lines are selected;

said current source means feeding the BIT line drive
current as $I_R$ to the pair of BIT lines switched from
unselected to selected states;
said sense circuit including sense amplifier means
connected to said sense transistors for detecting the
difference between the $I_{cell}$ and $I_R$ currents flowing
in said selected BIT lines to read out stored information, wherein said BIT line drive current $I_R$ and
said cell current $I_{cell}$ have a ratio of $I_R/I_{cell}$ of at
least about 2;
said sense transistors having a pair of bipolar transistors with their emmitter collector paths respectively connected between each pair of BIT lines
and one of said sense amplifier means; and
means for feeding read control signals to the bases of
said bipolar transistors.

17. A semiconductor memory as set forth in claim 16,
wherein the ratio of $I_R$ to $I_{cell}$ is at least about 10.

18. A semiconductor memory according to claim 1,
further comprising:
means for selecting said word lines; and
wherein each of said memory cells includes means for
feeding said cell current $I_{cell}$ to one of said BIT lines
of said pair of BIT lines only when said word and
BIT lines of said memory cell are selected.

19. A semiconductor memory according to claim 1,
further comprising:
said sense circuit including sense amplifier means for
detecting the difference between currents flowing
in said selected pair of BIT lines to read out stored
information, and wherein said BIT line drive current $I_R$ and said cell current $I_{cell}$ have a relation of
$I_R > I_{cell}$ by a ratio of $I_R$ to $I_{cell}$ that is greater than
2.

20. A semiconductor memory according to claim 1,
further comprising:
means for feeding BIT line select signals;
means for feeding word line select signals;
means for feeding read signals;
each of said memory cells including a flipflop having
first and second insulated gate type driver transistors having their gates and drains cross-coupled
with each other, first and second load resistors
each of which has one terminal connected to each
drain of a respective one of said driver transistors
and has another terminal commonly connected to a
common voltage, and third and fourth insulated
gate type transistors coupled to respective BIT
lines;
pairs of bipolar transistors having their emitters connected with said BIT lines, their bases fed with the
read control signals, and their collectors being
means for outputting memory cell information; and
said bipolar transistors have their bases of the same
semiconductor type of conductivity as the channels
of said first and second insulated gate type transistors.

21. A semiconductor memory as set forth in claim 20,
wherein said third and fourth insulated gate type transistors coupled to said BIT lines have a channel type
opposite to said first and second insulated gate type
transistor channels and are respectively coupled as the
loads for said first and second transistors.

22. A semiconductor memory as set forth in claim 1,
wherein said sense transistors are bipolar transistors and
said sense circuit has sense outputs respectively at the
collectors of said bipolar transistors.

23. A semiconductor memory as set forth in claim 1, wherein each of said memory cells includes a flipflop having at least two cross coupled MOS transistors, and input/output terminals; and wherein said MOS transistors have a substrate and means between said substrate and said transistors for preventing noise charges from reaching said transistors from said substrate.

24. A semiconductor memory according to claim 1, further comprising:

said means for selecting said BIT lines including switching them from unselected to selected states;

said memory cells each being connected with a pair of said BIT lines;

each of said memory cells having first means for feeding said constant cell current as $I_{cell}$ to one of said BIT lines of said pair in accordance with stored information when at least said pair of BIT lines are selected;

said current source means feeding the BIT line drive current as $I_R$ at least transiently to the pair of BIT lines switched from unselected to selected states; and said sense circuit including sense amplifier means connected to said sense transistors for detecting the difference between the $I_{cell}$ and $I_R$ currents flowing in said selected pair of BIT lines to read out the stored information, wherein said BIT line drive current $I_R$ and said cell current $I_{cell}$ have a relation of $I_R > I_{cell}$.

25. A semiconductor memory as set forth in claim 24, including:

first and second constant voltage sources;

a circuit supply voltage;

wherein each of said memory cells further includes first and second loads connected between with the drains of said first and second insulated gate type transistors and said first constant voltage source;

wherein said first and second insulated gate type transistors have their sources connected to said second constant voltage source; and wherein the voltage difference $V_{cell}$ between the voltage of said first constant voltage source and said second constant voltage source is smaller than said circuit supply voltage.

26. A semiconductor memory as set forth in claim 24, wherein each of said memory cells includes: a flipflop having first and second insulated gate type transistors having their gates and drains cross-coupled with each other, and third and fourth insulated gate type transistors coupled to said BIT lines.

27. A semiconductor memory as set forth in claim 26: further comprising means for feeding read control signals; and a pair of bipolar transistors respectively connected between said BIT lines and said sense amplifier means and having emitters connected with said BIT lines, bases fed by said means for feeding read control signals and collectors connected with said sense amplifier means.

28. A semiconductor memory as set forth in claim 24, further comprising means for feeding read control signals; and a pair of bipolar transistors respectively connected between said BIT lines and said sense amplifier means and having emitters connected with said BIT lines, bases fed by said means for feeding read control signals and collectors connected with said sense amplifier means.

29. A semiconductor memory as set forth in claim 24, wherein said sense amplifier means includes at least two current-voltage converter loads and two differential amplifiers operatively connected to said loads to amplify current differences in said pair of BIT lines and eliminate noise.

30. A semiconductor memory as set forth in claim 29, wherein each of said memory cells includes: a flipflop having first and second insulated gate type transistors having their gates and drains cross-coupled with each other, and third and fourth insulated gate type transistors coupled to said BIT lines.

31. A semiconductor memory as set forth in claim 29, further comprising means for feeding read control signals; and a pair of bipolar transistors respectively connected between said BIT lines and said sense amplifier means and having emitters connected with said BIT lines, bases fed by said means for feeding read control signals and collectors connected with said sense amplifier means.

32. A semiconductor memory as set forth in claim 30, further comprising means for feeding read control signals; and a pair of bipolar transistors respectively connected between said BIT lines and said sense amplifier means and having emitters connected with said BIT lines, bases fed by said means for feeding read control signals and collectors connected with said sense amplifier means.

33. A semiconductor memory as set forth in claim 19, wherein the ratio of $I_R$ to $I_{cell}$ is at least about 10.

34. A semiconductor memory, comprising:

a memory cell array including a plurality of memory cells;

BIT lines and word lines connecting said memory cells in a matrix;

a sense circuit including a plurality of current source means, each of said current source means being connected with a corresponding one of said BIT lines for providing BIT line drive current flowing into or out of said corresponding BIT lines, so that said BIT line drive current is larger than said constant cell current in said corresponding BIT Lines;

means for selecting said BIT lines including switching them from unselected to selected states;

said memory cells each being connected with a pair of said BIT lines;

each of said memory cells having first means for feeding said constant cell current as $I_{cell}$ to one of said BIT lines of said pair in accordance with stored information when at least said pair of BIT lines are selected;

said current source means feeding the BIT line drive current as $I_R$ at least transiently to the pair of BIT lines switched from unselected to selected states;

said sense circuit including sense amplifier means for detecting the difference between the currents flowing in said selected pair of BIT lines to read out the stored information, wherein said BIT line drive current $I_R$ and said constant cell current $I_{cell}$ have a relation of $I_R > I_{cell}$;

each of said memory cells includes a flipflop having first and second insulated gate type transistors having their gates and drains cross-coupled with each other, and third and fourth insulated gate type transistors coupled to said BIT lines;

means for feeding read control signals;

a pair of bipolar transistors respectively connected between said BIT lines and said sense amplifier means and having emitters connected with said BIT lines, bases fed by said means for feeding read control signals and collectors connected with said sense amplifier means; and means connected between said BIT lines and said sense amplifier means for feeding an additional current substantially equal to said current $I_R$ for reducing noise.

35. A semiconductor memory as set forth in claim 34, wherein said sense amplifier means includes at least two current-voltage converter loads and two differential amplifiers operatively connected to said loads to amplify current differences in said pair of BIT lines and eliminate noise.

36. A semiconductor memory as set forth in claim 35, including first and second constant voltage sources;
a circuit supply voltage;
wherein each of said memory cells further includes first and second loads connected between with the drains of said first and second insulated gate type transistors and said first constant voltage source;
wherein said first and second insulated gate type transistors have their sources connected to said second constant voltage source; and
wherein the voltage difference $V_{cell}$ between the voltage of said first constant voltage source and said second constant voltage source is smaller than said circuit supply voltage.

37. A semiconductor memory as set forth in claim 36, wherein said voltage difference $V_{cell}$ satisfies the relation:

$$I_{cell} </= \beta[k(1-k/2)V_{cell}^2 - kV_T V_{cell}]$$

wherein:

$\beta$: the $\beta$ value of the first and second insulated gate type transistors;
$V_T$: the threshold voltage of the first and second insulated gate type transistors; and
k: the ratio of the first and second constant voltages, applied between the sources and drains of the first and second transistors.

38. A semiconductor memory, comprising:

a memory cell array including a plurality of memory cells;
BIT lines and word lines connecting said memory cells in a matrix;
a sense circuit including a plurality of current source means, each of said current source means being connected with a corresponding one of said BIT lines for providing BIT line drive current flowing into or out of said corresponding BIT lines, so that said BIT line drive current is larger than said constant cell current in said corresponding BIT Lines;
means for selecting said BIT lines including switching them from unselected to selected states;
said memory cells each being connected with a pair of said BIT lines;
each of said memory cells having first means for feeding said constant cell current as $I_{cell}$ to one of said BIT lines of said pair in accordance with stored information when at least said pair of BIT lines are selected;
said current source means feeding the BIT line drive current as $I_R$ at least transiently to the pair of BIT lines switched from unselected to selected states;
said sense circuit including sense amplifier means for detecting the difference between the currents flowing in said selected pair of BIT lines to read out the stored information, wherein said BIT line drive current $I_R$ and said constant cell current $I_{cell}$ have a relation of $I_R > I_{cell}$;
means for selecting said word lines; and
wherein each of said memory cells includes means for feeding said cell current $I_{cell}$ to one of said BIT lines of said pair of BIT lines only when said word and BIT lines of said memory cell are selected.

39. A semiconductor memory, comprising:

a memory cell array including a plurality of memory cells;
BIT lines and word lines connecting said memory cells in a matrix;
a sense circuit including a plurality of current source means, each of said current source means being connected with a corresponding one of said BIT lines for providing BIT line drive current flowing into or out of said corresponding BIT lines, so that said BIT line drive current is larger than said constant cell current in said corresponding BIT Lines;
means for selecting said BIT lines including switching them from unselected to selected states;
said memory cells each being connected with a pair of said BIT lines;
each of said memory cells having first means for feeding said constant cell current as $I_{cell}$ to one of said BIT lines of said pair in accordance with stored information when at least said pair of BIT lines are selected;
said current source means feeding the BIT line drive current as $I_R$ at least transiently to the pair of BIT lines switched from unselected to selected states;
said sense circuit including sense amplifier means for detecting the difference between the currents flowing in said selected pair of BIT lines to read out the stored information, wherein said BIT line drive current $I_R$ and said constant cell current $I_{cell}$ have a relation of $I_R > I_{cell}$;
first and second constant voltage sources;
a circuit supply voltage;
wherein each of said memory cells further includes first and second loads connected between with the drains of said first and second insulated gate type transistors and said first constant voltage source;
wherein said first and second insulated gate type transistors have their sources connected to said second constant voltage source;
wherein the voltage difference $V_{cell}$ between the voltage of said first constant voltage source and said second constant voltage source is smaller than said circuit supply voltage; and wherein
said voltage difference $V_{cell}$ satisfies the relation:

$$I_{cell} >/= \beta[k(1-k/2)V_{cell}^2 - kV_T V_{cell}]$$

wherein:

$\beta$: the $\beta$ value of the first and second insulated gate type transistors;
$V_T$: the threshold voltage of the first and second insulated gate type transistors; and k: the ratio of the first and second constant voltages, applied between the sources and drains of the first and second transistors.

40. A semiconductor memory, comprising:
a memory cell array including a plurality of memory cells;
BIT lines and word lines connecting said memory cells in a matrix;
a sense circuit including a plurality of current source means, each of said current source means being connected with a corresponding one of said BIT lines for providing BIT line drive current flowing into or out of said corresponding BIT lines, so that said BIT line drive current is larger than said constant cell current in said corresponding BIT lines;
means for selecting said BIT lines including switching them from unselected to selected states;
said memory cells each being connected with a pair of said BIT lines;
each of said memory cells having first means for feeding said constant cell current as $I_{cell}$ to one of said BIT lines of said pair in accordance with stored information when at least said pair of BIT lines are selected;
said current source means feeding the BIT line drive current as $I_R$ at least transiently to the pair of BIT lines switched from unselected to selected states;
said sense circuit including sense amplifier means for detecting the difference between the currents flowing in said selected pair of BIT lines to read out the stored information, wherein said BIT line drive current $I_R$ and said constant cell current $I_{cell}$ have a relation of $I_R > I_{cell}$ by a ratio of $I_R$ to $I_{cell}$ that is greater than 2; and
said sense amplifier means includes at least two current-voltage converter loads and two differential amplifiers operatively connected to said loads to amplify current differences in said pair of BIT lines and eliminate noise.

41. A semiconductor memory as set forth in claim 40, wherein the ratio of $I_R$ to $I_{cell}$ is at least about 10.

42. A semiconductor memory as set forth in claim 41, wherein each of said memory cells includes: a flipflop having first and second insulated gate type transistors having their gates and drains cross-coupled with each other, and third and fourth insulated gate type transistors coupled to said BIT lines.

43. A semiconductor memory as set forth in claim 42, further comprising means for feeding read control signals; and
a pair of bipolar transistors respectively connected between said BIT lines and said sense amplifier means and having emitters connected with said BIT lines, bases fed by said means for feeding read control signals and collectors connected with said sense amplifier means.

44. A semiconductor memory as set forth in claim 41, further comprising means for feeding read control signals; and
a pair of bipolar transistors respectively connected between said BIT lines and said sense amplifier means and having emitters connected with said BIT lines, bases fed by said means for feeding read control signals and collectors connected with said sense amplifier means.

45. A semiconductor memory as set forth in claim 41, further comprising means connected between said BIT lines and said sense amplifier means for feeding an additional current substantially equal to said current $I_R$ for reducing noise.

* * * * *